(12) United States Patent
Shiraishi et al.

(10) Patent No.: US 6,392,740 B1
(45) Date of Patent: May 21, 2002

(54) PROJECTION EXPOSURE APPARATUS

(75) Inventors: Naomasa Shiraishi, Kawasaki; Yuji Kudo, Yokohama, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/246,853

(22) Filed: Feb. 9, 1999

Related U.S. Application Data

(62) Division of application No. 08/940,198, filed on Sep. 29, 1997, now abandoned, which is a division of application No. 08/549,325, filed on Oct. 27, 1995, now Pat. No. 5,719,704, which is a continuation of application No. 08/371,895, filed on Jan. 12, 1995, now abandoned, which is a continuation of application No. 07/942,193, filed on Sep. 9, 1992, now abandoned.

(30) Foreign Application Priority Data

| | | |
|---|---|---|
| Sep. 11, 1991 | (JP) | 3-231531 |
| Oct. 4, 1991 | (JP) | 3-258049 |
| Oct. 4, 1991 | (JP) | 3-258050 |
| Jan. 31, 1992 | (JP) | 4-016590 |

(51) Int. Cl.⁷ .......................... G03B 27/54; F21V 7/04
(52) U.S. Cl. ....................... 355/53; 355/67; 359/621; 362/268
(58) Field of Search ................ 355/53, 67, 71; 359/618, 619, 621, 623, 622; 362/268

(56) References Cited

U.S. PATENT DOCUMENTS

| | | | |
|---|---|---|---|
| 4,179,708 A | 12/1979 | Sheng et al. | 358/128 |
| 4,241,389 A | 12/1980 | Heimer | 362/297 |
| 4,275,288 A | 6/1981 | Makosch et al. | 219/121 |
| 4,389,701 A | 1/1983 | Phillips | 362/308 BP |
| 4,476,519 A | 10/1984 | Hayamizu | 362/32 |
| 4,497,013 A * | 1/1985 | Ohta | 362/268 |
| 4,497,015 A * | 1/1985 | Konno et al. | 362/268 |
| 4,547,037 A | 10/1985 | Case | 350/3.75 |
| 4,566,765 A | 1/1986 | Miyauchi et al. | 350/619 |

(List continued on next page.)

FOREIGN PATENT DOCUMENTS

| | | |
|---|---|---|
| EP | 0 282 593 | 9/1988 |
| JP | 56-12615 | 2/1981 |
| JP | 58-16214 | 1/1983 |
| JP | 59-49514 | 3/1984 |
| JP | 61-91662 | 5/1986 |
| JP | 62-50811 | 10/1987 |
| JP | 1-295215 | 11/1989 |
| WO | WO 92/03842 | 3/1992 |

*Primary Examiner*—Alan A. Mathews
(74) *Attorney, Agent, or Firm*—Miles & Stockbridge P.C.

(57) ABSTRACT

A projection exposure apparatus including an irradiation optical system including a light source and irradiating a mask with irradiation light beams, a projection optical system for projecting an image of a pattern of the mask on a substrate, a plurality of first fly-eye type optical integrators each having an emission side focal plane disposed on a Fourier transformed surface with respect to the pattern of the mask in the irradiation optical system or on a plane adjacent to the same and having a center located at a plurality of positions which are eccentric from the optical axis of the irradiation optical system, a plurality of second fly-eye type optical integrators each having an emission side focal plane disposed on a Fourier transformed plane with respect to the incidental end of each of a plurality of the first fly-eye type optical integrators or on a plane adjacent to the same and being disposed to correspond to a plurality of the first fly-eye type optical integrators, and a light divider for dividing and causing the irradiation light beams from the light source to be incident on each of a plurality of the second fly-eye type optical integrators.

12 Claims, 22 Drawing Sheets

U.S. PATENT DOCUMENTS

| | | | |
|---|---|---|---|
| 4,585,315 A | | 4/1986 | Sincerbox et al. ........... 350/525 |
| 4,619,508 A | * | 10/1986 | Shibuya et al. ................ 355/67 |
| 4,769,750 A | * | 9/1988 | Matsumoto et al. ......... 362/268 |
| 4,851,978 A | * | 7/1989 | Ichihara ...................... 362/268 |
| 4,918,583 A | * | 4/1990 | Kudo et al. .................. 362/268 |
| 4,939,630 A | * | 7/1990 | Kikuchi et al. ................ 355/67 |
| 4,952,815 A | * | 8/1990 | Nishi ......................... 250/548 |
| 4,974,919 A | * | 12/1990 | Muraki et al. ............... 362/268 |
| 5,016,149 A | * | 5/1991 | Tanaka et al. ............... 362/268 |
| 5,048,926 A | * | 9/1991 | Tanimoto .................... 359/618 |
| 5,098,184 A | * | 3/1992 | Van Der Brandt et al. . 359/622 |
| 5,153,773 A | * | 10/1992 | Muraki et al. ............... 359/619 |
| 5,300,971 A | * | 4/1994 | Kudo .......................... 355/67 |
| 5,307,207 A | * | 4/1994 | Ichihara ...................... 359/622 |
| 5,463,497 A | | 10/1995 | Muraki et al. .............. 359/618 |
| 5,638,211 A | * | 6/1997 | Shiraishi ...................... 355/53 |

* cited by examiner

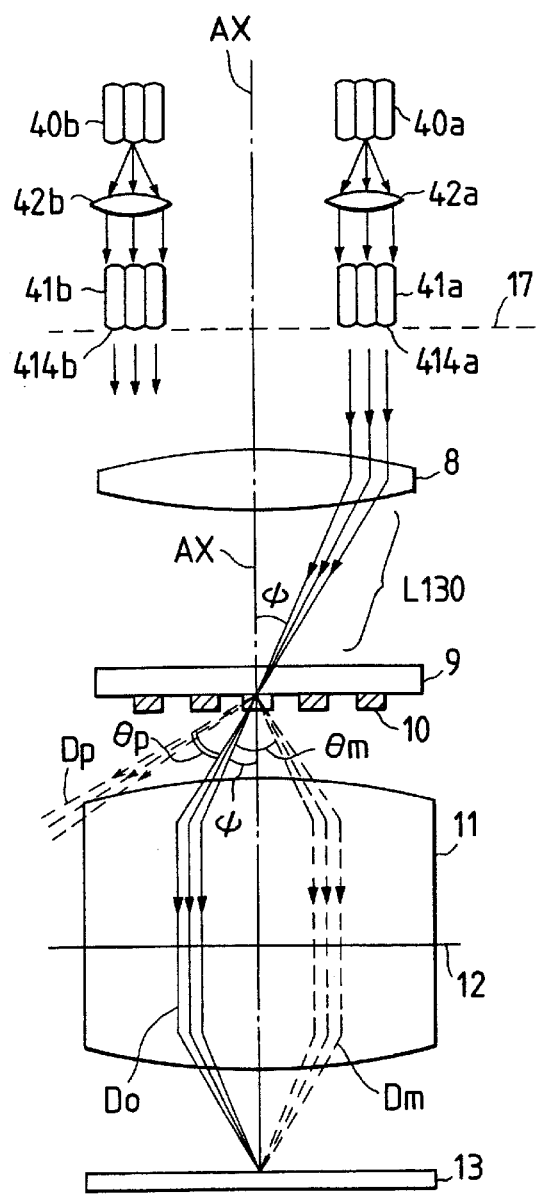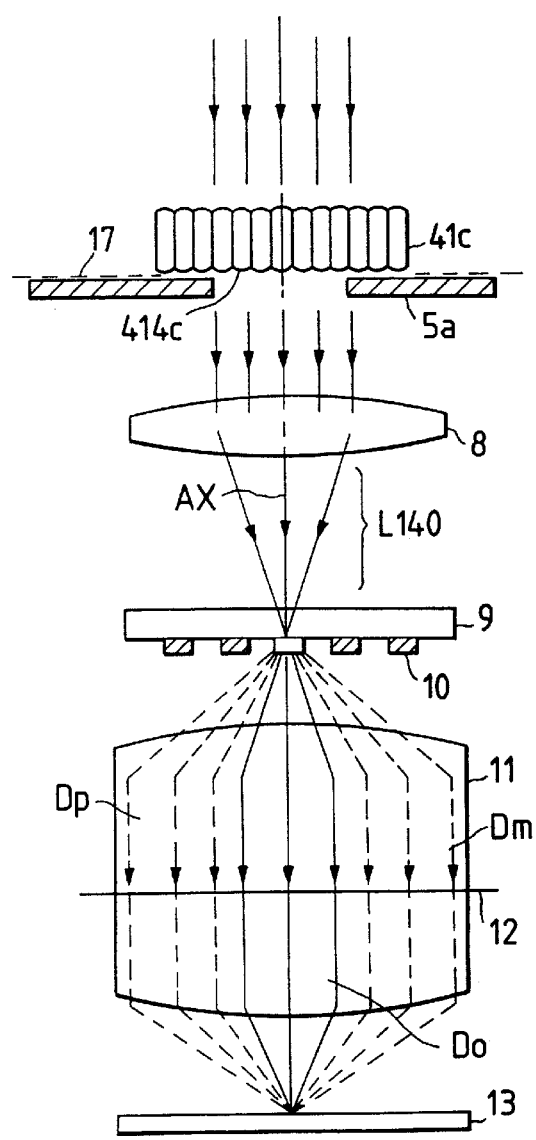
FIG. 13
FIG. 14

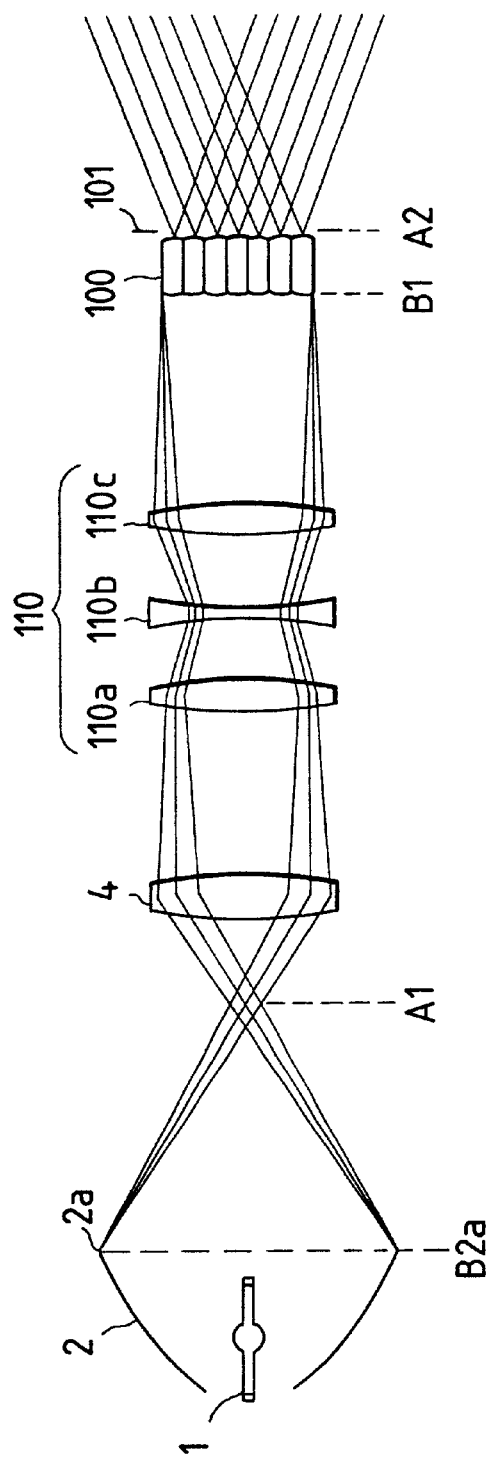
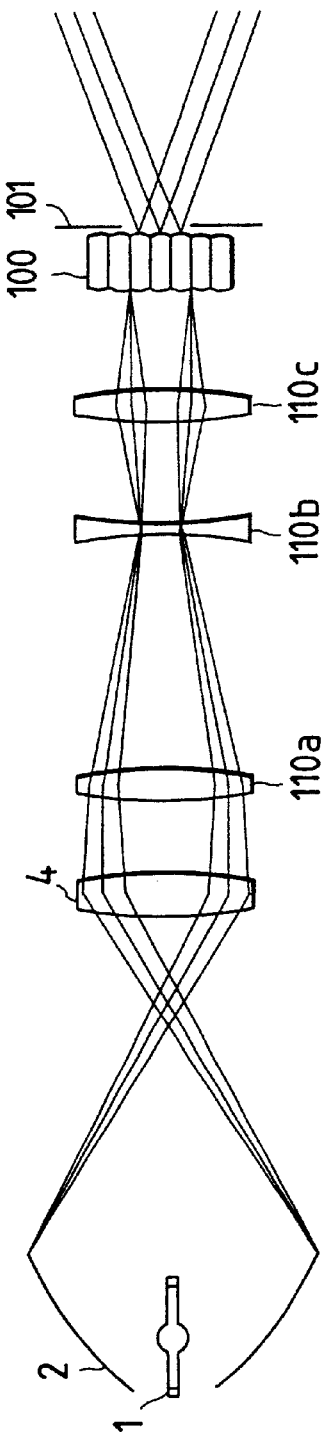
FIG. 28A
FIG. 28B

PROJECTION EXPOSURE APPARATUS

CROSS REFERENCE TO RELATED APPLICATIONS

This application is a division of application Ser. No. 08/940,198 filed Sep. 29, 1997 (abandoned), which is a division of application Ser. No. 08/549,325 filed Oct. 27, 1995, now U.S. Pat. No. 5,719,704, which is a continuation of application Ser. No. 08/371,895 filed Jan. 12, 1995 (abandoned), which is a continuation of application Ser. No. 07/942,193 filed Sep. 9, 1992 (abandoned).

BACKGROUND OF THE INVENTION

1. Field of the Invention

The present invention relates to a projection exposure apparatus for use to form a pattern of a semiconductor integrated circuit, or a liquid crystal device, or the like.

2. Related Background Art

When a circuit pattern of a semiconductor device or the like is formed, so-called photolithography technology is required. In this process, a method, in which a reticle (a mask) pattern is formed on a substrate such as semiconductor wafer, is usually employed. The surface of the substrate is applied with photosensitive photoresist so that a circuit pattern is transferred to the photoresist in accordance with an image irradiated with light, that is, in accordance with the shape of the pattern corresponding to a transparent portion of the reticle pattern. In a projection exposure apparatus (for example, a stepper), the image of a circuit pattern drawn on the reticle so as to be transferred is projected on the surface of the substrate (wafer) via a projection optical system so as to be imaged.

In an irradiation optical system for irradiating the reticle with light, an optical integrator such as a fly-eye type optical integrator (a fly-eye lens) and a fiber is used so as to uniform the distribution of the intensities of irradiation light with which the surface of the reticle is irradiated. In order to make the aforesaid intensity distribution uniform optimally, a structure which employs the fly-eye lens is arranged in such a manner that the reticle-side focal surface (the emission side) and the surface of the reticle (the surface on which the pattern is formed) hold a substantially Fourier transformed relationship. Also the focal surface adjacent to the reticle and the focal surface adjacent to the light source (the incidental side) hold the Fourier transformed relationship. Therefore, the surface of the reticle, on which the pattern is formed, and the focal surface of the fly-eye lens adjacent to the light source (correctly, the focal surface of each lens of the fly-eye lens adjacent to the light source) hold an image formative relationship (conjugated relationship). As a result of this, irradiation light beams from respective optical elements (a secondary light source image) of the fly-eye lens are added (superposed) because they pass through a condenser lens or the like so that they are averaged on the reticle. Hence, the illuminance uniformity on the reticle can be improved. Incidentally, there has been disclosed an arrangement capable of improving the illuminance uniformity in U.S. Pat. No. 4,497,015 in which two pairs of optical integrators are disposed in series.

In a conventional projection exposure apparatus, the light quantity distribution of irradiation beams to be incident on the optical integrator, such as the aforesaid fly-eye lens, has been made to be substantially uniform in a substantially circle area (or in a rectangular area), the center of which is the optical system of the irradiation optical system.

FIG. 14 illustrates a schematic structure of a conventional projection exposure apparatus (stepper) of the above described type. Referring to FIG. 14, irradiation beams L140 pass through a fly-eye lens 41c, a spatial filter (an aperture diaphragm) 5a and a condenser lens 8 so that a pattern 10 of a reticle 9 is irradiated with the irradiation beams L140. The spatial filter 5a is disposed on, or adjacent to a Fourier transformed surface 17 (hereinafter abbreviated to a "pupil surface") with respect to the reticle side focal surface 414c of the fly-eye lens 41c, that is, with respect to the reticle pattern 10. Furthermore, the spatial filter 5a has a substantially circular opening centered at a point on optical axis AX of a projection optical system 11 so as to limit a secondary light source (plane light source) image to a circular shape. The irradiation light beams, which have passed through the pattern 10 of the reticle 9, are imaged on a resist layer of a wafer 13 via the projection optical system 11. In the aforesaid structure, the number of apertures of the irradiation optical system (41c, 5a and 8) and the number of reticle-side apertures formed in the projection optical system 11, that is σ value is determined by the aperture diaphragm (for example, by the diameter of an aperture formed in the spatial filter 5a), the value being 0.3 to 0.6 in general.

The irradiation light beams L140 are diffracted by the pattern 10 patterned by the reticle 9 so that 0-order diffracted light beam Do, +1-order diffracted light beam Dp and −1-order diffracted light beam Dm are generated from the pattern 10. The diffracted light beams Do, Dp and Dm, thus generated, are condensed by the projection optical system 11 so that interference fringes are generated. The interference fringes, thus generated, correspond to the image of the pattern 10. At this time, angle θ (reticle side) made by the 0-order diffracted light beam Do and ±1-order diffracted light beams Dp and Dm is determined by an equation expressed by $\sin \theta = \lambda/P$ ($\lambda$: exposure wavelength and P: pattern pitch).

It should be noted that $\sin \theta$ is enlarged in inverse proportion to the length of the pattern pitch, and therefore if $\sin \theta$ has become larger than the number of apertures ($NA_R$) formed in the projection optical system 11 adjacent to the reticle 9, the ±1-order diffracted light beams Dp and Dm are limited by the effective diameter of a pupil (a Fourier transformed surface) 12 in the projection optical system 11. As a result, the ±1-order diffracted light beams Dp and Dm cannot pass through the projection optical system 11. At this time, only the 0-order diffracted light beam Do reaches the surface of the wafer 13 and therefore no interference fringe is generated. That is, the image of the pattern 10 cannot be obtained in a case where $\sin \theta > NA_R$. Hence, the pattern 10 cannot be transferred to the surface of the wafer 13.

It leads to a fact that pitch P, which holds the relationship $\sin \theta = \lambda/P = NA_R$, has been given by the following equation.

$$P = \lambda/NA_R \tag{1}$$

Therefore, the minimum pattern size becomes about $0.5 \cdot \lambda/NA_R$ because the minimum pattern size is the half of the pitch P. However, in the actual photolithography process, some considerable amount of focal depth is required due to an influence of warp of the wafer, an influence of stepped portions of the wafer generated during the process and the thickness of the photoresist. Hence, a practical minimum resolution pattern size is expressed by $k \cdot \lambda/NA_R$, where k is a process factor which is about 0.6 to 0.8. Since the ratio of the reticle side number of articles $NA_W$ and the wafer side number of articles $NA_R$ is the same as the imaging magnification of the projection optical system, the minimum resolution size on the reticle is $k\cdot\lambda/NA_R$ and the minimum pattern size on the wafer is $k\cdot\lambda/NA_W=k\cdot\lambda/B\cdot NA_R$ (where B is an imaging magnification (contraction ratio)).

Therefore, a selection must be made whether an exposure light source having a shorter wavelength is used or a projection optical system having a larger number of apertures is used in order to transfer a more precise pattern. It might, of course, be considered feasible to study to optimize both the exposure wavelength and the number of apertures.

However, it is so far difficult for the projection exposure apparatus of the above described type to shorten the wavelength of the irradiation light source (for example, 200 nm or shorter) because a proper optical material to make a transmissive optical member is not present and so forth. Furthermore, the number of apertures formed in the projection optical system has approached its theoretical limit at present and therefore it is difficult to further enlarge the apertures. Even if the aperture can be further enlarged, the focal depth expressed by $\pm\lambda/2NA^2$ rapidly decreases with an increase in the number of apertures, causing a critical problem to take place in that the focal depth required in a practical use further decreases.

In Japanese Patent Publication No. 62-50811 for example, there has been disclosed a so-called phase shift reticle arranged in such a manner that the phase of each of transmissive light beams traveled from specific points in the transmissive portions of the circuit pattern of the reticle is shifted by $\pi$ from the phase of transmissive light beams traveled from the other transmissive portions. By using a phase shift reticle of the type described above, a further precise pattern can be transferred.

However, the phase shift reticle has a multiplicity of unsolved problems because of a fact that the cost cannot be reduced due to its complicated manufacturing process and inspection and modification methods have not been established even now.

Hence, an attempt has been made as projection exposure technology which does not use the phase shift reticle and with which the transference resolving power can be improved by modifying the method of irradiating the reticle with light beams. One irradiation method of the aforesaid type is a so-called annular zone irradiation method, for example, arranged in such a manner that the irradiation light beams which reach the reticle 9 are given a predetermined inclination by making the spatial filter 5a shown in FIG. 14 an annular opening so that the irradiation light beams distributed around the optical axis of the irradiation optical systemare cut on the Fourier transformed surface 17.

In order to establish projection exposure having a further improved resolving power and a larger focal depth, an inclination irradiation method or a deformed light source method has been previously disclosed in PCT/JP91/01103 (filed on Aug. 19, 1991). The aforesaid irradiation method is arranged in such a manner that a diaphragm (a spatial filter) having a plurality (two or four) openings, which are made to be eccentric with respect to the optical axis of the irradiation optical system by a quantity corresponding to the precision (the pitch or the like) of the reticle pattern, is disposed adjacent to the emission side focal surface of the fly-eye lens so that the reticle pattern is irradiated with the irradiation light beams from a specific direction while inclining the light beams by a predetermined angle.

However, the above mentioned inclination irradiation method and the deformed light source method have a problem in that it is difficult to realize a uniform illuminance distribution over the entire surface of the reticle because the number of effective lens elements (that is, the number of secondary light sources capable of passing through the spatial filter) decreases and therefore an effect of making the illuminance uniform on the reticle deteriorates. What is worse, the light quantity loss is excessive large in the system which has a member, such as the spatial filter, for partially cutting the irradiation light beams. Therefore, the illumination intensity (the illuminance) on the reticle or the wafer can, of course, deteriorate excessively, causing a problem to take place in that the time taken to complete the exposure process becomes long with the deterioration in the irradiation efficiency. Furthermore, a fact that light beams emitted from the light source concentrically pass through the Fourier transformed plane in the irradiation optical system will cause the temperature of a light shielding member, such as the spatial filter, to rise excessively due to its light absorption and a measure (air cooling or the like) must be taken to prevent the performance deterioration due to change in the irradiation optical system caused from heat.

In a case where a diaphragm of the aforesaid type is disposed adjacent to the emission side focal surface of the fly-eye lens, some of the secondary light source images formed by a plurality of the lens elements are able to superpose on the boundary portion between the light transmissive portion of the diaphragm and the light shielding portion of the same. This means a fact that the secondary light source image adjacent to the aforesaid boundary portion is shielded by the diaphragm or the same passes through the boundary portion on the contrary. That is, an unstable factor, such as the irradiation light quantity, is generated and another problem arises in that the light quantities of the light beams emitted from the aforesaid diaphragm and that are incident on the reticle become different from one another. Furthermore, in the inclination irradiation method, the positions of the four openings (in other words, the light quantity distribution in the Fourier transformed surface) must be changed in accordance with the degree of precision of the reticle pattern (the line width, or the pitch or the like). Therefore, a plurality of diaphragms must be made to be exchangeable in the irradiation optical system, causing a problem to arise in that the size of the apparatus is enlarged.

When a secondary light source formed on the reticle side focal surface of the fly-eye lens is considered in a case where the light source comprises a laser such as an excimer laser having a spatial coherence, the irradiation light beams corresponding to the lens elements have some considerable amount of coherence from each other. As a result, random interference fringes (speckle interference fringes) are formed on the surface of the reticle or the surface of the wafer which is in conjugate with the surface of the reticle, causing the illuminance uniformity to deteriorate. When its spatial frequency is considered here, a Fourier component corresponding to the minimum interval between the lens elements is present in main. That is, the number of combinations of light beams contributing to the interference is the largest. Therefore, fringes having a relatively low frequency (having a long pitch) in comparison to the limit resolution and formed to correspond to the configuration direction of the lens elements are observed on the surface of the reticle or the surface of the wafer. Although the formed interference fringes have low contrast because the KrF excimer laser has a relatively low spatial coherence, the interference fringe acts as parasite noise for the original pattern. The generation of the interference fringes causes a problem when the illuminance uniformity, which will be further required in the future, is improved. In the case where the annular zone irradiation method is considered, the aforesaid noise concentrically superposes in the vicinity of the limit resolution, and therefore the influence of the noise is relatively critical in comparison to the ordinary irradiation method (see FIG. 14).

SUMMARY OF THE INVENTION

An object of the present invention is to provide a projection exposure apparatus capable of obtaining high resolution and a large focal depth and revealing excellent illuminance uniformity even if an ordinary reticle is used.

In the present invention, the emission side focal surface is disposed on a Fourier transformed surface 17 with respect to a mask in the optical path of the irradiation optical system or on a plane adjacent to the same as shown in FIG. 1. Furthermore, there are a plurality of first fly-eye lenses 41a and 41b the centers of which are disposed at a plurality of positions which are eccentric from optical axis AX of the irradiation optical system, a plurality of second fly-eye lenses 40a and 40b having the emission side focal plane located on the Fourier transformed surface with respect to each incidental end of a plurality of the first fly-eye lenses 41a and 41b or on a surface adjacent to the same and disposed to correspond to the first fly-eye lenses 41a and 41b and light dividers for dividing the irradiation light beams from the light source to be incident on a plurality of the second fly-eye lenses 40a and 40b. Furthermore, a guide optical element is disposed so as to cause the light beams emitted from one of a plurality of the second fly-eye lenses to be incident on one of a plurality of the first fly-eye lenses. In a case where a laser represented by an excimer laser is used as the light source, an optical path difference generating member 70 is disposed between a plurality of the light beams emitted from the light dividers 20 and 21 shown in FIG. 17, the optical path difference generating member 70 causing an optical path difference (the phase difference) longer than the coherent distance (the coherent length) of the irradiation light beams to be given.

As shown in FIGS. 24 and 27, the present invention comprises, in an irradiation optical path, a plane light source forming optical system 100 or 106 and 107 for forming a plurality of light sources, a converging optical system 102 or 108 for converging the light beams from the plane light source forming optical system, a polyhedron light source forming optical system 103 having a plurality of lens elements 103a to 103d for forming a plurality of plane light source images on the Fourier transformed surface with respect to the reticle by the light beams from the converging optical system or on a plane adjacent to the same and having the centers of the optical axes disposed at a plurality of positions which are eccentric from the optical axis of the irradiation optical system, and a condenser for converging the light beams from the plurality of plane light source images formed by the polyhedron light source forming optical system onto the reticle.

In the aforesaid basic structure, assuming that half of the distance between the optical axes of the lens elements in a direction of the pattern of said reticle is L, the focal distance on the emission side of said condenser lens is f, the wavelength of said irradiation light beams is λ and the cyclic pitch of said pattern of said mask is P, it is preferable to arrange the structure to satisfy the following condition:

$$L=\lambda f/2P$$

In a case where the reticle has a two-dimensional pattern, the polyhedron light source forming optical system is composed of four lens elements disposed in parallel and, assuming that the number of apertures on the reticle side of said projection optical system is $NA_R$, half of the distance between the optical axes of said lens elements 103a to 103d in a direction of the pattern of the reticle is L, and the emission side focal distance of the condenser lens 8 is f, it is preferable that the following conditions are satisfied:

$$0.35 NA_R \leq L/f \leq 0.7 NA_R$$

As shown in FIG. 29, the present invention comprises light dividers 200 and 201 for dividing the irradiation light beams in the optical path of the irradiation optical system, polyhedron light source forming optical systems 202a, 202b, 203a, 203b, 204a and 204b for forming a plurality of plane light sources which correspond to each light beam divided by the light dividers on the Fourier transformed surface with respect to the reticle 9 or on a plane adjacent to the same at a plurality of positions which are eccentric from the optical axis of the irradiation optical system and a condenser lens 8 for converging the light beams from a plurality of the plane light sources onto the reticle, wherein the polyhedron light source forming optical system includes at least rod type optical integrators 203a and 203b.

In the aforesaid basic structure, the polyhedron light source forming optical system may have a plurality of rod type optical integrators the centers of which are disposed at a plurality of positions which are eccentric from the optical axis of the irradiation optical system.

Furthermore, the polyhedron light source forming optical system may comprise a first converging lens for converging light beams divided by the light dividing optical system, a rod type optical integrator having the incidental surface disposed at the focal point of the converging lens and a second converging lens for converging the light beams from the rod type optical integrator to form a plurality of plane light sources on the Fourier transformed surface with respect to the reticle or on a plane adjacent to the same.

The operation of the present invention will now be described with reference to FIG. 13. The description will be given hereinafter about an example of the projection exposure apparatus in which the fly-eye type optical integrator (fly-eye lens) is disposed in the irradiation optical system. Referring to FIG. 13, second fly-eye lens groups 40a and 40b corresponding to the second fly-eye lens according to the present invention are disposed on a plane perpendicular to optical axis AX. Light beams emitted from them are incident on first fly-eye lens groups 41a and 42b, which correspond to the first fly-eye lens according to the present invention, by guide optical systems 42a and 42b. The illuminance distribution on the incidental surface of the first fly-eye lens is made uniform by the second fly-eye lens group.

Light beams emitted from the first fly-eye lens group are applied to a reticle 9 by a condenser lens 8. The illuminance distribution on the reticle 9 is made to be uniform by the first and the second fly-eye lens groups to a satisfactory degree. Reticle side focal surfaces 414a and 414b of the first fly-eye lens groups 41a and 41b substantially coincide with a Fourier transformed surface 17 of the reticle pattern 10. Therefore, the distance from optical axis AX to the center of the first fly-eye lens corresponds to the incidental angle of the light beams emitted from the first fly-eye lens on the reticle 9.

A circuit pattern 10 drawn on the reticle (the mask) includes a multiplicity of cyclic patterns. Therefore, the reticle pattern 10 irradiated with the irradiation light beams emitted from one fly-eye lens group 41a generates a 0-order diffracted light beam component Do, ±1-order diffracted light beam components Dp and Dm and higher diffracted light beam components in a direction corresponding to the precision of the pattern.

At this time, since the irradiation light beams (the main beams) are incident on the reticle while being inclined, also the diffracted light beam components are generated from the reticle pattern 10 while being inclined (having an angular deviation) in comparison to a case where the reticle 9 is irradiated perpendicularly. Irradiation light beam L130 shown in FIG. 13 is incident on the reticle 9 while being inclined by $\phi$ from the optical axis.

Irradiation light beam L130 is diffracted by the reticle pattern 10 and the 0-order diffracted light beam Do travelling in a direction inclined by $\phi$ from optical axis AX, +1-order diffracted light beam Dp inclined from the 0-order diffracted light beam by $\theta p$ and the −1-order diffracted light beam Dm travelling while being inclined from the 0-order diffracted light beam Do by $\theta m$ are generated. However, since irradiation light beam L130 is incident on the reticle pattern while being inclined from optical axis AX of the double telecentric projection optical system 11 by an angle $\phi$, also the 0-order diffracted light beam Do also travels in a direction inclined by an angle $\phi$ from optical axis of the projection optical system.

Therefore, the +1-order diffracted light beam Dp travels in a direction $\theta p+\phi$ with respect to optical axis AX, while the −1-order diffracted light beam Dm travels in a direction $\theta m-\phi$ with respect to optical axis AX.

At this time, the diffracted angles $\theta p$ and $\theta m$ respectively are expressed by:

$$\sin(\theta p+\phi)-\sin \phi=\lambda/P \quad (2)$$

$$\sin(\theta m-\phi)+\sin \phi=\lambda/P \quad (3)$$

Assumption is made here that both of the +1-order diffracted light beam Dp and the −1-order diffracted light beam Dm pass through a pupil surface 12 of the projection optical system 11.

When the diffraction angle is enlarged with the precision of the reticle pattern 10, the +1-order diffracted light beam Dp travelling in the direction $\theta p+\phi$ cannot pass through the pupil 12 of the projection optical system 11. That is, a relationship expressed by $\sin(\theta p+\phi)>NA_R$ is realized. However, since irradiation light beam L130 is incident while being inclined from optical axis AX, the −1-order diffracted light beam Dm is able to pass through the projection optical system 11 at the aforesaid diffraction angle. That is, a relationship expressed by $\sin(\theta m-\phi)<NA_R$ is realized.

Therefore, interference fringes are generated on the wafer due to the 0-order diffracted light beam Do and the −1-order diffracted light beam Dm. The aforesaid interference fringes are the image of the reticle pattern 10. When the reticle pattern is formed into a line-and-space pattern having a ratio of 1:1, the image of the reticle pattern 10 can be patterned on the resist applied on the wafer 13 while having a contrast of about 90%.

At this time, the resolution limit is present when the following relationship is realized:

$$\sin(\theta m-\phi)=NA_R \quad (4)$$

Therefore, the pitch on the reticle side of the minimum pattern which can be allowed to be transferred can be expressed by:

$$NA_R+\sin \phi=\lambda/P$$

$$P=\lambda/(NA_R+\sin \phi) \quad (5)$$

In a case where $\sin \phi$ is made to be about $0.5\times NA_R$, the minimum pitch of the pattern on the reticle which can be transferred becomes as follows:

$$P=\lambda/(NA_R+0.5NA_R)=2\lambda/3NA_R \quad (6)$$

In a case of a conventional exposure apparatus shown in FIG. 14 in which the irradiation light beam distribution on the pupil 17 is in a circular region relative to optical axis AX of the projection optical system 11, the resolution light is $P=\lambda/NA_R$ as expressed by Equation (1). Therefore, the present invention enables a higher resolution in comparison to the conventional exposure apparatus.

Now, the description will be given about the reason why the focal depth can be enlarged by irradiating the reticle pattern with exposure light beams from a specific incidental direction and at a specific angle by a method in which the image pattern is formed on the wafer by using the 0-order diffracted light beam component and the 1-order diffracted light beam component.

In a case where the wafer 13 coincides with the focal point position (the best imaging surface) of the projection optical system 11, the diffracted light beams emitted from a point of the reticle pattern 10 and reaching a point on the wafer have the same optical path length regardless of the portion of the projection optical system 11 through which they pass. Therefore, even in the conventional case where the 0-order diffracted light beam component passes through substantially the center (adjacent to the optical axis) of the pupil surface 12 of the projection optical system 11, optical length for the 0-order diffracted light beam component and that for the other diffracted light beam component are substantially the same and the mutual wavelength aberration is zero. However, in a defocus state in which the wafer 13 does not coincide with the focal point position of the projection optical system 11, the optical path length for a higher diffracted light beam made incident diagonally becomes short in front of the focal point in comparison to the 0-order diffracted light beam which passes through a portion adjacent to the optical axis and as well as lengthened in the rear of the focal point (toward the projection optical system 11) by a degree corresponding to the difference in the incidental angle. Therefore, the diffracted light beams such as 0-order, 1-order and higher order diffracted light beams form mutual wave aberration, causing an out of focus image to be generated in front or in the rear of the focal point position.

The wave aberration generated due to the defocus is a quantity given by $\Delta Fr2/2$ assuming that the quantity of deviation from the focal point position of the wafer 13 is $\Delta F$ and the sine of incidental angle $\theta w$ made when each diffracted light beam is incident on one point of the wafer is r ($r=\sin \theta w$), where r is the distance between each diffracted light beam and optical axis AX on the pupil surface 12. In the conventional projection exposure apparatus shown in FIG. 14, the 0-order diffracted light beam Do passes through a position adjacent to the optical axis. Therefore, r (0-order) becomes 0, while $\pm 1$-order diffracted light beams Dp and Dm hold a relationship expressed by r (1-order)=$M\cdot\lambda/P$ (where M is the magnification of the projection optical system). Therefore, the wave aberration between the 0-order diffracted light beam Do and $\pm 1$-order diffracted light beams Dp and Dm becomes:

$$\Delta F\cdot M2(\lambda/P)2/2$$

In the projection exposure apparatus according to the present invention, the 0-order diffracted light component Do is generated in a direction inclined from optical axis AX by an angle $\phi$ as shown in FIG. 13. Therefore, the distance between the 0-order diffracted light beam component and the optical axis AX on the pupil surface 12 holds a relationship expressed by r (0-order)=$M\cdot\sin \phi$.

The distance between the −1-order diffracted light beam component and the optical axis on the pupil surface becomes a value obtainable from r (−1-order)=M·sin(θm−φ). If sin φ=sin(θm−φ) at this time, the relative wave aberration between the 0-order diffracted light beam component Do and the −1-order diffracted light beam component Dm due to defocus becomes zero. Hence, even if the wafer 13 is slightly deviated in the direction of the optical axis from the focal point position, the out of focus of the image of the pattern 10 can be prevented. That is, the focal depth can be enlarged. Furthermore, since sin(θm−φ)+sin φ=λ/P as expressed by the equation (3), the focal depth can be significantly enlarged by causing the incident angle φ for the irradiation light beam L130 on the reticle 9 to hold a relationship expressed by sin φ=λ/2P with the pattern having pitch P.

In the present invention, the irradiation light beams emitted from the light source are divided into a plurality of light beams before they are introduced into each fly-eye lens. Therefore, the light beams emitted from the light source can be efficiently utilized while reducing loss, so that a projection exposure system revealing high resolution and a large focal depth can be realized.

As described above, according to the present invention, the necessity lies in simple fact that the irradiation optical system of the projection exposure apparatus which is being operated is changed at the manufacturing process. Therefore, the projection optical system of an apparatus which is being operated can be utilized as it is and further improved resolution and dense integration can be realized.

Although the irradiation system for use in the present invention becomes complicated in comparison to an ordinary system, the uniformity of the illuminance on the reticle surface and on the wafer surface can be improved because the fly-eye lenses are disposed to form two stages in the direction of the optical axis. By virtue of the two stage fly-eye lens structure, the illuminance uniformity on the reticle and the wafer surfaces can be maintained even if the fly-eye lens is moved on a plane perpendicular to the optical axis.

Since the light dividing optical system efficiently introduces the irradiation light beams to the first stage fly-eye lens, the irradiation light quantity loss can be satisfactorily prevented. Therefore, the exposure time can be shortened and the processing performance (throughput) cannot deteriorate.

In a system in which the second stage fly-eye lens adjacent to the reticle is made movable as in an embodiment (see FIG. 5), optimum irradiation can be performed in accordance with the reticle pattern.

In a system arranged in such a manner that the first, the second fly-eye lenses and the guide optical system are integrally held while making them to be movable, the movable portion can be decreased and therefore the structure can be simplified. As a result, the manufacturing and adjustment cost can be reduced.

Also in a case where a plurality of the guide optical system and the corresponding first fly-eye lens are respectively made movable, the light dividing optical system and the second fly-eye lens group are integrally held. Therefore, the structure can be simplified and as well as the manufacturing cost and the adjustment cost can be reduced.

In a system in which the light dividing optical system or a portion of the same is made to be movable, the optimum dividing optical system (dividing into two portions and that into four portions can be selected) can be used in accordance with the division conditions.

In a system in which at least a portion of the light dividing optical system can be moved or rotated, the condition of dividing the light beams can be varied by, for example, changing the interval between the polyhedron prisms or by rotating the polyhedron prism. Therefore, a variety of division states can be created by using a small number of optical members.

Also in a case where a rod type optical integrator is used in place of the fly-eye type optical integrator (the fly-eye lens), or in a case where they are combined to each other, an effect similar to the aforesaid structures can be obtained.

Furthermore, the present invention is arranged in such a manner that the irradiation light beams emitted from the light source are divided into a plurality of light beams before a phase difference (the difference in the length of the optical path) which is longer than the coherent distance (coherent length) of the irradiation light beams is given to a portion between a plurality of the light beams. The coherent length LS of the irradiation light beam can be expressed by:

$$LS = \lambda^2/D1$$

(where the wave length of the irradiation light beam is λ and its vector width is D1).

That is, if a difference in the optical path length longer than the coherent length L is present between two light beams emitted from one light source, the two light beams do not interfere with each other. In a case where the light source is a narrow band KrF excimer laser, the coherent length L is about 20 mm and therefore an optical path difference can be relatively easily given to a plurality of light beams. Therefore, even if a laser having a certain coherence is used, the speckle interference fringe which can be superposed on the desired pattern as noise can be effectively reduced. That is, the illuminance uniformity on the reticle and the wafer can be improved by necessitating. a simple structure in which the optical path difference generating member is disposed in the irradiation optical path.

Other and further objects, features and advantages of the invention will be appeared more fully from the following description.

BRIEF DESCRIPTION OF THE DRAWINGS

FIG. 13 is a view which illustrates the structure of the apparatus for describing the principle of the present invention;

FIG. 14 is a view which illustrates the principle of projection performed by a conventional projection exposure apparatus;

FIGS. 28A and 28B illustrate an example in which an a focal magnification-varying optical system is disposed between the input lens and the fly-eye lens in the irradiation optical system;

DESCRIPTION OF THE PREFERRED EMBODIMENTS

Figure 1:
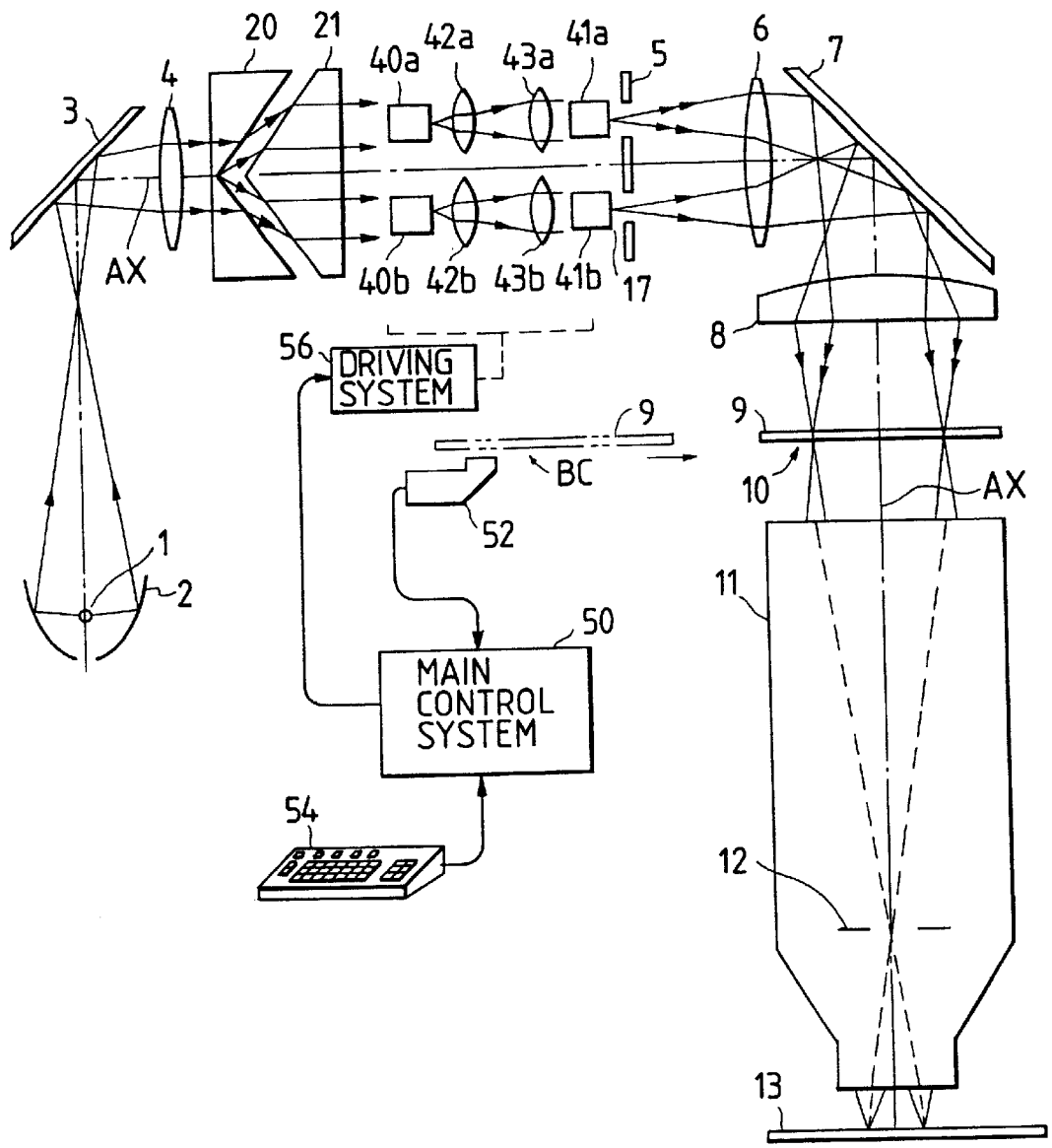
FIG. 1 is a view which illustrates the structure of a first embodiment of a projection exposure apparatus according to the present invention.

FIG. 1 illustrates a first embodiment of the present invention in which two polyhedron prisms are used to form a light dividing optical system.

Irradiation light beams emitted from a light source 1 such as a mercury lamp are gathered by an elliptical mirror 2 before they are made to be substantially parallel beams by a bending mirror 3 and an input lens 4 so that the light beams are incident on light dividing optical systems 20 and 21. A light divider according to this embodiment comprises a first polyhedron prism 20 having a V-shape concave and a polyhedron prism 21 having a V-shape convex. The irradiation light beams are divided into two light beams by the refraction effect of the aforesaid two prisms 20 and 21. The divided light beams are respectively incident on second fly-eye lenses 40a and 40b.

Although two fly-eye lenses 40a and 40b are used in this embodiment, the quantity of them may be determined arbitrarily. Although the light dividing optical system is arranged to divide the light beams into two sections to correspond to the number of the second fly-eye lens groups, the light beams may be divided into an arbitrary number of sections to correspond to the number of the second fly-eye lens groups. For example, in an arrangement in which the second fly-eye lens group is composed of four lenses, each of the light dividing optical systems 20 and 21 may be composed of a first polyhedron prism 20 having a pyramid concave and a second polyhedron prism 21 having a pyramid convex. The irradiation light beams emitted from the second fly-eye lens groups 40a and 40b are respectively incident on first fly-eye lens groups 41a and 41b by guide optical systems 42a, 43a, 42b and 43b. At this time, the first fly-eye lens 41a receives only the light beam travelled from the second fly-eye lens 40a, while the first fly-eye lens 41b receives only the light beam travelled from the second fly-eye lens 40b.

The light beams emitted from the first fly-eye lenses 41a and 41b are introduced by condenser lenses 6 and 8 and a bending mirror 7 so as to irradiate a pattern 10 formed on the lower surface of a reticle 9. The light beams, which have passed through the pattern 10, are gathered and imaged by a projection optical system 11 so that the image of the pattern 10 is formed on a wafer 13.

It should be noted that reference numeral 12 represents a Fourier transformed surface (hereinafter called a "pupil surface or plane of the projection optical system") in the projection optical system 11 with respect to the pattern 10, the arrangement being sometimes arranged in such a manner that the pupil surface of the projection optical system is provided with a variable diaphragm (NA diaphragm).

Also the irradiation optical system includes a pupil surface 17 of the irradiation optical system corresponding to the Fourier transformed surface with respect to the pattern 10. The reticle side focal surface (emission side focal surface) of each of the aforesaid first fly-eye lenses 41a and 41b is present at a position which substantially coincides with the pupil surface 17 of the irradiation optical system. The emission sides of the second fly-eye lenses 40a and 40b are Fourier transformed surfaces with respect to the incidental surfaces of the first fly-eye lenses 41a and 41b by guide optical systems 42 and 43. However, the necessity of strictly maintaining the Fourier transformed relationship can be eliminated if a relationship can be maintained in which the light beams emitted from the respective elements of the second fly-eye lens in each pair of the fly-eye lenses 40a, 41a, and the fly-eye lenses 40b,41b are superposed on one another on the incidental surface of the first fly-eye lens.

The structure of each fly-eye lens will now be described with reference to FIG. 10. FIGS. 10A to 10D are enlarged views which illustrate an element of the fly-eye lens. Actual fly-eye lenses, for example, fly-eye lenses 40a, 40b, 41a and 41b shown in FIG. 1 are aggregates of the aforesaid elements. Some of the elements are arranged (aggregated) in a direction from the upper portion to the lower portion of FIG. 10 and a vertical direction to the surface of the drawing sheet to form one element.

Figure 10A:
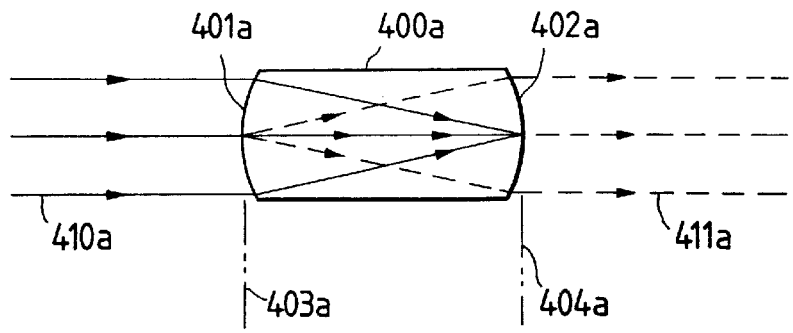
FIGS. 10A to 10D are views which illustrate some structures of the elements of the fly-eye lens.

FIG. 10A illustrates a state where an incidental surface 401a and the light source side focal surface 403a coincide with each other and an emission surface 402a and a reticle side focal surface 404b coincide with each other. In the embodiment shown in FIG. 1 and in other embodiments, the fly-eye lens of the type shown in FIG. 10A is used unless otherwise specified.

Parallel light beams 410a which have been incident from a light source (in the left portion of the drawing) are gathered to a reticle side focal plane 404a as designated by a solid line, while light beams (designated by a dashed line) emitted from one point on the light source side focal surface 403a are made to be parallel light beams after they have been emitted. Types respectively shown in FIGS. 10B to 10D will be described later.

The light side focal surfaces (which coincide with the incidental surfaces here) of the second fly-eye lens groups 40a and 40b and the first fly-eye lens group 41a and 41b shown in FIG. 1 hold the image forming relationship as described above. Therefore, the light beams, which have been incident on the incidental surface of each element of, for example, 40a included by the second fly-eye lens group are imaged and projected on all of the elements of the first fly-eye lens 41a. This means another fact that the light beams from each element of the second fly-eye lens 40a are superposed on one element included by the first fly-eye lens 41a. Therefore, the illuminance distribution on the incidental surface of the first fly-eye lens can be made uniform by an integration effect. Each element included by the first fly-eye lens, thus made uniform, is further integrated (superposed) so as to be used to irradiate the reticle 9. As a result, a satisfactory illuminance uniformity can be realized on the reticle 9.

Furthermore, the focal depth of a projected image of the pattern formed in a specific direction and having a pitch of the reticle pattern 10 can be enlarged extremely because the first fly-eye lens groups 41a and 41b are positioned away from optical axis AX.

However, it is expected that the direction and the pitch of the reticle pattern 10 become different depending upon the employed reticle 9. Therefore, it is preferable that the direction and the pitch are made optimum with respect to each reticle 9 by arranging the structure in such a manner that the positions of the first fly-eye lens groups 41a and 41b and the guide optical systems 42a, 42b, 43a and 43b can be changed or further the second fly-eye lens groups 40a and 40b and the light dividing optical systems 20 and 21 can be changed by a drive system 56. The drive system 56 is operated in accordance with an operation command issued from a main control system 50 in such a manner that the conditions, such as the position, are set in accordance with an input made by a keyboard 54. As an alternative to this, a bar code reader 52 may be used to read a bar code pattern positioned on the reticle 9 so as to set the conditions in accordance with read information, or the aforesaid irradiation conditions may be written on the bar code pattern on the reticle 9, or the main control system 50 may previously store (previously receive) reticle names and irradiation conditions corresponding to the reticles so as to determine the irradiation conditions by collating the reticle name written on the bar code pattern with the aforesaid contents stored by the main control system 50.

Figure 2:
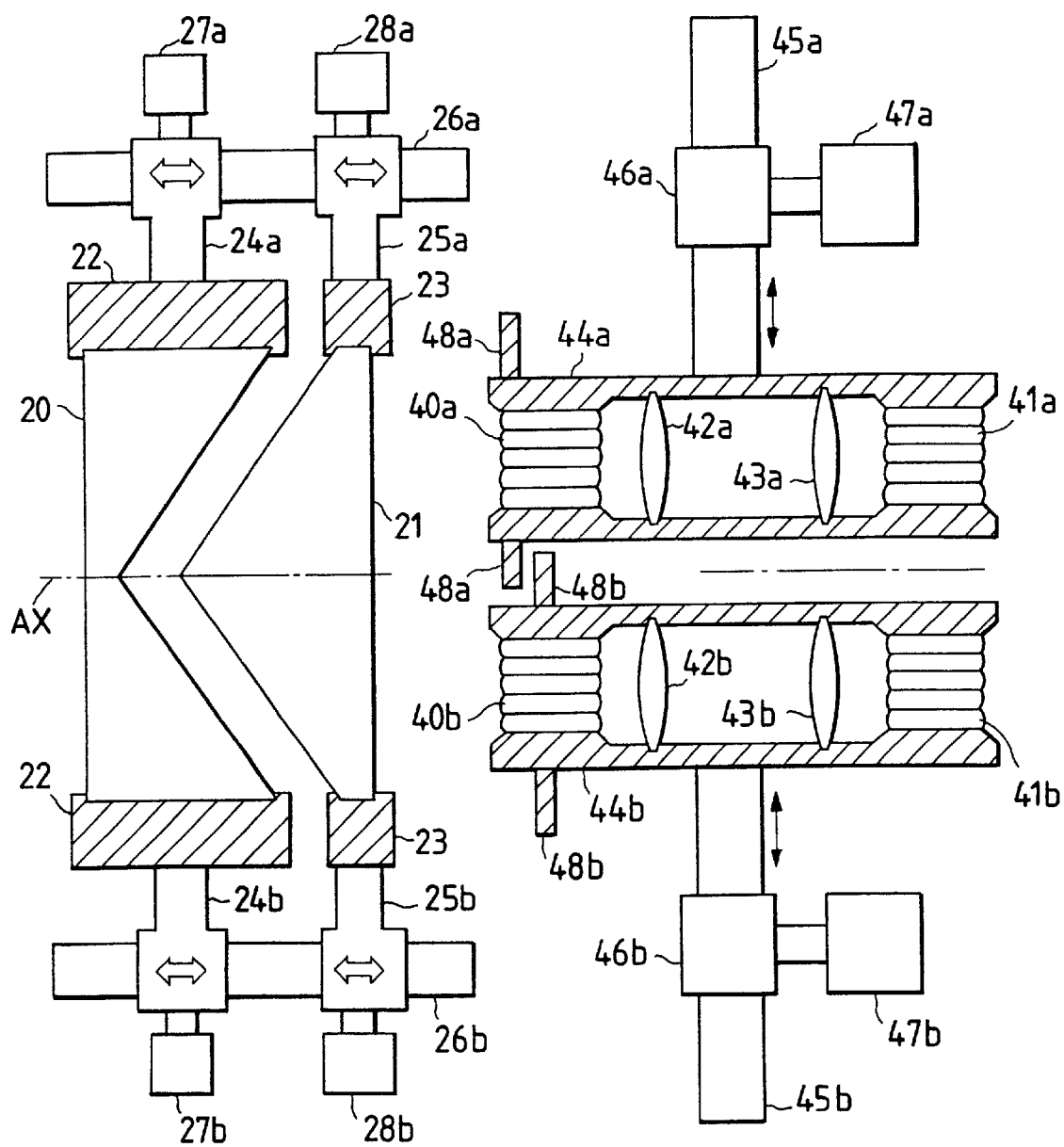
FIG. 2 is a view which illustrates a portion of the structure of the irradiation optical system shown in FIG. 1.

FIG. 2 is an enlarged view which illustrates a portion from the light dividing optical systems 20 and 21 shown in FIG. 1 to the first fly-eye lens groups 41a and 41b. Assumptions are made here that the surface of the first polyhedron prism 20 and that of the second polyhedron prism 21 facing each other are parallel to each other, and the incidental surface of the prism 20 and the emission surface of the prism 21 are perpendicular to optical axis AX. The first polyhedron prism 20 is held by a holding member 22, while the second polyhedron prism 21 is held by a holding member 23. The holding members 22 and 23 are held by a corresponding movable member group 24a, 24b and another group 25a and 25b in such a manner that the holding members 22 and 23 can be moved in a direction from right to left of the drawing sheet, that is along optical axis AX. The aforesaid operation is performed by activating members 27a, 27b, 28a and 28b such as a motor. Since the first polyhedron prism 20 and the second polyhedron prism 21 are capable of individually moving, the interval between the two emitted light beams can be radially changed while being centered at a point on optical axis AX by changing the interval between the two prisms 20 and 21.

A plurality of light beams emitted from the polyhedron prism 21 are incident on the second fly-eye lens groups 40a and 40b. In the structure shown in FIG. 2, a group consisting of one of the second fly-eye lens groups, one of the first fly-eye lens groups, and one of the guide optical systems 42 and 43 is held by one of the corresponding holding member 44a and 44b. Since the holding members 44a and 44b are held by movable members 45a and 45b, they can be moved with respect to the positions of stationary members 46a and 46b. The aforesaid operation is performed by activating members 47a and 47b.

By integrally holding and moving the second fly-eye lens, the first fly-eye lens and the guide optical system, the positions of the light beams emitted from the first fly-eye lens can be arbitrarily changed in a plane perpendicular to optical axis AX while maintaining the optically positional relationship between the first fly-eye lens and the second fly-eye lens. It should be noted that members 48a and 48b projecting from the holding members 44a and 44b are light shielding plates. As a result, stray light beams generated by the light dividing optical system can be shielded and a problem that unnecessary light beams reach the reticle can be prevented. Furthermore, the limit present in the movable range for the holding members 44a and 44b can be reduced since the light shielding plates 48a and 48b are respectively deviated in the direction along optical axis AX.

Figure 3A:
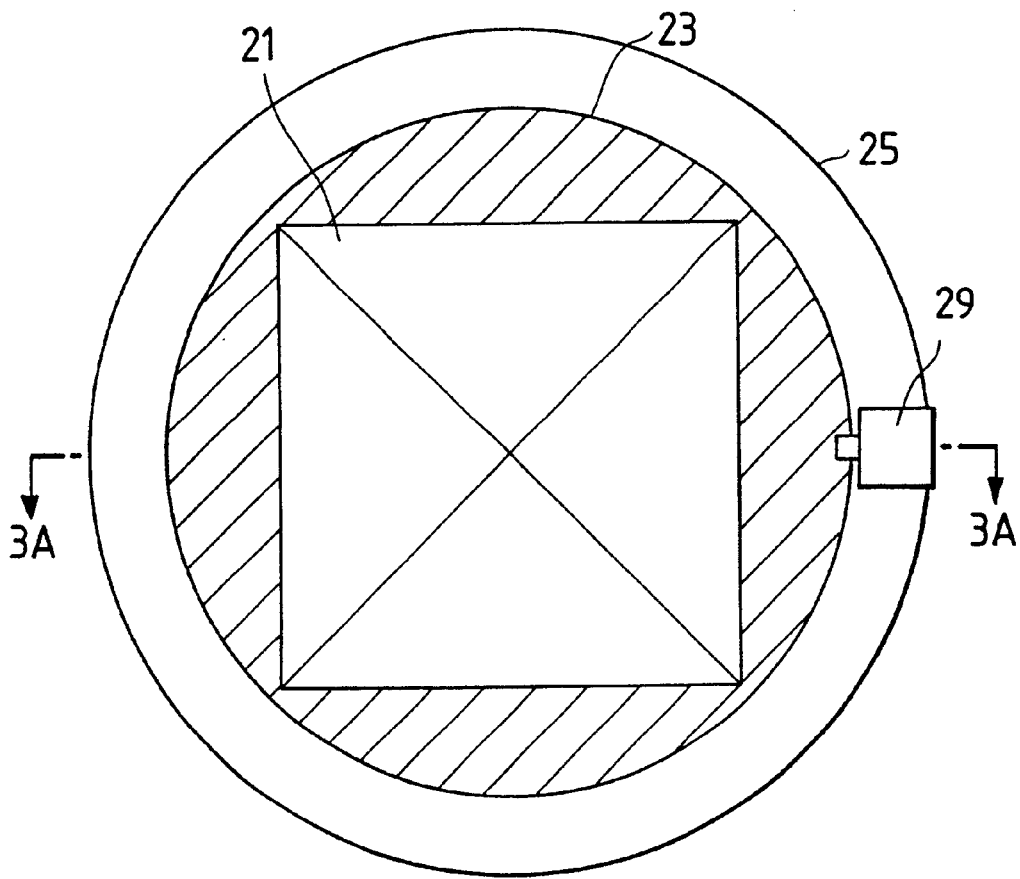
FIGS. 3A and 3B are views which illustrate the structure of a prism for dividing the light divider in the irradiation optical system into four portions.
Figure 3B:
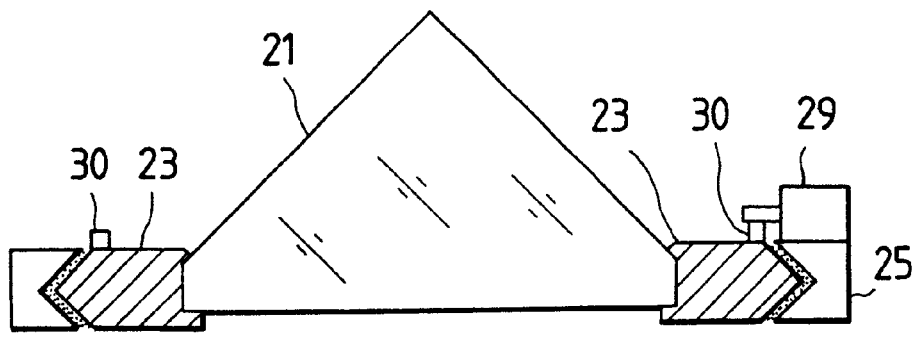

Although the structure shown in FIG. 2 is arranged in such a manner that the position of each of the divided light beams can be radially changed with respect to optical axis AX by changing the optical axial directional interval between the light dividing optical systems (polyhedron prisms) 20 and 21, the directions in which light beam pass may be changed in concentrical directions relative to a position on optical axis AX. FIG. 3 illustrates an embodiment in the aforesaid case in which the holding member 23 for holding the second polyhedron prism (the pyramid prism) 21 is held by a fixing member 25 and the holding member 23 can be rotated with respect to the fixing member 25 within the surface of the drawing sheet drawn on FIG. 3A. The aforesaid rotation is caused by a drive member 29 such as a motor provided for the fixing member 25. Furthermore, a gear 30 is disposed adjacent to the holding member 23 to correspond to the position of the motor 29. FIG. 3 is a cross sectional view taken along an arrow 3A shown in FIG. 3A.

The fixing member 25 may be held as shown in FIG. 2 in such a manner that it is able to move in the direction of optical axis AX. Although FIG. 3 illustrates the case where the rotation is enabled with respect to the second polyhedron prism 21, an arrangement may be employed in which the rotation is also enabled with respect to the first polyhedron prism 20 (with respect to optical axis AX). As an alternative to the structure in which the polyhedron prisms 20 and 21 are individually rotated, the stationary members 26a and 26b shown in FIG. 2 may be rotated with respect to another stationary member (for example, an exposure device or the like) relative to optical axis AX. In this case, the rotary mechanism may be arranged, for example, in such a manner that the holding member 23 shown in FIG. 3, in place of the polyhedron prism 21, holds the stationary members 26a and 26b shown in FIG. 1.

Figure 4:
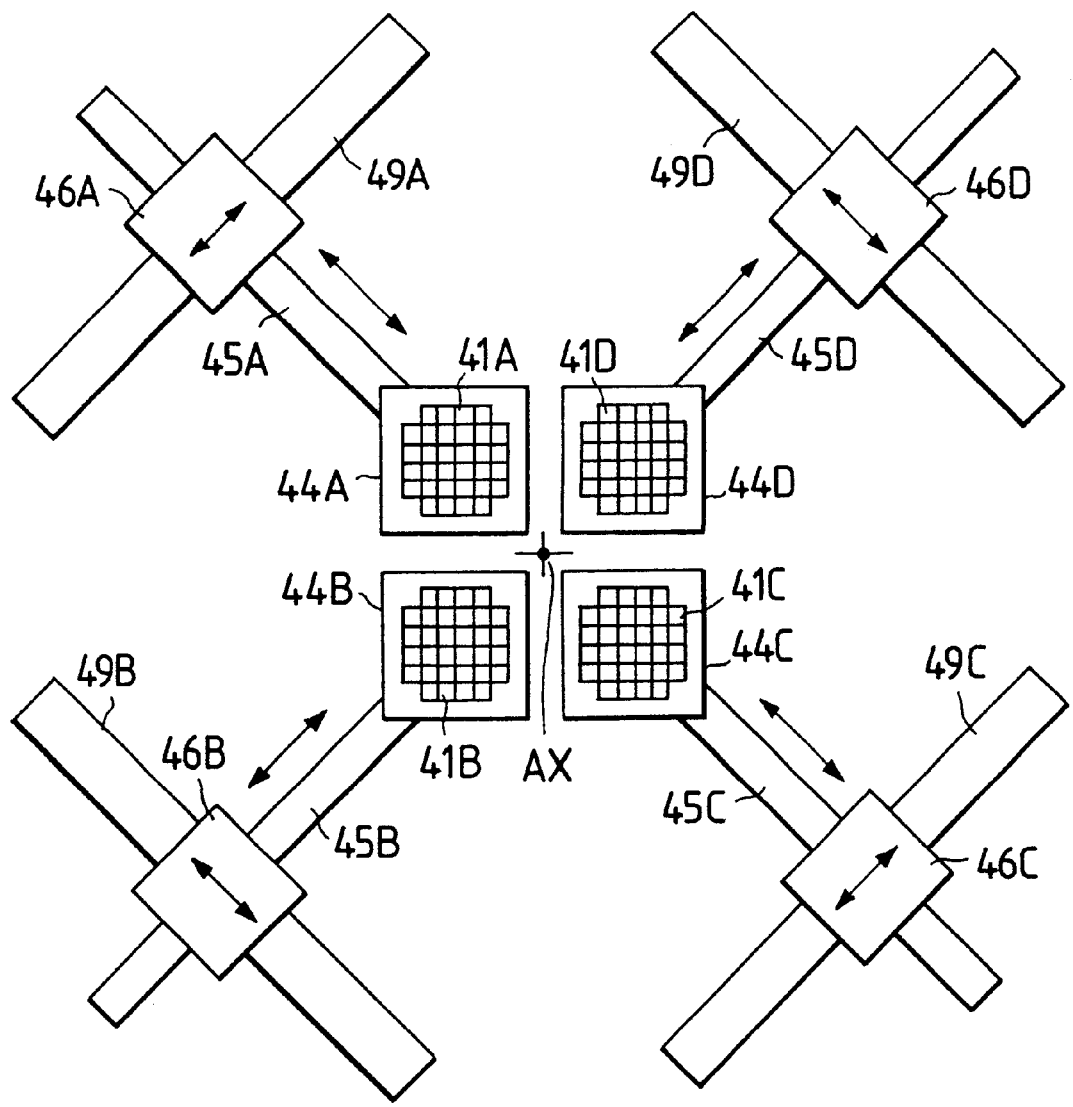
FIG. 4 is a view which illustrates the structure of a moving mechanism for fly-eye lens groups.

As described above, in a case where the positions of a plurality of the light beams emitted from the light dividing optical systems 20 and 21 are radially or concentrically changed relative to optical axis AX, the positions of the second fly-eye lens groups 40a and 40b, on which the aforesaid light beams are incident, must be varied in accordance with the changes in the positions of the light beams. FIG. 4 illustrates an example of mechanism whereby a two dimensional (in a direction on a plane perpendicular to optical axis AX) operation can be performed. FIG. 4 is a view which illustrates the members (the holding members 44a and 44b) for integrally holding the second fly-eye lenses 40a and 40b, the guide optical systems 42a, 42b, 43a and 43b and the first fly-eye lenses 41a and 41b shown in FIG. 2, viewed from a position adjacent to the reticle in a direction along optical axis AX. Synthetic fly-eye lenses 41A, 41B, 41C and 41D are held by corresponding holding members 44A, 44B, 44C and 44D which are held by movable members 45A, 45B, 45C and 45D, the synthetic fly-eye lenses 41A, 41B, 41C and 41D being able to radially move relative to optical axis AX by activating members 46A, 46B, 46C and 46D. The activating members 46A, 46B, 46C and 46D are able to move on the stationary members 49A, 49B, 49C and 49D in directions substantially perpendicular to the aforesaid radial directions (in substantially concentric directions). Therefore, the synthetic fly-eye lenses 41A, 41B, 41C and 41D are able to be two-dimensionally moved on the plane (on the surface of the drawing sheet) perpendicular to optical axis AX. As a result, the light beams divided by the light dividing optical system can be efficiently applied to the reticle.

The directions in which the movable members 45A, 45B, 45C and 45D shown in FIG. 4 are moved are not limited to the radial directions relative to optical axis AX. The directions may be arbitrary directions perpendicular to optical axis AX. Also in a case where a system can be only moved one-dimensionally as shown in FIG. 2, the directions may be arbitrary directions perpendicular to optical axis AX.

Figure 5:
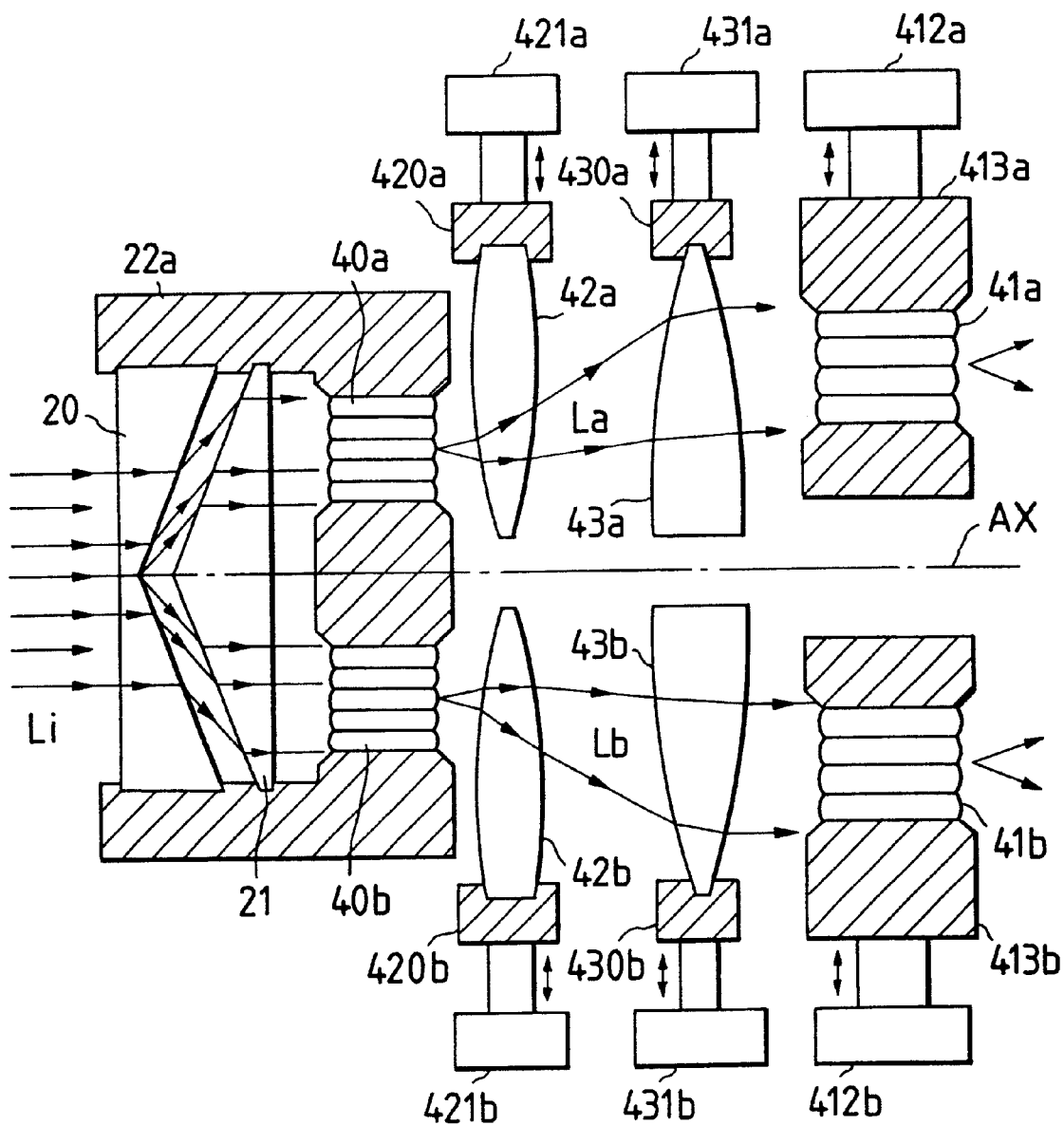
FIG. 5 is a view which illustrates a modification of a partial structure of the irradiation optical system.

FIG. 5 illustrates a modification of the guide optical system, wherein all of the guide optical systems 42a, 42b, 43a and 43b are disposed eccentrically with respect to the centers of the second fly-eye lenses 40a and 40b and the first fly-eye lenses 41a and 41b.

The positions of irradiation light beams emitted from the second fly-eye lenses 40a and 40b are changed on the plane perpendicular to optical axis AX by the eccentric guide optical systems 42a, 42b, 43a and 43b before the irradiation light beams are incident on the first fly-eye lenses 41a and 41b.

Furthermore, the positions (the positions on the plane perpendicular to optical axis AX) of the light beams on the incidental surfaces of the first fly-eye lens groups 41a and 41b can be changed by changing the degree of eccentricity of the guide optical systems 42a, 42b, 43a and 43b. The structure shown in FIG. 5 is arranged in such a manner that the change of the eccentricity amount is performed by activating members 421a, 421b, 431a and 431b. The activating members 421a, 421b, 431a and 431b enable the guide optical systems 42a, 42b, 43a and 43b via holding members 420a, 420b, 430a and 430b. The incidental surfaces (the left end portion of the drawing) of the second fly-eye lenses 40a and 40b and the incidental surfaces (the left end portion of the drawing) of the first fly-eye lenses 41a and 41b hold a substantially image forming relationship. The aforesaid image forming relationship (in a direction along optical axis AX) cannot be out of order if the operations of the guide optical systems 42a, 42b, 43a and 43b are performed on the plane perpendicular to optical axis AX. Also the first fly-eye lenses 41a and 41b are, similarly to the guide optical members, able to move in a direction on the plane perpendicular to optical axis AX by activating members 411a and 411b.

In the system shown in FIG. 5, the light beams emitted from the second fly-eye lenses 40a and 40b can be moved to arbitrary positions on the plane perpendicular to optical axis AX by the guide optical systems 42a, 42b, 43a and 43b. Therefore, the second fly-eye lens groups 40a and 40b and the light dividing optical systems 20 and 21 may be stationarily disposed in place of the arrangement in which they are able to move. In the structure shown in FIG. 5, the aforesaid elements are held by a common holding member 22a. In a case where the arrangement is made to comprise, as shown in FIG. 5, the guide optical systems 42a, 42b, 43a and 43b and the first fly-eye lens groups 41a and 41b, the light dividing optical systems 20 and 21 and the second fly-eye lens groups 40a and 40b may be arranged to be movable as shown in FIGS. 2 and 3. Although the structure shown in FIG. 5 is arranged in such a manner that both the first and the second fly-eye lenses respectively comprise two lenses, the number can be arbitrarily determined.

Figure 6:
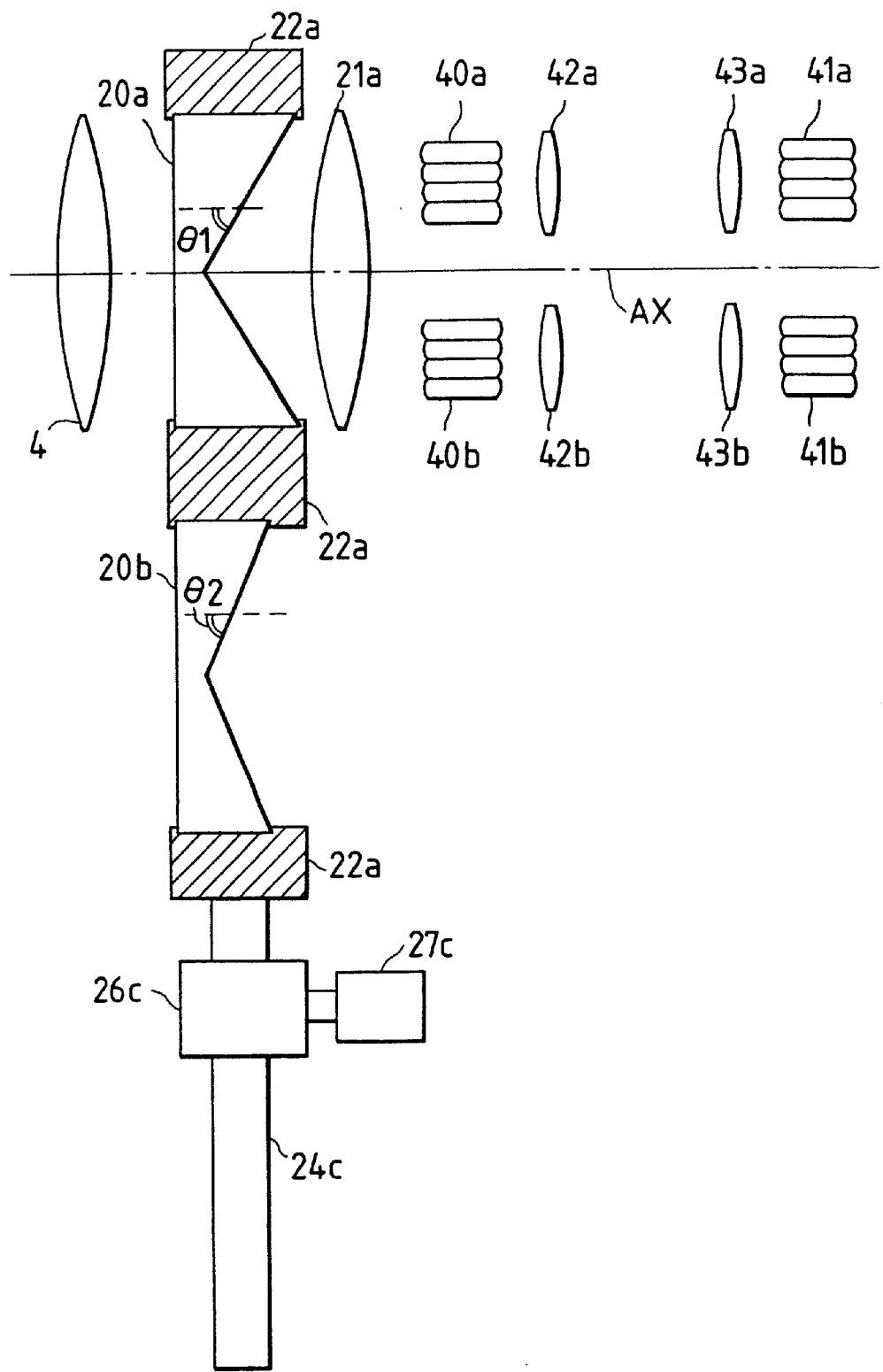
FIG. 6 is a view which illustrates a first modification of the light divider in the irradiation optical system.
Figure 7:
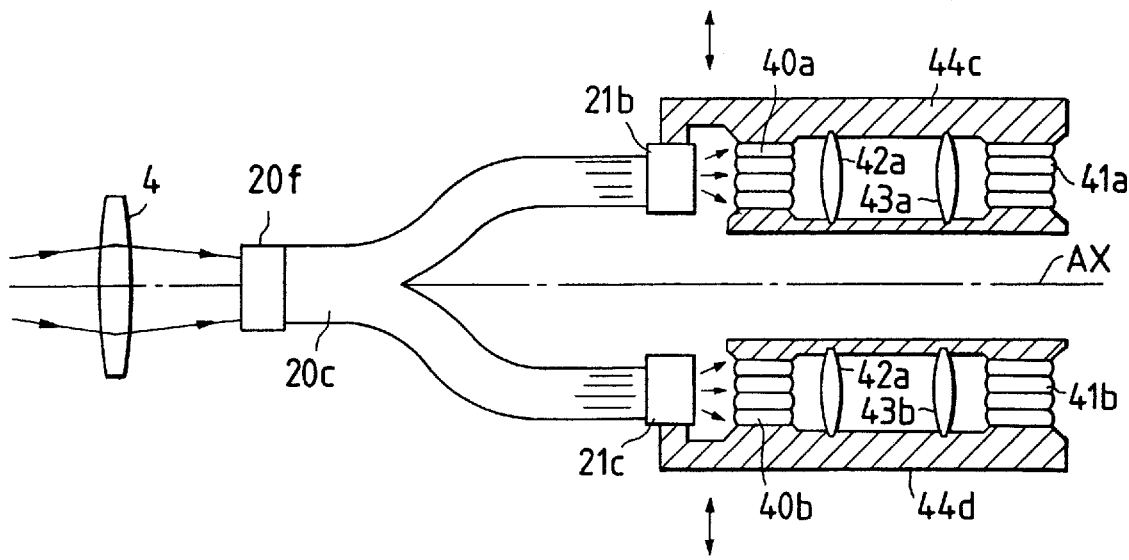
FIG. 7 is a view which illustrates a second modification of the light divider in the irradiation optical system.
Figure 8:
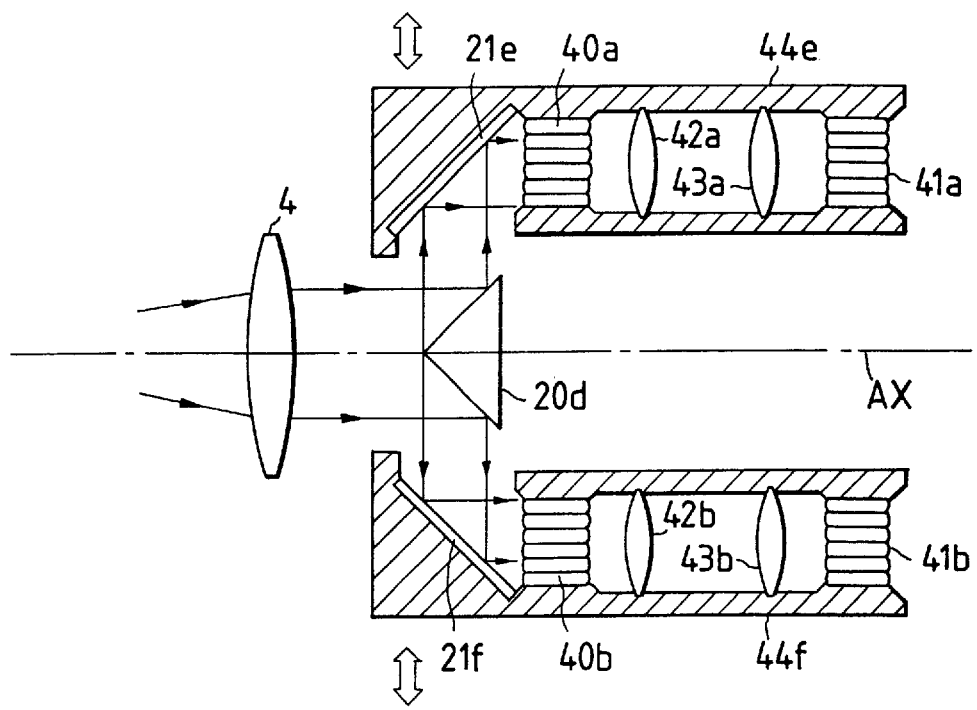
FIG. 8 is a view which illustrates a third modification of the light divider in the irradiation optical system.

FIGS. 6, 7 and 8 illustrate modifications of the light dividing optical system. The structure shown in FIG. 6 is composed of concave polyhedron prism 20a and a convex lens (or a lens group having positive power) 21a. Irradiation light beams emitted from an input lens 4 are divided and scattered by the polyhedron prism 20a, and then they are gathered by the convex lens 21a so that they are incident on the second fly-eye lenses 40a and 40b. It should be noted that change of the angle θ1 of inclination of the inclined surface of the polyhedron prism 20a will, at the positions adjacent to the second fly-eye lenses 40a and 40b, enable the positions of the divided light beams to be changed on the plane perpendicular to optical axis AX. For example, an arrangement may be employed in which two polyhedron prisms 20a and 20b having individual inclination angles θ1 and θ2 are used in such a manner that they can be interchanged by an activating member 27c. In the above mentioned structure, the two polyhedron prisms 20a and 20b are held by an integrated holding member 22a which is held by a movable member 24c. The movable member 24c is able to move with respect to a stationary member 26c by the power of an activating member 27c.

Although the two polyhedron prisms shown in FIG. 6 are arranged in such a manner that they have the inclined surfaces having individual angles but formed in the same direction, the directions may be different from each other. As an alternative to this, either of them may have a bisectioning V-shape recess and the residual one a pyramid recess. The mechanism for holding the second fly-eye lens groups 40a, 40b, the guide optical systems 42a, 42b, 43a and 43b and the first fly-eye lens groups 41 and 41b is formed similarly to those shown in FIGS. 2, 4 and 5.

FIG. 7 illustrates an example in which an optical fiber 20c is used as the light dividing optical system. Irradiation light beams incident on an incidental portion 20b of a fiber are divided into two sections by emitting portions 21b and 21c. The emitting portions 21b and 21c are held by holding members 44c and 44d which also integrally hold the synthetic fly-eye lens shown in FIG. 2. Hence, the positions of the light beams can automatically be moved (caused to follow) when the synthetic fly-eye lenses are moved.

FIG. 8 illustrates an example in which a plurality of mirrors 20d, 21e and 21f are used as the light dividing optical system. A first mirror 20d is a V-shape mirror for dividing the light beams into two sections. Second mirrors 21e and 21f are flat mirrors for introducing the light beams into the first fly-eye lenses 40a and 40b. This example is arranged in such a manner that the second mirrors 21e and 21f are integrally held by holding members 44e and 44f which integrally hold the synthetic fly-eye lens.

In the two examples shown in FIGS. 7 and 8, the holding members 44c, 44d, 44e and 44f for holding the lenses are able to move on a plane in a direction perpendicular to optical axis AX similarly to FIG. 2 or 4. The number of the fly-eye lenses and the number of the divided sections divided by the light dividing optical system are not limited to two and are therefore determined arbitrarily. In the structure shown in FIG. 7, the number of the divided sections of the fiber 20c may be changed, while a pyramid mirror (dividing into four sections) may be employed as the first mirror 20d in the structure shown in FIG. 8.

The structure of the light dividing optical system is not limited to the aforesaid description. For example, diffraction gratings, in particular, phase diffraction gratings, or a convex lens array can be used in place of the polyhedron prisms 20a and 20b shown in FIG. 6.

Figure 9:
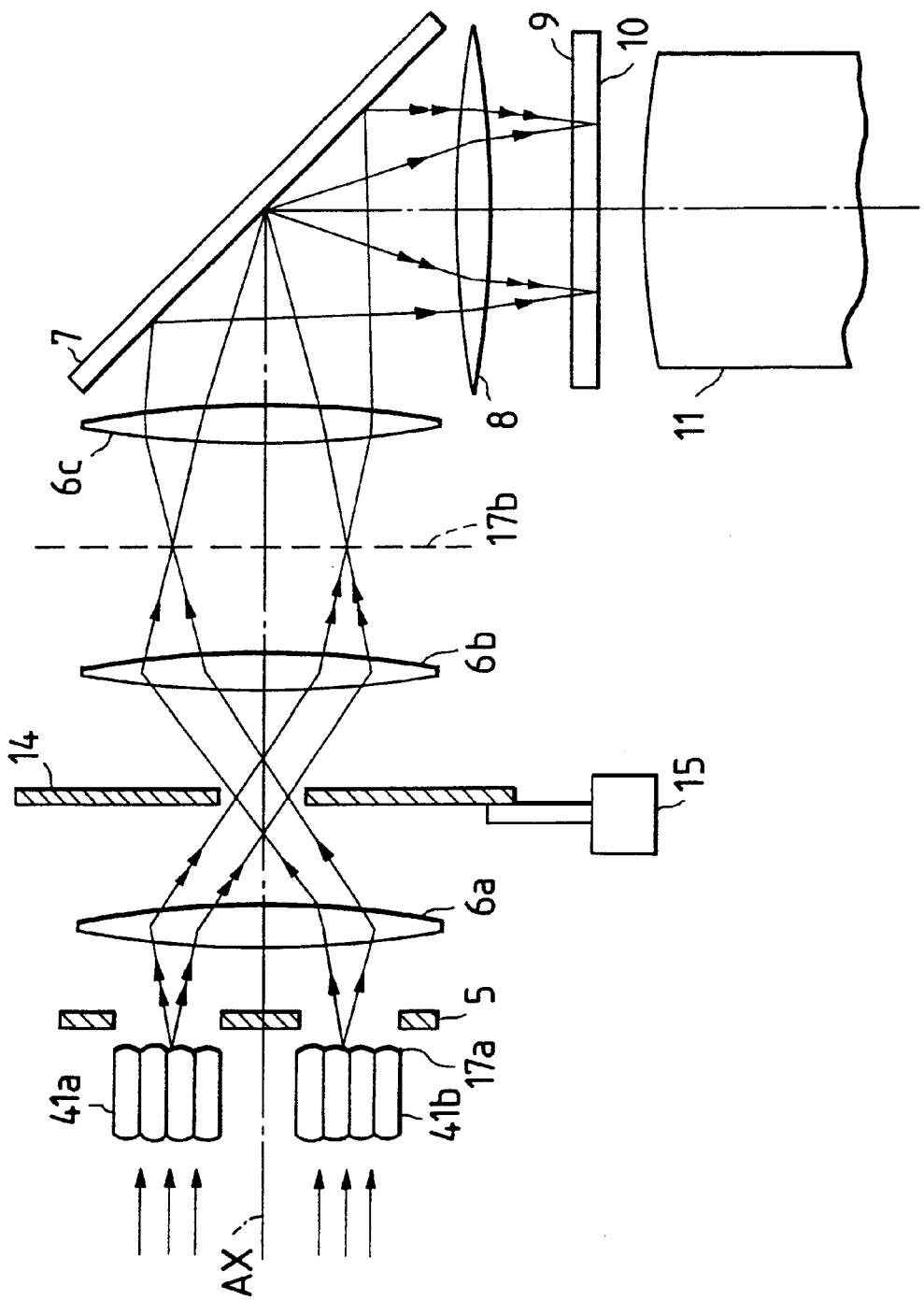
FIG. 9 is a view which illustrates another structure of the irradiation optical system.

FIG. 9 illustrates a modification of the system from the first fly-eye lens groups 41a and 41b to the projection optical system 11. Irradiation light beams emitted from the emission surface of the first fly-eye lens, that is, from the Fourier transformed surface with respect to the reticle pattern 10, are gathered and shaped by a relay lens 6a. At this time, a plane which holds an image forming relationship with the reticle pattern 10 is formed by the action of the relay lens 6a. Therefore, the irradiation area on the surface of the reticle pattern can be limited by disposing a visual field diaphragm (irradiation area diaphragm) 14 on the aforesaid plane.

Irradiation light beams are applied to the reticle 9 via a relay lens 6b, a condenser lens 6c and 8 and a mirror disposed consecutively to the visual field diaphragm 14. Furthermore, a Fourier transformed surface 17b of the reticle pattern 10 appears between the relay lens 6b and the condenser lens 6c.

Although an aperture diaphragm 5 shown in FIG. 9 is disposed adjacent to the emission side of the second fly-eye lens, it may be disposed adjacent to the Fourier transformed surface 17b.

Elements of the fly-eye lens for use in the structure according to the present invention will now be described with reference to FIG. 10. FIG. 10A illustrates the aforesaid structure in which the incidental surface 401a, the light source side focal plane 403a, the emission surface 402a and the reticle side focal surface 404a coincide with one another.

However, in the structure shown in FIG. 10A, all of the irradiation light beams in the element of the fly-eye lens pass through a glass element and a light converged point is generated in the glass (fly-eye lens). In a case where a pulse laser such as an excimer laser is used as the light source, energy per pulse becomes excessively large and therefore there arises risk of breakage of the glass element by the optical energy in the converged point if the converged point is present in the glass element.

Figure 10B:
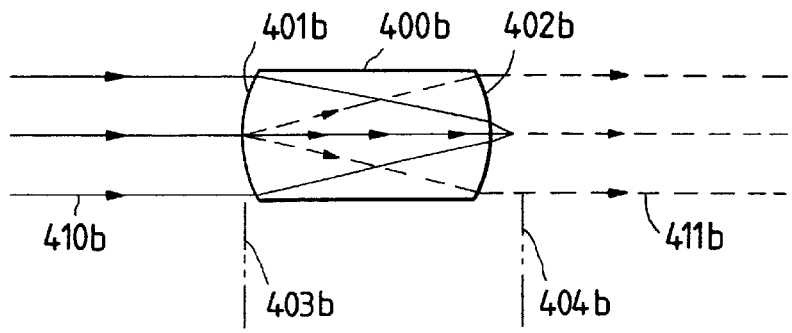
Figure 10C:
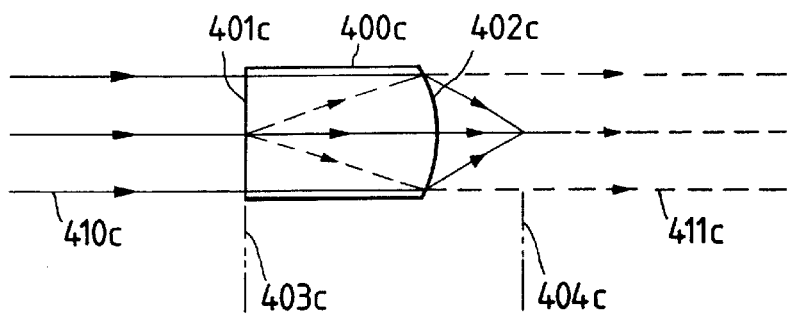

FIGS. 10B and 10C respectively illustrate examples of the fly-eye lenses for preventing the aforesaid problem. FIG. 10B illustrates a structure in which both an incidental surface 401b and an emission surface 402b are made of the surfaces of a convex lens, and a reticle side focal surface 404b is different from an emission surface 402b (a light source side focal surface 403b and an incidental surface 401b coincide with each other). The aforesaid arrangement can be realized by changing the curvature of the incidental surface 401b and that of the emission surface 402b from each other. As a result, the light beams emitted from the light source are converged at a point outside the fly-eye lens element 400b.

FIG. 10C illustrates a modification of the structure shown in FIG. 10B, where a fly-eye lens element 400c has a flat incidental surface 401c. Also in this case, the converged point (a reticle side focal surface 404c) can be located outside the lens 400c. Furthermore, the light beams are not gathered in the lens 400c. However, the light beams except for vertical and parallel beams come in contact with the inner wall of the fly-eye lens 400c and therefore stray beams are generated because the incidental surface 401c has no refraction effect. Therefore, the structure shown in FIG. 10C will enable an excellent effect to be obtained as the second fly-eye lens in a case where the light source comprises the laser beam source. The reason for this lies in that use of the laser beam source will enable the incidental light beams to be parallel beams and to be perpendicularly incident on the first fly-eye lens.

On the contrary, the structure shown in FIG. 10B is suitable when it is used as the first fly-eye lens in a case where the light source is the laser beam similarly to the structure shown in FIG. 10C.

Figure 10D:
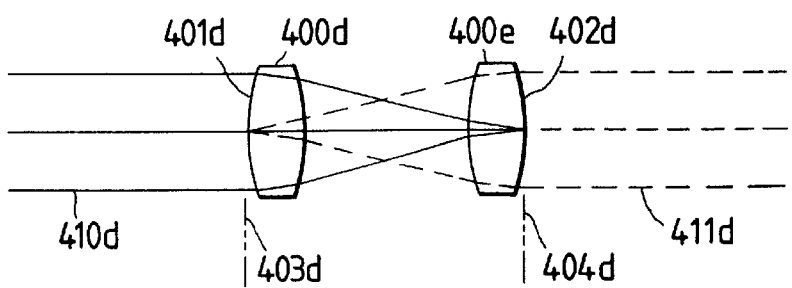

A fly-eye lens element shown if FIG. 10D is composed of two convex lenses 400d and 400e. The structure is arranged to be different from those shown in FIGS. 10A to 10C in such a manner that a space between the two convex lenses 400d and 400e is filled with air or nitrogen or helium gas. In a case where an exposure wavelength of 200 nm or less is used, it is preferable that the volume of a transmissive solid portion made of, for example, glass be minimized as shown in FIG. 10D because a proper lens material having satisfactory transmissivity cannot be available. In this case, it is preferable to constitute the projection optical system by a reflecting optical system (a refractive member may be partially employed) and also the light dividing optical system may use a reflecting mirror arranged as shown in FIG. 8.

A method of optimizing the aforesaid systems to correspond to the reticle pattern to be exposed will now be described. It is preferable that the position (the position on the plane perpendicular to the optical axis) of each first fly-eye lens group be determined (changed) in accordance with the reticle pattern to be transferred. In this case, the position may be determined as described above in such a manner that the irradiation light beams from the first fly-eye lens groups are incident on the reticle pattern at a position at which the optimum resolution and an effect of improving the focal depth can be obtained with respect to the precision (pitch) of the pattern to be transferred.

Figure 11:
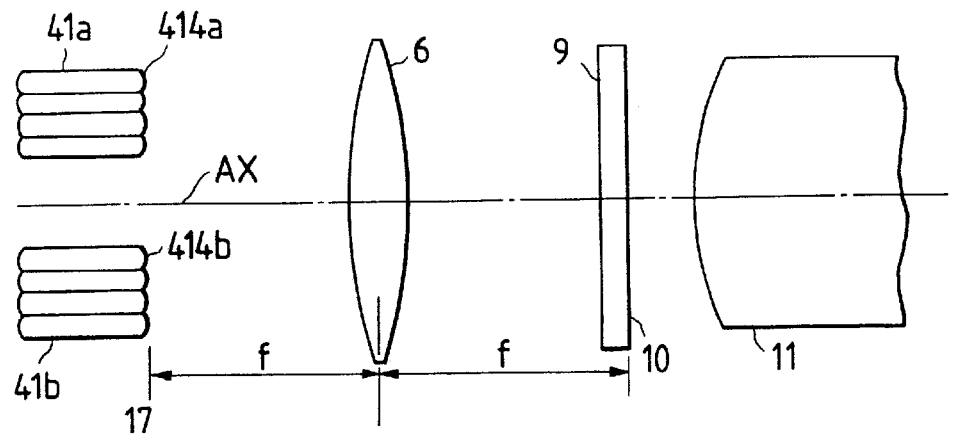
FIG. 11 is a view which illustrates the principle of the configuration of the fly-eye lenses in the irradiation optical system.

Specific examples of determining the positions of each first fly-eye lens group will now be described with reference to FIGS. 11 and 12A to 12D. FIG. 11 is a view which schematically illustrates a portion from the first fly-eye lens groups 41a and 41b to the reticle pattern 10. In the structure shown in FIG. 11, reticle side focal surfaces 414a and 414b of the first fly-eye lens group 41 coincide with the Fourier transformed surface 17 of the reticle pattern 10. A lens or a lens group which cause the two elements to hold the Fourier transformation relationship is expressed by one lens 6. Furthermore, an assumption is made that both of the distance from the principal point of the lens 6 facing the fly-eye lens to the reticle side focal surfaces 414a and 414b of the fly-eye lens group 41 and the distance from the principal point of the lens 6 facing the reticle to the reticle pattern 10 are f.

Figure 12A:
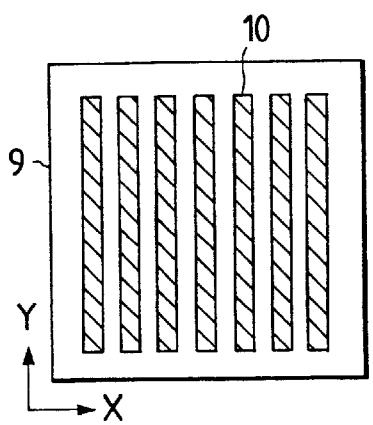
FIGS. 12A to 12D are views which illustrate a method of disposing the fly-eye lenses.
Figure 12C:
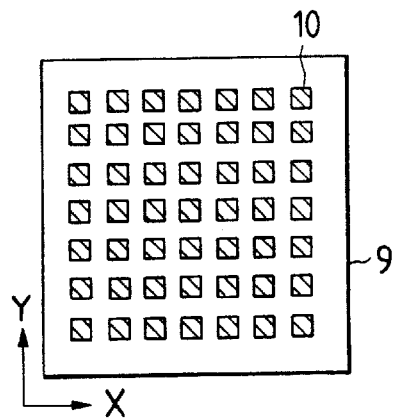
Figure 12B:
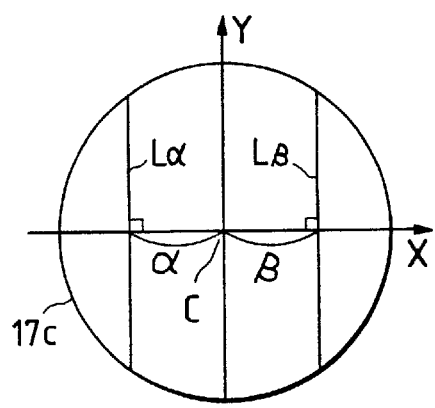
Figure 12D:
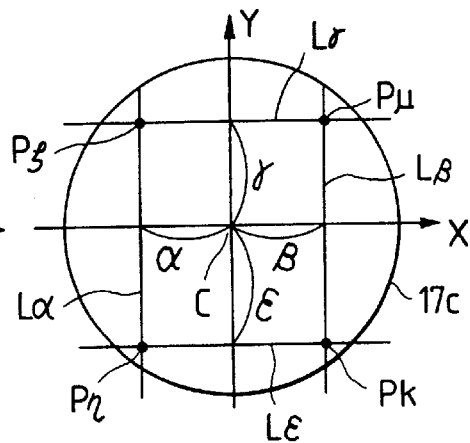

FIGS. 12A and 12C illustrate an example of a portion of a pattern to be formed in the reticle pattern 10. FIG. 12B illustrates a position on the Fourier transformed surface 17 (on the pupil surface of the projection optical system) at the center of the first fly-eye lens group which is most suitable in the case of the reticle pattern shown in FIG. 12A. FIG. 12D illustrates the positions (the positions of the centers of the optimum fly-eye lens groups) of the fly-eye lens groups which are most suitable in the case of the reticle pattern shown in FIG. 12C.

FIG. 12A illustrates a so-called one-dimensional line-and-space pattern in which transmissive portions and light shielding portions are arranged in direction Y while having the same width and furthermore they are regularly arranged in direction X at pitch P. At this time, the optimum positions for each first fly-eye lensare, as shown in FIG. 12B, arbitrary points on line segments L$\alpha$ and L$\beta$ assumed on the Fourier transformed surface. FIG. 12B is a view which illustrates the Fourier transformed surface 17 with respect to the reticle pattern 10 when viewed in a direction of optical axis AX, wherein coordinate system X and Y on the surface 17 is made to be the same as that of FIG. 12A which illustrates the reticle pattern when viewed in the same direction.

Referring to FIG. 12B, the distances $\alpha$ and $\beta$ from center C, through which optical axis AX passes, to line segments L$\alpha$ and L$\beta$ hold a relationship expressed by $\alpha=\beta$ which is equal to $f \cdot (½) \cdot (\lambda/p)$. Expressing the distances $\alpha$ and $\beta$ by $f \cdot \sin \phi$, $\sin \phi = \lambda/2P$ coincides with the aforesaid value. Therefore, if each center (each center of gravity of the light quantity distribution of secondary light source images each of which is formed by the first fly-eye lenses) is positioned on line segments L$\alpha$ and L$\beta$ either of ±1-order diffracted light beams generated from the irradiation light beams from each fly-eye lens and 0-order diffracted light beam pass through positions of a line-and-space pattern shown in FIG. 12A which are the same distance from optical axis AX on the pupil surface 12 of the projection optical system 11. Hence, the focal depth with respect to the line-and-space pattern (see FIG. 12A) can be made largest and therefore high resolution can be obtained.

FIG. 12C illustrates a case where the reticle pattern is a so-called isolated space pattern, wherein the X-directional (in the lateral direction) pitch of the pattern is Px and the Y-directional (in the longitudinal direction) pitch of the same is Py. FIG. 12D is a view which illustrates the optimum position for each first fly-eye lens in the aforesaid case, wherein the positional and rotational relationship with FIG. 12C are the same as that between FIGS. 12A and 12B. When the irradiation light beams are incident on the two-dimensional pattern arranged as shown in FIG. 12C, diffracted light beams are generated in the two-dimensional direction which corresponds to the periodicity in the two-dimensional direction of the pattern. Also in the two-dimensional pattern arranged as shown in FIG. 12C, the focal depth can be made maximum by causing either of the ±1-order diffracted light beams and the 0-order diffracted light beams to be the same distance from optical axis AX on the pupil surface 12 of the projection optical system 11. Since the pitch in the direction X is Px in the pattern shown in FIG. 12C, a maximum focal depth of the X-directional component of the pattern can be obtained if the center of each fly-eye lens is positioned on the line segments L$\alpha$ and L$\beta$ which hold the relationship $\alpha = \beta = f \cdot (½) \cdot (\lambda/Px)$. Similarly, if the center of each fly-eye lens is present on line segments L$\gamma$ and L$\epsilon$ which hold the relationships $\gamma = \epsilon = f \cdot (½) \cdot (\lambda/Py)$, the maximum focal depth of the Y-directional component of the pattern can be obtained.

As described above, when the irradiation light beams from the fly-eye lens groups disposed at the positions shown in FIG. 12B or 12D are incident on the reticle pattern 10, 0-order diffracted light beam component Do and either ±1-order diffracted light beam component DR or −1-order diffracted light beam component Dm pass through the optical path on the pupil surface 12 in the projection optical system 11 at the same distance from optical axis AX. Therefore, a projection exposure apparatus revealing high resolution and a large focal depth can be realized.

Although only the two examples as illustrated in FIGS. 12A and 12C have been considered as the reticle pattern 10, another pattern may be used in such a manner that the center of each fly-eye lens is located at a position which causes either of ±1-order or −1-order diffracted light beam component from the pattern and the 0-order diffracted light beam component to pass through the optical path which is located at substantially the same distance from optical axis AX on the pupil surface 12 in the projection optical system. In the example of the pattern shown in FIGS. 12A and 12C, the ratio (duty ratio) of the line portion and the space portion is 1:1, and therefore ±1-order diffracted light beams become intensive. Hence, attention is paid to the positional relationship between either of the ±1-order diffracted light beams and the 0-order diffracted light beam. However, in a case where the duty ratio of the pattern is not 1:1 or the like, an arrangement may be employed in which the positional relationship between another diffracted light beam, for example, either of ±2-order diffracted light beams and the 0-order diffracted light beam are allowed to pass through the positions distant, by the same distance, from optical axis AX on the pupil surface 12 of the projection optical system.

In a case where the reticle pattern 10 has, as shown in FIG. 12D, the two-dimensional cyclic pattern, a high order diffracted light beam component higher than 1-order distributed in direction X (in the first direction) with respect to one of the 0-order diffracted light beam components and a high order diffracted light beam component higher than 1-order distributed in direction Y (in the second direction) can be present on the pupil surface 12 of the projection optical system when attention is paid to a specific 0-order diffracted light beam component. Assuming that the image of a two-dimensional pattern is satisfactorily formed with respect to one specific 0-order diffracted light beam component, it is necessary for the position of a specific 0-order diffracted light beam component (one of the first fly-eye lenses) to be adjusted in such a manner that the three components consisting of one of the high-order diffracted light beam component distributed in the first direction, one of the same distributed in the second direction and the specific 0-order diffracted light beam component are distributed by the same distance from optical axis AX on the pupil surface. For example, it is preferable that the center of the first fly-eye lens be made coincide with any one of points Pζ, Pη, Pκ and Pμ. Since all of the points Pζ, Pη, Pκ and Pμ are intersections of line segment Lα or Lβ (the optimum portion in terms of the periodicity in the direction X, that is, the position at which the 0-order diffracted light beam and either of the ±1-order diffracted light beam in the direction X are spaced by the same distance from the optical axis on the pupil surface 12 of the projection optical system) and line segments Lγ and Lε (the optimum position in terms of the periodicity in the direction Y), the aforesaid position is the optimum position in either of the directions X and Y.

Although the description has been given while assuming a two dimensional pattern having the two-dimensional directionality at the same point on the reticle, the aforesaid method can be adapted to a case where a plurality of patterns having different directionalities are present in the same reticle pattern.

In a case where the pattern on the reticle has a plurality of directionalities or precisions, the optimum positions for the fly-eye lens groups are the positions which correspond to the directionality of each pattern and the precision. As an alternative to this, the first fly-eye lens may be disposed at the mean position of the optimum positions. The aforesaid mean position may be the mean load position obtained by adding weight to the precision or the significance of the pattern.

The 0-order light beam components emitted from the first fly-eye lens are incident on the wafer while being inclined with respect to the wafer. In this case, a problem arises in that the position of the transferred image is undesirably shifted in a direction on the wafer at the time of finely defocusing the wafer 13 if the direction of the center of gravity of the light quantities of (a plurality of) the inclined incident light beams is not perpendicular to the wafer. In order to prevent this, the direction of the center of gravity of the light quantities on the image forming surface or on its adjacent surface must be perpendicular to the wafer, that is, in parallel to optical axis AX.

That is, assuming an optical axis (the center line) for each first fly-eye lens, the vector sum of the product of the position vector on the Fourier transformed surface of the optical axis (the center line) with respect to optical axis AX of the projection optical system 11 and the light quantity emitted from each fly-eye lens must be zero.

A further simple method may be employed in which 2m (m is a natural number) first fly-eye lenses are used, the positions of m first fly-eye lenses are determined by the aforesaid optimizing method (see FIG. 12) and the residual m first fly-eye lenses are disposed symmetrical to optical axis AX. The detailed description about the aforesaid structure has been disclosed in U.S. patent Ser. No. 791,138 (filed on Nov. 13, 1991).

As described above, when the position of each first fly-eye lens is determined, the position (see FIG. 5) of the guide optical system and the state (see FIGS. 2, 3 and 6) of the light dividing optical system are determined. The positions and the like of the guide optical system, the light dividing optical system or the second fly-eye lens must be determined so as to cause the irradiation light beams to be incident on the first fly-eye lens most efficiently (in such a manner that the light quantity loss can be prevented).

In the aforesaid system, it is preferable that each moving portion has a position detector such as an encoder. The main control system 50 or the drive system 56 shown in FIG. 1 moves, rotates and exchanges each element in accordance with position information supplied from the aforesaid position detector. As for the shape of the lens element for each fly-eye lens group, the effective area of the reticle or the circuit pattern area are mainly in the form of a rectangle. Therefore, only the pattern portion of the reticle can be efficiently irradiated with light beams in a case where the incidental surface (which holds an image forming relationship with the reticle pattern because the emission surface and the surface of the reticle pattern hold the Fourier transformed relationship and also the incidental surface (light source side focal surface) and the emission side (reticle side focal point) hold the Fourier transformed relationship) of each element of the first fly-eye lens is formed into a rectangular shape to corresponding to the planar shape of the reticle pattern.

The number of the incidental surfaces of the first fly-eye lens (composed of the aforesaid elements) may be determined arbitrarily. In this case, the light quantity loss can be reduced by forming the total incidental surface into a shape similar to that of the incidental surface of one element of the second fly-eye lens. For example, the total incidental surface of each first fly-eye lens is made to a rectangular shape in a case where the incidental surface of one element of the second fly-eye lens is formed into a rectangular shape. In a case where the incidental surface of one element of the second fly-eye lens is formed into a regular hexagon, the total incidental surface of each first fly-eye lens is formed into a shape which is inscribed in the regular hexagon.

In a case where the image of the shape of the incidental surface of one element of the second fly-eye lens is projected by the guide optical system in such a manner that it is somewhat larger than the total incidental surface of each first fly-eye lens, the effect of making irradiation uniform at the first fly-eye lens can be further improved. As for the size of the emission surface of each first fly-eye lens, it is preferable that the number of apertures (a slngle width of the angle distribution on the reticle) per one emitted light beam be about 0.1 to about 0.3 with respect to the reticle side number of apertures of the projection optical system. If it is smaller than 0.1 times, the correctivity of the pattern transference deteriorates. If it is larger than 0.3 times, an effect of improving the resolution and that of realizing a large focal depth cannot be obtained.

The apparatus according to the aforesaid embodiment may be arranged in such a manner that the first fly-eye lens groups, the guide optical system and the second fly-eye lens groups (the structure shown in FIG. 2) following the light divider can be exchanged for a portion which corresponds to a conventional irradiation optical system, that is, a structure formed by integrating the relay lens and one fly-eye lens.

The first embodiment employs a pyramid type prism arranged as shown in FIG. 3 as a light divider for dividing the irradiation light beams emitted from the light source into four portions. However, another light divider except for the pyramid type prism and arranged, for example, as shown in.

Figure 15:
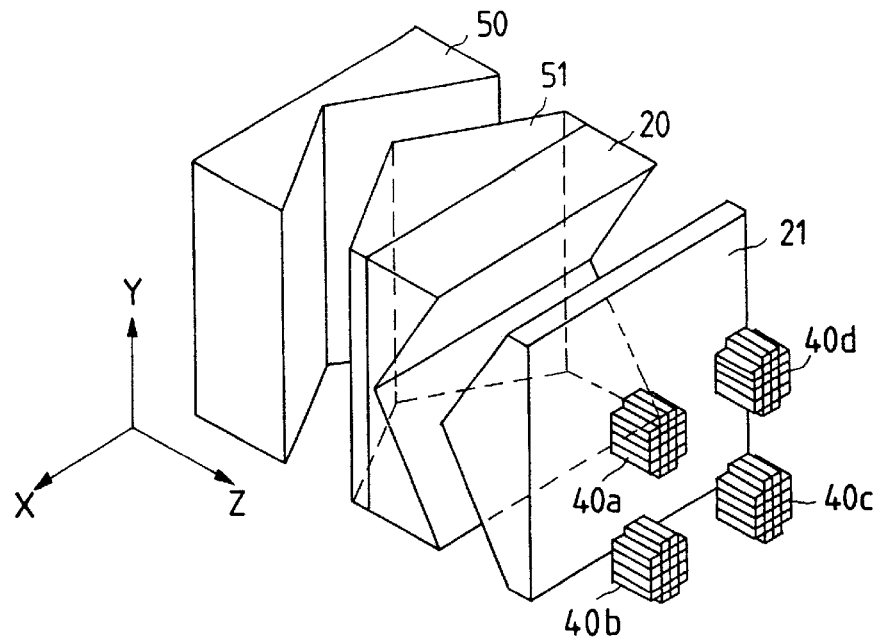
FIG. 15 is a view which illustrates the structure of a prism for dividing the irradiation light beams into four portions in the irradiation optical system.

FIG. 15 may be used. The light divider shown in FIG. 15 comprises a polyhedron prism (a first prism) 50 having a V-shaped concave, a prism (a second prism) formed by combining a polyhedron prism 51 having a V-shaped convex and a polyhedron prism 20 having a V-shaped concave, and a polyhedron prism (a third prism) having a V-shaped convex. That is, two pairs of light dividers, each of which is composed of two V-shaped prisms and which are used in the first embodiment (see FIG. 2), are arranged in series. Therefore, the irradiation light beams emitted from the light source 1 are divided into four light beams by the refraction effect of the aforesaid four prisms. Hence, the light beams are incident on corresponding second fly-eye lenses 40a to 40d (FIG. 1 shows only those 40a and 40b).

The first light dividers 50 and 51 divide the irradiation light beams emitted from the light source 1 while making them substantially symmetrical with respect to the direction Y and causing them to have substantially the same light quantity. Furthermore, the first light dividers 50 and 51 emit the two divided light beams in such a manner that they travel in parallel to each other (substantially in parallel to optical axis AX) while being positioned away from each other by a predetermined interval (which corresponds to the X-directional interval between the center of the first fly-eye lens 41a and that of 41d or between those 41b and 41c on the pupil surface with respect to the direction X). On the other hand, the second light dividers 20 and 21 divide the two light beams divided by the first light dividers 50 and 51 while making them substantially symmetrical with respect to the direction X and causing them to have substantially the same light quantity. Furthermore, the second light dividers 20 and 21 emit the four light beams in such a manner that they travel substantially in parallel to one another (substantially in parallel to optical axis AX) while being positioned away from one another by a predetermined interval (which corresponds to the Y-directional interval between the center of the first fly-eye lens 41a and that of 41b or between those 41c and 41d on the pupil surface with respect to the direction Y).

Furthermore, the prisms 50 (51 and 20) and 21 are arranged so as to be capable of individually moving along optical axis AX (in a direction Z in case of FIG. 15). Therefore, by adjusting the interval by relatively moving the first prism 50 and the second prism (51 and 20) in the direction of the optical axis, the X-directional interval between the two light beams emitted from the polyhedron prism 20 can be determined to be an arbitrary value. Similarly, by adjusting the interval between the second prism (51 and 20) and the third prism 21 by relatively moving them in the direction of the optical axis, the Y-directional interval between the two pairs of two light beams emitted from the third prism 21 can be determined to be an arbitrary value.

There is sometimes a necessity of slightly moving the third prism 21 in the direction of the optical axis when the optical directional interval between the first prism 50 and the second prism (51 and 20) is changed because the polyhedron prisms 51 and 20 are integrally formed with each other. Although the polyhedron prisms 51 and 20 are integrally formed by adhesion, an arrangement may be employed in which they are able to individually move in the direction of the optical axis.

As described above, in order to optimize the irradiation condition (in other words, the position of the center of each of the four pairs of the first fly-eye lenses on the pupil surface) in accordance with the precision (the pitch, the linear width, the period and the direction) of the pattern for each reticle, the position and the like of the four pairs of the first fly-eye lenses 41a to 41d can be shifted by the drive system. Therefore, in order to cause the four light beams emitted from the third prism to be correctly incident on the second fly-eye lenses 40a to 40d when the four sets of the first fly-eye lenses 41a to 41d are moved in accordance with the precision of the reticle pattern, the three prisms 50, (51 and 20) and 21 are individually moved in the direction of the optical axis in synchronization (while following) with the aforesaid movement.

An arrangement may be employed in which three prisms 50, (51 and 20) and 21 are made rotative relative to optical axis AX depending upon the positions of four sets of the first fly-eye lenses 41a to 41d on the pupil surface 17 so as to be rotated in synchronization with the mutual adjustment of the three prisms in the optical axial direction so that the four light beams are incident on the second fly-eye lenses 40a to 40d. Another arrangement may be employed in which the three prisms are integrally constituted on a plane (plane XY of FIG. 15) perpendicular to optical axis in such a manner that they can be two-dimensionally moved so as to be relatively moved with respect to the irradiation light beams emitted from the light source on a plane perpendicular to optical axis AX, so that the light quantities of the four light beams emitted from the third prism are finely adjusted so as to be substantially the same. In this case, it is preferable that the light quantity of each of the four light beams to be applied to the reticle 9 is detected by a photoelectric detector and the aforesaid relative movement is controlled in accordance with the result of the detection. As an alternative to the arrangement in which the three prisms are moved, an arrangement may be employed in which the position of the irradiation light beam to be incident on the first prism 50 is finely moved by, for example, inclining the parallel and flat glass disposed between the input lens 4 (FIG. 1) and the first prism 50.

Figure 16:
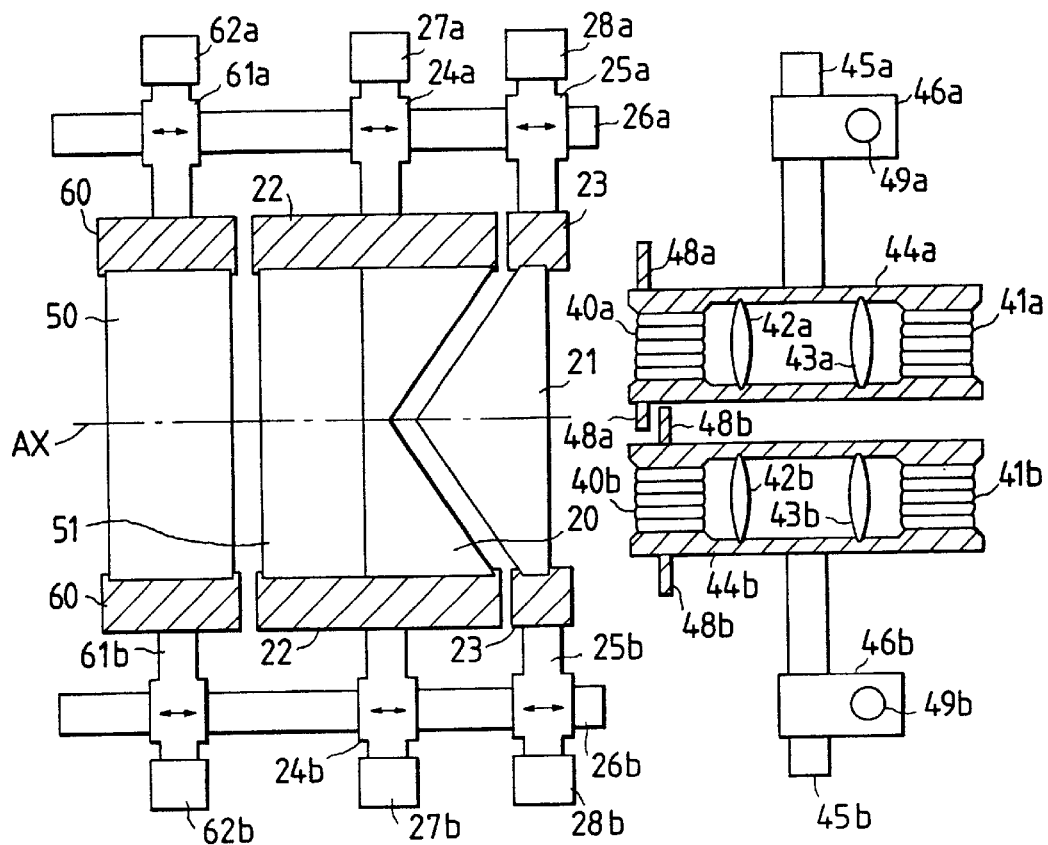
FIG. 16 is a view which illustrates the schematic structure of the irradiation optical system having the prism shown in FIG. 15.

FIG. 16 is an enlarged view which illustrates a portion from the light divider to the first fly-eye lenses 41a to 41d in a case where the light divider shown in FIG. 15 is used in the projection exposure apparatus (see FIG. 1). Assumptions are made here that the facing surfaces of the first prism 50 between the prism 51 and those between the prism 20 and the third prism 21 run parallel to each other, and the incidental surface of the first prism 50 and the emission surface of the third prism 21 are perpendicular to each other. In addition, the joined surfaces of the second prisms 51 and 20, that is, the emission surface of the prism 51 and the incidental surface of the prism 20 are perpendicular to optical axis AX. Referring to FIG. 16, the same reference numerals as those shown in FIG. 2 are given the same reference numerals and their descriptions are omitted here.

The first prism 50 is held by the holding member 60, the second prism (51 and 20) is held by the holding member 22, and the third prism 21 is held by the holding member 23. As an alternative to applying the prism 51 and 20 to each other, they may be simply hermetically held or stationarily held while positioning them away from each other by a predetermined interval. The holding member 60 is held by movable members 61a and 61b in such a manner that they are able to move on stationary members 26a and 26 in a direction from right to left when viewed in the drawing, that is, in a direction along optical axis AX. The aforesaid movement is enabled by activating members 62a and 62b such as motors.

Since the first to third prisms 50, (51 and 20) and 21 are able to move individually, the X-, and Y-directional intervals between the four light beams emitted to be emitted can be individually adjusted by arbitrarily changing the mutual distances between the three prisms in the direction of the optical axis. Hence, the positions of the four light beams can be arbitrarily, for example, can be radially changed relative to optical axis AX on a plane perpendicular to optical axis AX. For example, in a case where the reticle pattern 10 is a two-dimensional cyclic pattern and as well having different X- and Y-directional pitches, the centers of the four sets of the first fly-eye lenses must, on the pupil surface 17, coincide with the vertex of the rectangle relative to optical axis AX. Also in this case, by adjusting the mutual intervals between the three prisms 50, (51 and 20) and 21, the four emitted light beams are enabled to be accurately incident on the corresponding second fly-eye lenses 40a to 40d. Furthermore, the four emitted light beams can be shifted in the concentric directions relative to optical axis AX by arranging the structure in such a manner that the three prisms 50, (51 and 20) and 21 can be rotated relative to optical axis AX as described above.

Although four sets of the fly-eye lenses are used in the structure shown in FIG. 15, it is sufficient to use two sets of fly-eye lenses in a case where the reticle pattern is a one-dimensional cyclic pattern for example. In this case, two sets of fly-eye lenses are selected from the four sets and the centers of the two fly-eye lenses are made substantially coincide with positions deviated from optical axis AX by a quantity corresponding to the precision of the reticle pattern.

Furthermore, the three prisms are moved in accordance with the positions of the two second fly-eye lenses, thus selected, in such a manner that the two prisms are brought into contact with each other in a hermetical manner so as to make either of the distance from the first prism 50 to the second prism (51 and 20) or the distance from the second prism (51 and 20) to the third prism 21 to be zero. In a case where the second fly-eye lenses 40a and 40b are located substantially symmetric with respect to optical axis AX and as well as distant from each other by a predetermined distance in the direction X, the second prism (51 and 20) and the third prism 21 are brought into contact with each other in a hermetical manner so as to make the distance to be zero.

As a result, the irradiation light beams emitted from the light source 1 are divided into two portions by the first prism 50 and the second prism, that is the prism 51 and the irradiation light beams are not divided by the prism 20 and the third prism 21. Hence, the irradiation light beams emitted from the light source 1 are divided into two portions by the three prisms while preventing the light quantity loss and they are respectively and collectively incident on the two sets of the second fly-eye lenses even if only the two sets of the fly-eye lenses are used.

In a case where a reticle which is not adapted to the inclined irradiation method, for example, a phase shift reticle of a spatial frequency modulation type, is used, the irradiation must be performed in such a manner the light quantity distribution of the irradiation light beams on the pupil surface 17 must be limited to a circular (or a rectangular) region around the optical axis AX. In this case, the prisms are moved so that the first prism 50 and the second prism (51 and 20), and the second prism (51 and 20) and the third prism 21 are respectively are hermetically held so as to make the interval in the direction of optical axis AX to be zero. Furthermore, the four sets of the fly-eye lenses are moved so as to be integrated relative to optical axis AX. As a result, the irradiation light beams emitted from the light source 1 are not divided by the three prisms 50, (51 and 20) and 21 but they can be incident on the four integrated fly-eye lenses while preventing the light quantity loss. Hence, even if the light divider shown in FIG. 15 is used, the conventional irradiation (hereinafter called an "ordinary irradiation") can be employed. In a case where the four sets of the fly-eye lenses must be moved and integrated (combined), it is preferable that four sets of holding members be structured in such a manner that the four sets of the holding members for integrally holding the first and the second fly-eye lenses and the guide optical system will not form a gap between contact portions of the four sets of the first fly-eye lenses.

As can be understood from above, the inclined irradiation and the ordinary irradiation can easily be changed over while eliminating the necessity of, for example, changing the optical member in a case where the light divider shown in FIG. 15 is used. In case of the inclined irradiation, switching can easily be performed between the case in which the four sets of the fly-eye lenses are used and the case where the two sets of the fly-eye lenses are used. If a zoom lens system is disposed between the input lens 4 and the first prism 50, for example, and as well if the diameter (the area) of the irradiation light beam to be incident on the first prism 50 can be varied, the light quantity loss can be prevented furthermore and a problem which takes place in that the light beams emitted from the third prism 21 are concentrically incident on a portion of the incidental surface of the second fly-eye lens can be prevented. In a case where the four sets of the fly-eye lenses are radially moved relative to optical axis AX for example, a necessity simply lies in that the diameter of the irradiation light beam to be incident on the first prism 50 is adjusted by the zoom lens system in accordance with the size (the X- and Y-directional widths) of the incidental surface of each second fly-eye lens. Furthermore, if a zoom lens of the aforesaid type is used, the coherence factor (value) of the irradiation optical system can be varied at the time of performing the ordinary irradiation.

Figure 17:
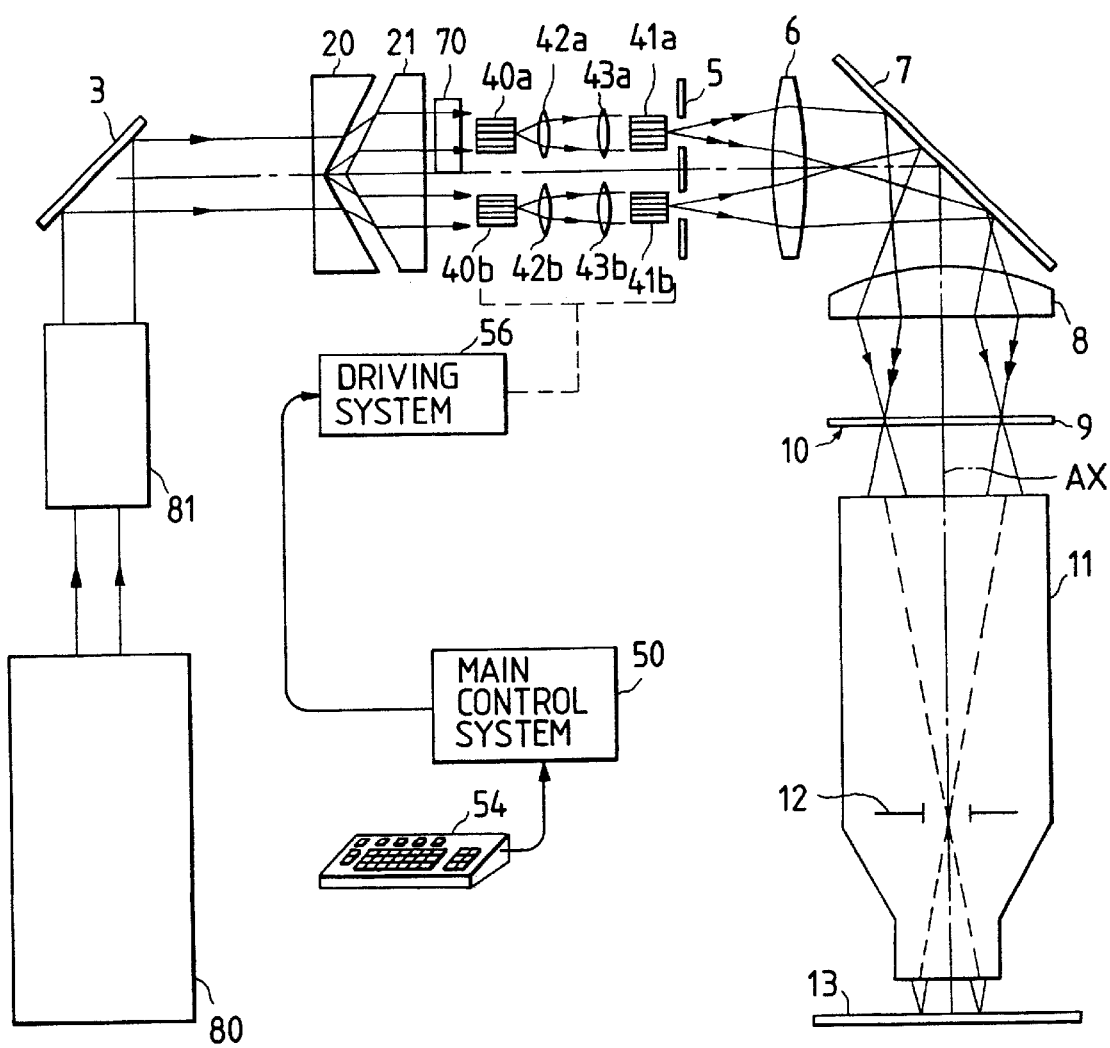
FIG. 17 is a view which illustrates the schematic structure of a second embodiment of the projection exposure apparatus according to the present invention.
Figure 18:
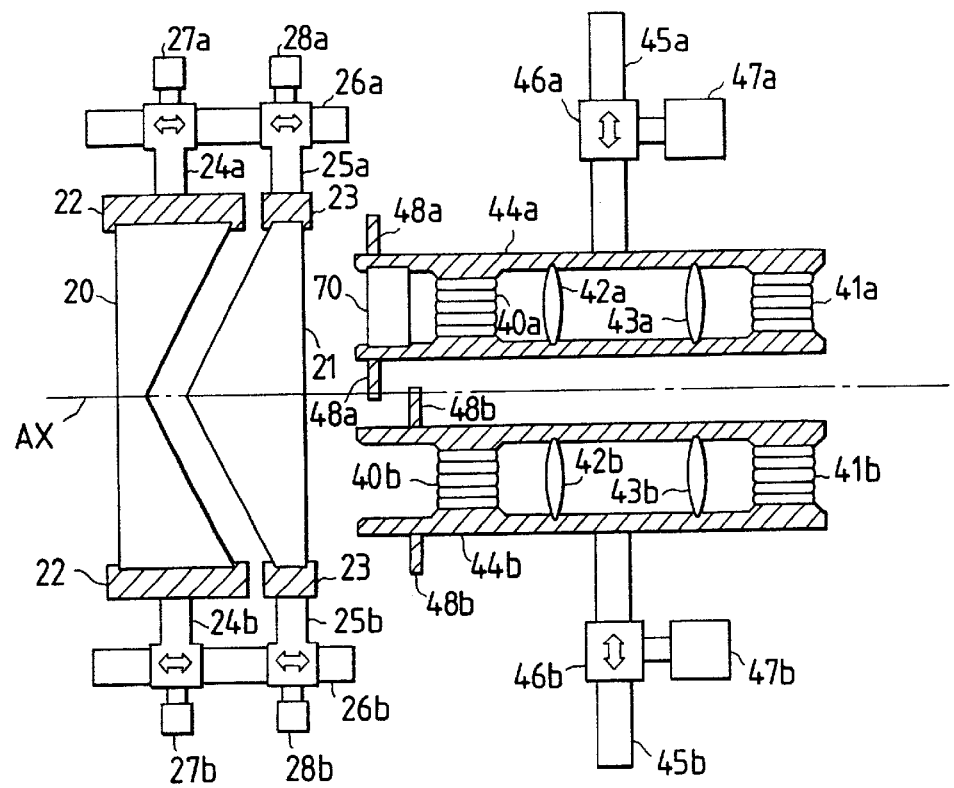
FIG. 18 is a view which illustrates the schematic structure of a portion of the irradiation optical system shown in FIG. 17.

A second embodiment of the projection exposure apparatus will now be described with reference to FIGS. 17 and 18. FIG. 17 is a view which illustrates the schematic structure of the projection exposure apparatus according to this embodiment. FIG. 18 is an enlarged view which illustrates a portion from the light dividers 20 and 21 to the first fly-eye lenses 41a and 41b. Referring to FIGS. 17 and 18, the same elements as those shown in FIGS. 1 and 2 are given the same reference numerals and their descriptions are omitted here.

As shown in FIG. 17, this apparatus according to this embodiment uses, as the exposure light source, a KrF or ArF excimer laser or harmonic waves such as a metal vapor laser or YAG laser. Therefore, the speckle interference fringes are prevented and the illuminance uniformity on the wafer is improved by disposing an optical path difference generating member (for example, a parallel and flat glass) 70 in the irradiation optical system. The above mentioned arrangement is different from the first embodiment (see FIG. 1) and therefore the description will now be given about it. It should be noted that a beam shaping optical system 81 shown in FIG. 17 includes a beam expander and the like and capable of shaping the cross section of the light beam into a proper shape (which is in the form of a square in usual).

As shown in FIG. 17, the parallel and flat glass 70 serving as the optical path difference generating member is disposed in either of the optical paths (in the structure shown in FIG. 17, the optical path for the light beam to be incident on the second fly-eye lens group 40a) for the light beams divided by the light dividers 20 and 21. Therefore, the light beam to be incident on the second fly-eye lens 40a is given a phase delay by a predetermined quantity from the light beam to be incident on the second fly-eye lens group 40*b*. That is, an optical path difference is generated between the two light beams. This embodiment is arranged in such a manner that the thickness of the parallel and flat glass 70 is determined so as to make the optical path difference between the two light beams to be longer than a coherent length LS (LS=$\lambda 2$/ D1). Although the parallel and flat glass 70 is disposed in the optical path for either of the two light beams, the parallel and flat glass may be disposed in each of the optical paths If the optical path difference between the two light beams is always longer than the coherent length LS. Furthermore, the optical path difference generating member may be, for example, a mirror in. place of the parallel and flat glass if it is capable of turning the light beam to give an optical path difference.

The optical path difference generating member is not limited particularly if it is able to give a proper phase difference between the light beams. The number of the optical paths may be the same number as or a number smaller than the number of the second fly-eye lens groups by one in order to cause a plurality of light beams divided by the light divider to have different optical path differences (longer than the coherent length). For example, in a case where four second fly-eye lens groups are disposed, the light divider is composed of the first polyhedron prism 20 having a pyramid concave and the second polyhedron prism 21 having a pyramid convex (see FIG. 3). Furthermore, four (or three) parallel and flat glass each having an individual thickness to correspond to the coherent length LS may be disposed in the optical paths of the light beams in order to cause the four light beams to have different phase differences (optical path differences). The pyramid type prism may be replaced by a light divider arranged as shown in FIG. 15.

The parallel and flat glass 70, as shown in FIG. 18, is held by the holding member 44*a* integrally with the first and second fly-eye lenses 41*a*, 40*a*, and the guide optical systems 42*a* and 43*a*. Therefore, when the first fly-eye lens is shifted in accordance with the precision, the parallel and flat glass 70 is also moved.

An arrangement may be employed in which the parallel and flat glass 70 is not secured to the holding member 44*a* but it is made to be individually movable so as to drive the parallel and flat glass 70 in synchronization with the movement of the holding member 44*a*. By making the area of the parallel and flat glass 70 to be larger than the movable range of the light beams to be incident on the second fly-eye lens group 40*a* on a plane perpendicular to optical axis AX, the necessity of using the moving mechanism and the necessity of integrally securing it to the holding member 44*a* can be eliminated. In this case, the necessity simply lies in that it is mechanically secured to the apparatus.

When the light beams divided by the light dividers 20 and 21 are shifted to the concentrical direction relative to optical axis AX, it is preferable that also the parallel and flat glass 70 is rotated relative to optical axis AX. In a case where a plurality of the light beams emitted from the light dividers 20 and 21 are shifted in the radial direction and the concentrical direction relative to optical axis AX, and in particular in a case where the same are shifted in the concentrical direction, it is preferable that the positions of the second fly-eye lens groups 40*a* and 40*b*, on which the aforesaid light beams are incident, are shifted so as to make coincide the direction of the configuration of the elements which constitute the fly-eye lens group and the cyclic direction of the reticle pattern to each other. In this case, each of the fly-eye lens groups may be made rotative or a plurality of the synthetic fly-eye lenses (the holding members 44*a* and 44*b*) are made rotative around optical axis AX. The positions of a plurality of the light beams are shifted in the concentrical direction when the one-dimensional line-and-space pattern arranged regularly in the direction X has been changed to a one-dimensional line-and-space pattern arranged regularly in a direction inclined by 45° from the X and Y directions.

A modification of the optical path difference generating member according to the present invention will now be described with reference to FIGS. 19, 20 and 21. Referring to these drawings, elements having the same function and operation as those of the elements shown in FIG. 18 are given the same reference numerals.

Figure 19:
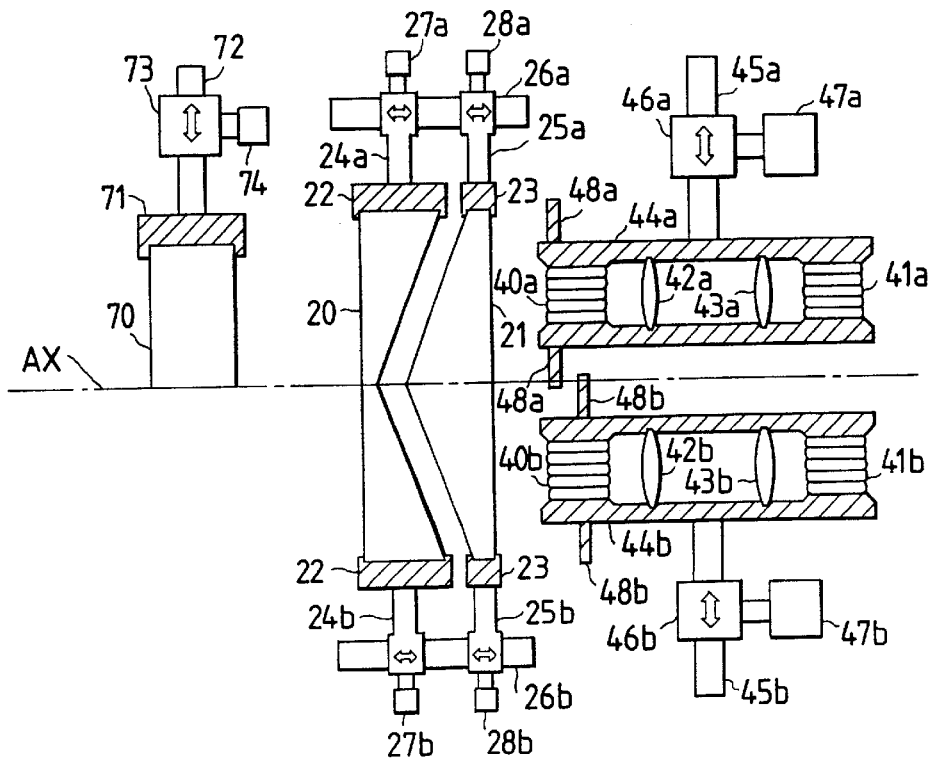
FIG. 19 is a view which illustrates a modification of the partial structure of the irradiation optical system shown in FIG. 17.

The modification shown in FIG. 19 is arranged in such a manner that the parallel and flat glass is used as the optical path difference generating member similarly to the aforesaid embodiment (see FIG. 18), and the parallel and flat glass 70 is disposed in a portion (an upper half portion above optical axis AX when viewed in the drawing) of the optical path for the irradiation light beams which corresponds to either of the two inclined surfaces of the light dividers 20 and 21 (the V-shaped prism) prior to the moment the irradiation light beams from the light source are incident on the light dividers 20 and 21. Therefore, the phase of only the light beam of the two light beams divided by the light dividers 20 and 21, which is incident on the second fly-eye lens group 40*a*, is delayed so that the optical path difference between the two light beams is made longer than coherent length LS. Referring to FIG. 19, the parallel and flat glass 70 is held by a holding member 71 and the holding member 71 is held by a movable member 72 so that the parallel and flat glass 70 is able to move with respect to a stationary member 73. The aforesaid operation is performed by an activating member 74. Since the structure is arranged in such a manner that the parallel and flat glass 70 is movable in a direction perpendicular to optical axis AX, the parallel and flat glass 70 can be accurately disposed in the irradiation light beam path while making optical axis AX to be the boundary. Therefore, the phase (the length of the optical path) of only either of the two light beams can be changed. The portions of the apparatus shown in FIG. 19 are basically the same as those of the structure shown in FIG. 18 and therefore their descriptions are omitted here. In this modification, the parallel and flat glass 70 may be disposed at any position in the optical path between a light source 80 and the light dividers 20 and 21. As can be clearly seen from FIGS. 18 and 19, the parallel and flat glass 70 may be disposed at any position in the optical path between the light source 80 and the second fly-eye lens groups 40*a* and 40*b*. Although it may be disposed in an optical path between the first fly-eye lens groups 41*a* and 41*b* and the reticle 9, it must be disposed at a position at which the light beams from the first fly-eye lens groups 41*a* and 41*b* do not superpose (for example, a position adjacent to the emission side focal surfaces of the first fly-eye lens groups 41*a* and 41*b* or a position adjacent to their conjugated surface).

Figure 20:
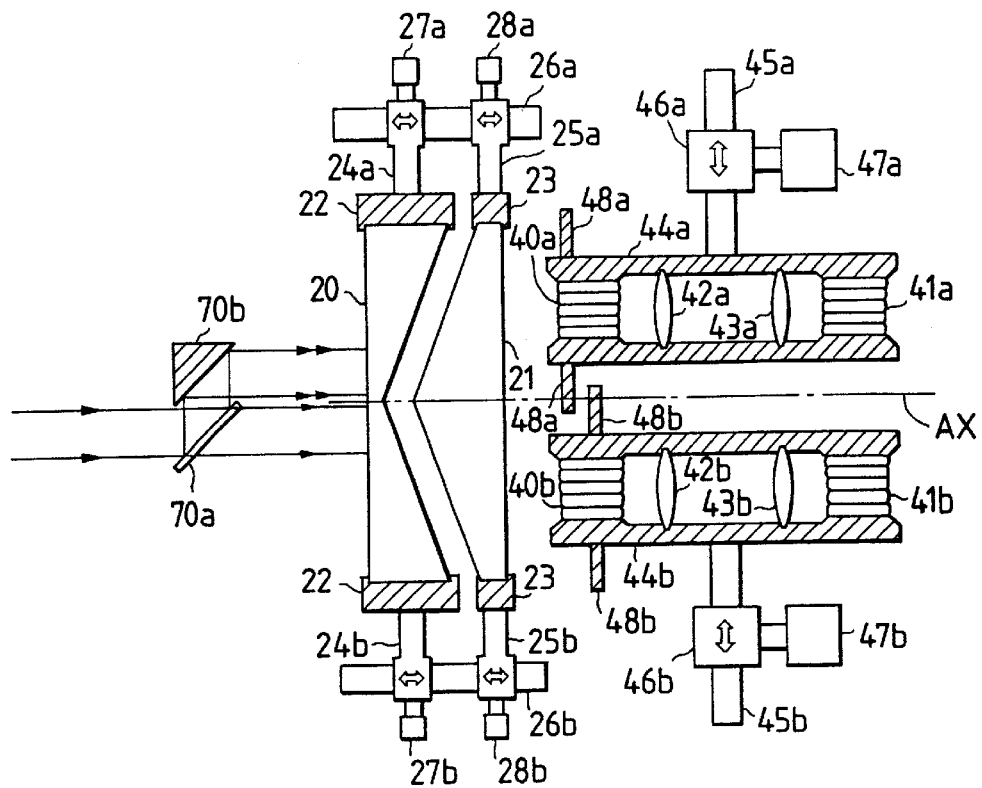
FIG. 20 is a view which illustrates a modification of the partial structure of the irradiation optical system shown in FIG. 17.

FIG. 20 illustrates a case in which a mirror is used as the optical path difference generating member in place of the parallel and flat glass. Also this embodiment is arranged in such a manner that the light beam portion, which corresponds to either of the two light beams to be divided, is caused to have a phase difference (the difference in the optical path length) prior to a moment the irradiation light beams emitted from the light source 80 are incident on the light dividers 20 and 21. Referring to FIG. 20, the irradiation light beams emitted from the light source 80 are divided into two light beams (the light quantity ratio: 1:1) by a beam splitter (a half mirror) 70*a*. The light beams, which have passed through it, then travel linearly before they are incident on the light dividers 20 and 21. On the other hand, the light beams reflected by the half mirror 70*a* are turned upwards when viewed in the drawing before they are again turned by the reflecting mirror 70*b* before they are incident on the light dividers 20 and 21. As a result, the light beams reflected by the half mirror 70*a* are delayed (the phase is delayed) by the distance from the half mirror 70*a* to the reflecting mirror 70*b*. Therefore, also this embodiment enables the optical path of only either of the two light beams divided by the light dividers 20 and 21 to be changed. The half mirror 70*a* and the reflecting mirror 70*b* are integrally secured by a holding member (omitted from illustration) while being disposed away from each other by a distance with which the optical path difference between the two light beams is longer than coherent length LS, Furthermore, they are disposed in the optical path for the irradiation light beams so as to cause the transmissive light beams and the reflected light beams from the half mirror 70*a* to be symmetrically incident on the light divider 20 with respect to optical axis AX. Since this embodiment uses the mirrors 70*a* and 70*b* as the optical path difference generating members, the irradiation light beams emitted from the light source are deflected with respect to optical axis AX of the irradiation optical system as can be understood from FIG. 20. It is preferable that the structure be arranged in such a manner that the mirrors 70*a* and 70*b* are able to move in a direction perpendicular to optical axis AX so as to be able to finely adjust the incidental positions at which the transmitted light beams and the reflected light beams are incident on the light divider 20. The residual portions of the apparatus shown in FIG. 20 are the same as those of the apparatus shown in FIG. 19.

Figure 21:
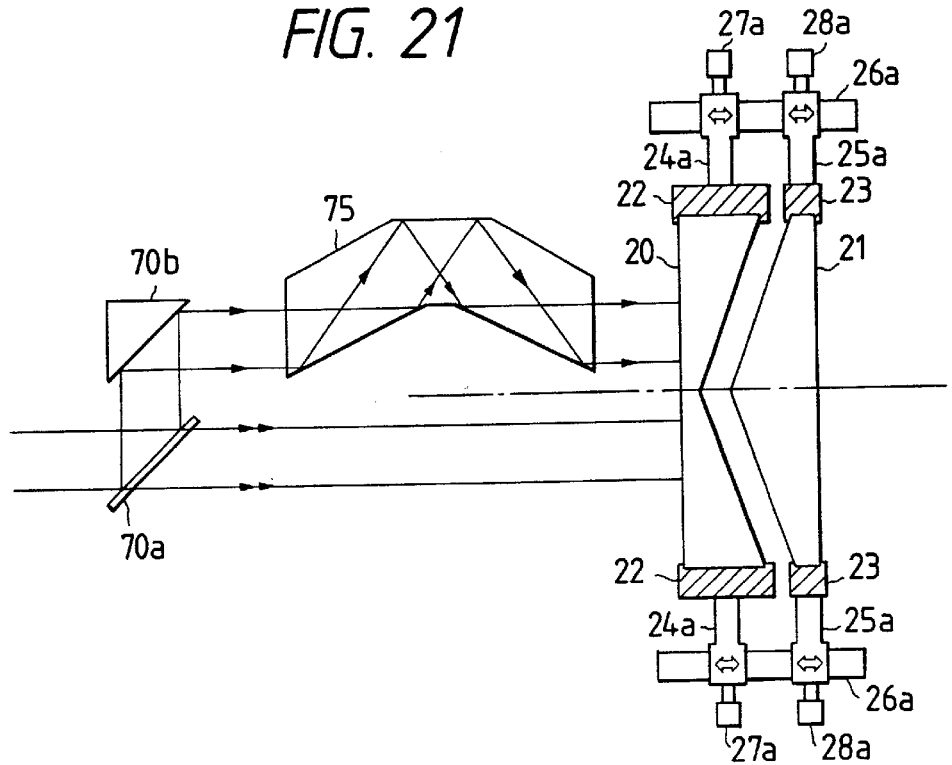
FIG. 21 is a view which illustrates a modification of the partial structure of the irradiation optical system shown in FIG. 17.

FIG. 21 illustrates an embodiment in which the structure including the optical path difference generating members 70*a* and 70*b* and the light dividers 20 and 21 is the same as that shown in FIG. 20 but an image rotator 75 is further disposed in an optical path for one light beam. By virtue of the image rotator 75, only either of the light beams (the reflected light beam in the structure shown in FIG. 21) divided by the half mirror 70*a* is rotated by, for example, 180° on a plane perpendicular to optical axis AX. As a result of the aforesaid structure, the coherence of the light beams can be further reduced and the contrast of the speckle interference fringes acting as noise components can be further lowered, causing a satisfactory advantage to be obtained. The image rotator is not limited to the structure shown in FIG. 21 and constituted by combining prisms.

If the image rotator 75 is disposed in the optical path as in this structure, the phase of the reflected light beams is somewhat delayed. Therefore, it is preferable that the distance (the interval) from the half mirror 70*a* and the reflecting mirror 70*b* be determined. The position of the image rotator 75 is not limited to the description about this embodiment, it may be disposed at any position if it is disposed on the optical path between the light source 80 and the reticle 9 similar to the optical path difference generating member. For example, it may be disposed in the rear of the light dividers 20 and 21 (adjacent to the second fly-eye lens). Furthermore, the image rotator 75 may be disposed more adjacent to the light source or the second fly-eye lens than the optical path difference generating member (70 or 70*a* and 70*b*). A similar effect can be also obtained in a case where the image rotator 75 is disposed in the structures shown in FIGS. 18 and 19. In other words, the conditions such as the position and the number required for the image rotators 75 are the same as those required for the optical path difference generating member. In a case where the irradiation light beams emitted from the light source 80 are divided into four portions, the image rotators are disposed in the optical paths for three light beams of the four divided light beams in such a manner that they are rotated 90°, 180° and 270° respectively (the residual one is rotated by 0°) from the direction of the optical axis. The image rotors may be disposed in the optical paths for the four light beams in such a manner that they are rotated by 90°, 180°, 270° and 360° from the direction of the optical axis.

Also the structure according to this embodiment may employ the light divider shown in FIGS. 5 to 8. In a case where the light divider shown in FIGS. 7 and 8 is used, the optical path difference generating member (the parallel and flat glass 70) may be disposed in an optical path between the fiber emission portions 21*b* and 21*c* and the second fly-eye lenses 40*a* and 40*b*, or in an optical path between the first mirror 20*d* and the second mirrors 21*e* and 21*f* (or the second fly-eye lenses 40*a* and 40*b*) similarly to the embodiment shown in FIG. 18, or in an optical path more adjacent to the light source than the fiber incidental portion 20*f* and the first mirror 20*d* similarly to the embodiment shown in FIG. 19. The number of divisions performed by each synthetic fly-eye lens and the light divider is not limited to two but the divisions may be made by an arbitrary number. In the structure shown in FIG. 7, the number of divisions (the number of emission portions) of the fiber 20*c* may be changed, while the pyramid mirror (for dividing into four portions) may be used as the first mirror 21*d* in the structure shown in FIG. 8.

The aforesaid embodiments are formed into a two-stage integrator structure in which the two sets of the fly-eye lenses are disposed in series to receive a plurality of the light beams divided by the light dividers 20 and 21. However, a square rod type optical integrator may be used as the optical integrator, or two sets of the rod type optical integrators are combined to each other, or the rod type optical integrator and the fly-eye type optical integrator may be combined to each other to constitute the aforesaid two-stage integrator structure. An example of employment of the rod type optical integrator has been disclosed in U.S. Pat. No. 4,952,815. As an alternative to the two-stage integrator structure, an arrangement may be employed in which each of a plurality of light beams divided by the light dividers 20 and 21 is then divided into a plurality of light beams by using a polyhedron prism or a mirror, and a plurality of the divided light beams are caused to be incident on the incidental surface of one fly-eye lens group (a rod type integrator may be used) in a superposed manner.

As a result of the aforesaid structure, the illuminance uniformity improvement effect can be somewhat obtained by using only one optical integrator. Furthermore, by reducing, for example, the size (the cross sectional area) of each element constituting the fly-eye lens, the illuminance uniformity can be improved to a certain degree by using only one mesh-type fly-eye lens. Although two sets of fly-eye lenses (40*a* and 41*a*) and (40*b* and 41*b*) are disposed to receive a plurality of the light beams divided by the light dividers 20 and 21 in the aforesaid embodiment, either of the first fly-eye lens and the second fly-eye lens may be formed into one large fly-eye lens which covers a region, through which the light beams pass, on a plane perpendicular to optical axis AX. In this case, it is preferable that size of the fly-eye lens be determined while considering the movable range of the light beams on the plane perpendicular to optical axis AX corresponding to the periodicity and the precision of the reticle pattern. This fact is also adapted to a case where only one set of the fly-eye lenses is used. If the light beams to be incident on each fly-eye lens in the irradiation optical system shown in FIGS. 18 to 21 and FIGS. 5 to 8 are used to irradiate an area which is externally wider than the incidental end of each fly-eye lens and if the distribution of the quantity of light to be incident on each fly-eye lens is uniform, a satisfactory effect can be obtained because the illuminance uniformity on the reticle pattern surface can be further improved.

As can be seen from the above, regardless of the structure of the light divider and that of the fly-eye lens, a projection exposure apparatus having the irradiation optical system for forming at least two light quantity distributions (the second light source image) on the pupil surface 17 of the irradiation optical system or on a plane adjacent to it enables the illuminance uniformity improvement effect to be obtained on the reticle pattern surface by generating an optical path difference longer than coherent length LS between the light beams by using the optical path difference generating member such as the parallel and flat glass.

Figure 22A:
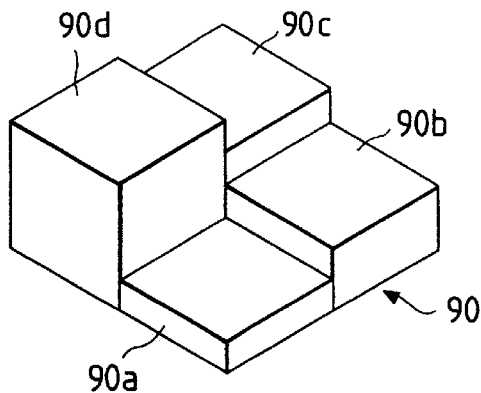
FIGS. 22A and 22B are views which illustrate a modification of the optical path difference generating member in the irradiation optical system.
Figure 22B:
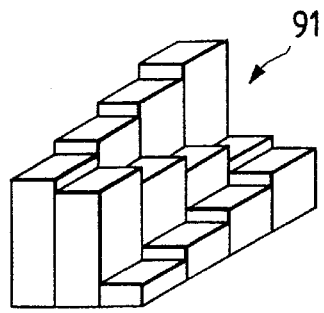

In the above mentioned embodiment, the parallel and flat glass 70 serving as the optical path difference generating member is disposed in the optical path for either of the two light beams divided by the light dividers 20 and 21. However, two parallel and flat glass members each having a thickness which causes the optical path difference between the two light beams to be longer than coherent length LS may be disposed in the optical paths. Furthermore, the two parallel and flat glass members may be integrally formed. In a case where the irradiation light beams are divided into four portions by the light dividers 20 and 21, an optical member 90 arranged as shown in FIG. 22A may be used which is constituted by integrally combining parallel and flat glass plates 90a to 90d having different thickness. In this case, the thickness of each parallel and flat glass is determined so as to make all of the mutual optical path differences between the light beams which pass through the parallel and flat glass members 90a to 90d to be longer than coherent length LS. It should be noted that the parallel and flat glass may be omitted from the optical path for one of the four light beams as described above. As an alternative to using the parallel and flat glass as the optical path difference generating member, a stepped prism 91 arranged as shown in FIG. 22B may be used. The stepped prism 91 is constituted by, for example, combining prisms in the form of a square rod by the same number as that of the elements which constitutes the fly-eye lens. The thickness of each prism is determined so as to make all of the mutual optical path differences between the light beams which pass through each prism to be longer than coherent length LS. If the aforesaid stepped prisms 91 is disposed in the optical path for one light beam, interference generated between elements for the fly-eye lens can be prevented and therefore the illuminance uniformity can be further improved. Although the optical path difference is generated by making the thickness (the length) of the optical member 90 or the stepped prism 91 to be different, a similar mutual optical path difference between the light beams can be generated by constituting each of the parallel and flat glass or the prism by optical material having different refractive factor as an alternative to employing the different thickness (lengths).

Figure 23A:
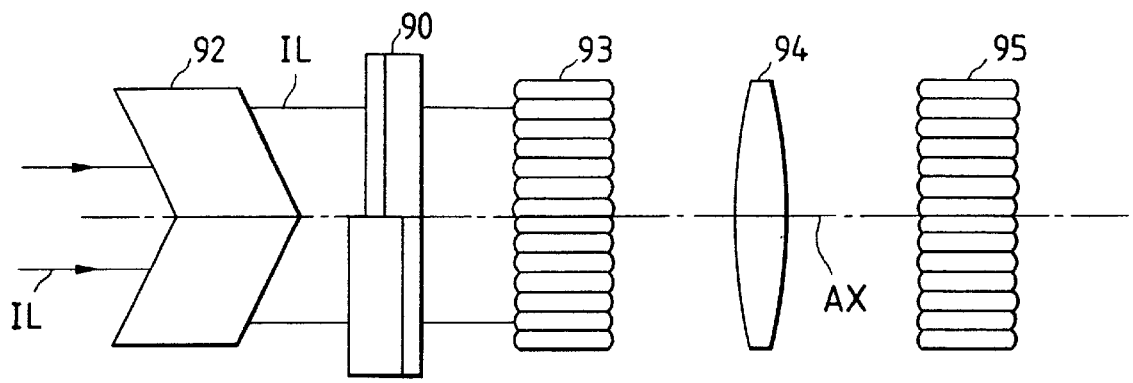
FIGS. 23A and 23B are views which illustrate an example in which an optical difference generating member is applied to the projection exposure apparatus adapted to an annular zone irradiation method.
Figure 23B:
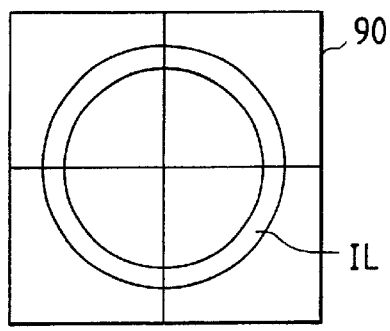

Although the aforesaid embodiment has been described about the projection exposure apparatus having the irradiation optical system for forming at least two light quantity distributions (the secondary light source image of the fly-eye lens) on the pupil surface 17 of the irradiation optical system or on a plane adjacent to it, the illuminance uniformity on the reticle pattern surface can be expected if the optical path difference generating member 90 shown in FIG. 22A is used in a projection exposure apparatus which is adapted to the annular zone irradiation method. Now the aforesaid improvement effect will be described in brief with reference to FIGS. 23A and 23B. Referring to FIG. 23A, irradiation light beam IL emitted from a light source (omitted from illustration) is incident on a prism 92 so as to be formed into an annular band shape, and then it is incident on a second fly-eye lens 93 via the optical path difference generating member 90. The irradiation light beams pass through a lens 94 and a first fly-eye lens 95 before being used to irradiate the reticle pattern by the condenser lenses 6 and 8 (see FIG. 17) with substantially uniform illuminance. The structures except for those shown in FIG. 23A are the same as those shown in FIG. 17. FIG. 23B illustrates a state where the optical path difference generating member 90 shown in FIG. 23A is viewed from the direction of the optical axis. The prism 92 is a so-called cone prism having conical shape inclined incidental surface and the emission surface so that the irradiation light beams are formed into the annular band shape by the refraction effect of the prism 92 before they are used to irradiate the optical path difference generating member 90. Both the first and second fly-eye lenses 93 and 95 are large fly-eye lenses extending, on a plane perpendicular to optical axig AX, to cover the region through which the annular band shape irradiation light beams pass, the first and second fly-eye lenses 93 and 95 having elements, the cross sectional shape of each of which is very small. By employing the aforesaid structure, that is, the two-stage integrator structure and by dividing the annular band shape irradiation light beams into four portions by the optical path difference generating member 90 and by making the mutual optical path difference between the divided light beams to be longer than coherent length LS, the illuminance uniformity on the reticle pattern surface can be improved. Although an example in which the annular band shape irradiation light beams are divided into four portions is illustrated in FIG. 23, the number of divisions may be determined arbitrarily (however two or more). If the optical path difference generating member 90 is rotated relative to optical axis AX during the exposure operation, the illuminance uniformity can be further improved. In a case where the inner or the outer diameter of the annular band shape irradiation light beams is changed to correspond to the periodicity or the precision of the reticle pattern, it is preferable that a plurality of cone prisms having different thicknesses are exchanged by being disposed in the irradiation optical path and the size (the diameter) of the circular irradiation light beams to be incident on the cone prism 92 can be varied by a variable aperture diaphragm.

Figure 24:
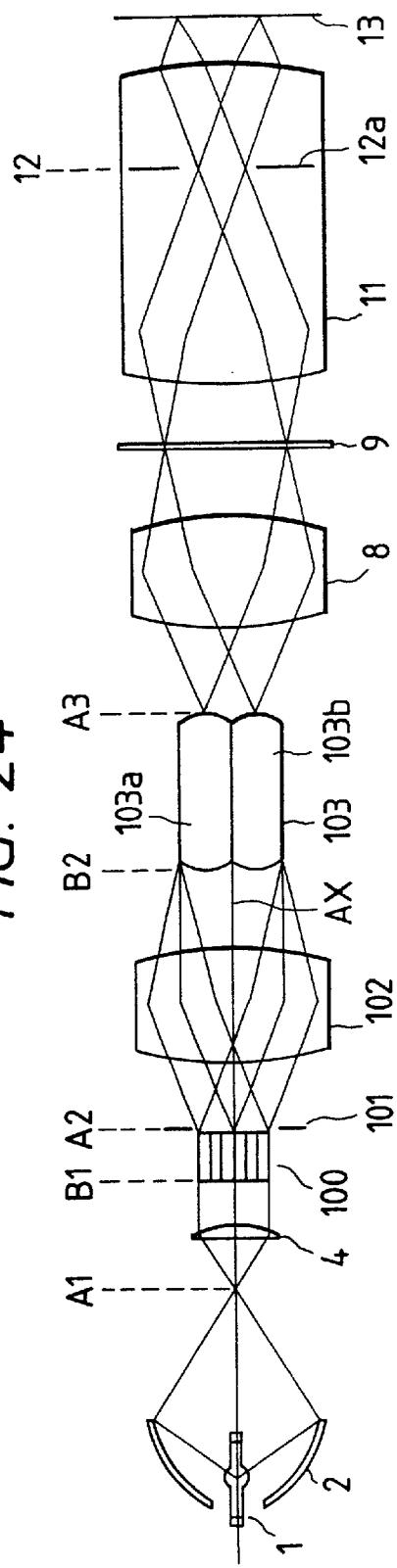
FIG. 24 is a view which illustrates the structure of a third embodiment of the projection exposure apparatus according to the present invention.
Figure 25:
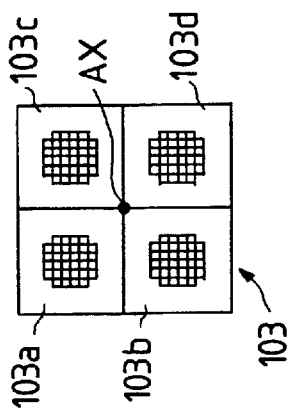
FIG. 25 illustrates a state of a light source image formed on the injection surface of a polyhedron light source forming optical system.

A third embodiment of the present invention will now be described with reference to FIG. 24. FIG. 24 illustrates the schematic structure of this embodiment of the projection exposure apparatus. Referring to FIG. 24, the same elements as those shown in FIGS. 1 and 17 are given the same reference numerals. Referring to FIG. 24, the irradiation light beams radiated from the light source such as a mercury lamp the brightness point of which is located at a first focal point of an elliptic mirror 2 are gathered at second focal point A1 so as to be substantially parallel beams by the input lens 4 (the collimator lens) before they are incident on a fly-eye lens 100 serving as the optical integrator (a plane light source forming optical system). The fly-eye lens 100 is constituted by an aggregation of a plurality of rod lens elements each having a rectangular cross section (for example, a square cross sectional shape), the fly-eye lens 100 having emission surface A2 disposed to be conjugate with a light source image formed at the second focal point position of the elliptic mirror 2. Therefore, a plurality of light source images by the same number as those of the rod lens elements constituting the fly-eye lens 100 are formed on the emission surface A2 of the fly-eye lens 10 and a secondary light source is substantially formed to serve as the plane light source. An aperture diaphragm 101 is disposed in the vicinity of the position at which the secondary light source is formed. The light beams, which have passed through the aperture diaphragm 101, are converged by a converging lens 102 before they are incident on a polyhedron light source forming optical system 103. The polyhedron light source forming optical system 103 (a lens array) is composed of four lens elements (103a, 103b, 103c and 103d) disposed in parallel. Although FIG. 24 illustrates only the lens elements 103a and 103b, the lens elements 103c and 103d are disposed in parallel to the lens elements 103a and 103b in a direction perpendicular to the surface of the drawing sheet on which FIG. 24 is drawn. Each of the lens elements 103a, 103b, 103c and 103d has lens surfaces on both the incidental side and the emission side and is disposed eccentrically so as to make the distance from its optical axis to optical axis AX of the irradiation optical system to be the same. The aforesaid lens elements 103a, 103b, 103c and 103d are disposed to make their emission surface A3 conjugate with the emission surface A2 of the fly-eye lens 100. Therefore, images (plane light source images) formed by again imaging the secondary light source are, as shown in FIG. 25, formed on the emission side of the polyhedron light source forming optical system 103 at four positions which are made to be eccentric with respect to optical axis AX of the irradiation optical system by a number which is the same as that of the lens elements. That is, four plane light sources divided by the four lens elements 103a to 103d are formed. As can be understood from FIGS. 24 and 25, also this embodiment employs the inclined irradiation method similarly to the first and the second embodiments, and therefore a plurality of the lens elements 103a to 103d are disposed at the optimum positions to correspond to the precision and the periodicity of the reticle pattern.

Referring back to FIG. 24, the four light beams formed on the emission surface A3 of each of the lens elements 103a, 103b, 103c and 103d are gathered by the condenser lens 8 so as to uniformly irradiate the reticle 9 while making a predetermined angle from optical axis AX of the irradiation optical system. As a result of the inclined irradiation thus performed, the light beams, which have passed through and diffracted on the pattern of the reticle 9, are gathered and imaged by the projection optical system 11. Hence, the image of the pattern of the reticle 9 is formed on the wafer 13.

It should be noted that the light source image A1 formed by the elliptic mirror 2, the emission surface A2 of the fly-eye lens 100 and the emission surface A3 of the polyhedron light source forming optical system 103 are disposed to be conjugated with the incidental pupil surface 12 (an aperture diaphragm 12a) of the projection optical system in the irradiation optical system shown in FIG. 24. In other words, A1 and A2 and A3 are Fourier transformed surfaces of the object surfaces (the reticle 9 and the wafer 13). Furthermore, the incidental surface B1 of the fly-eye lens 100 and the incidental surface B2 of the polyhedron light source forming optical system 103 are made conjugate with the object surfaces (the reticle 9 and the wafer 13).

It is preferable that the position (the position on a plane perpendicular to the optical axis) of each lens element of the polyhedron light source forming optical system 103 be determined in accordance with the reticle pattern to be transferred. The method of determining the position is the same as that for determining the position of the first fly-eye lens according to the first embodiment (see FIGS. 11 and 12). That is, the position (incidental angle φ) on the reticle on which the irradiation light beams supplied from the polyhedron light source forming optical system 103 are incident may be determined so as to obtain the optimum resolution and an effect of improving the focal depth in accordance with the precision of the pattern to be transferred.

Figure 26:
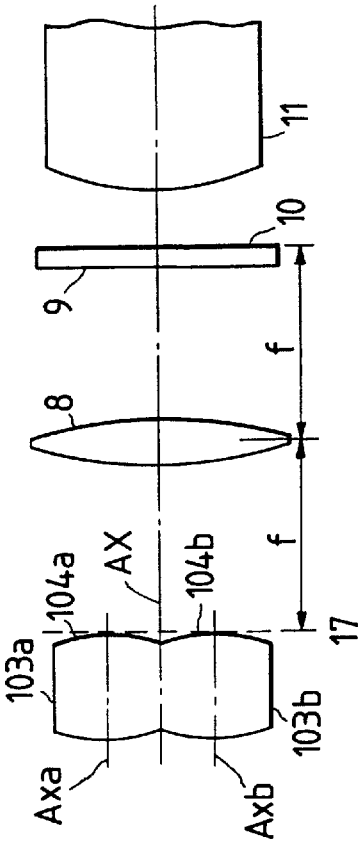
FIG. 26 illustrates the principle of configuration of the polyhedron light source forming optical system.

FIG. 26 schematically illustrates a portion from the polyhedron light source forming optical system 103 to the projection optical system 11, wherein the reticle side (rear side) focal planes 104a and 104b of the polyhedron light source forming optical system 103 coincide with the Fourier transformed surface 17 of the reticle pattern 10. The condenser lens 8 for causing them to have the Fourier transformed relationship is illustrated as one lens. Furthermore, both of the distance from the lens element side (front) principal point of the condenser lens 8 to the reticle side (rear) focal planes (104a and 104b) of the polyhedron light source forming optical system 103 and the distance from the reticle side (rear) principal point of the condenser lens 8 to the reticle pattern 10 are expressed by f.

As can be understood from FIGS. 11, 12 and 26, if optical axes Axa and Axb (that is, the center of gravity of the light quantity distribution of the secondary light source images formed by the lens elements) of each lens element of the polyhedron light source optical system 103 are located on line segments Lα and Lβ, two beams pass through positions which are distant from optical axis AX on the pupil surface 12 of the projection optical system 11 by substantially same distance, the two beams being composed of either of ±1-order diffracted light beams generated from the line-and-space pattern (see FIG. 12A) due to the irradiation of the irradiation light beams from each lens element and 0-order diffracted light beam. That is, the focal depth with respect to the line-and-space pattern shown in FIG. 12A can be made maximum and as well as high resolution can be obtained.

Assuming that half of the distance between optical axes Axa and Axb of the corresponding lens elements 103a and 103b in the cyclic direction (in the direction X) of the reticle pattern shown in FIG. 12 is L (=α=β), the focal distance of the emission (rear) side of the condenser lens 8 is f, the wavelength of the irradiation light beam is λ and the pitch of the reticle pattern is P, the two lens elements 103a and 103b must be structured (disposed) in such a manner that the positions of their optical axes Axa and Axb substantially satisfy an equation expressed by $L=\lambda f/2P$.

In order to efficiently divide the irradiation light beams from the fly-eye lens 100 into two portions (to form two plane light sources) by the two lens elements 103a and 103b included in the polyhedron light source forming optical system 103, it is preferable that the cross sectional shape of the lens elements in the polyhedron light source forming optical system 103 is formed into a rectangle and as well as the cross sectional shape of the rod lens element in the fly-eye lens 100 is formed into a rectangle similar to the overall shape of the polyhedron light source forming optical system 103. Also the optimum positions for the four lens elements of the polyhedron light source forming optical system for use in the case of the two-dimensional pattern shown in FIG. 12C are the same as those in the first embodiment (see FIG. 12D). That is, since the X-directional pitch of the pattern shown in FIG. 12C is Px, the optical axes of the lens elements must be located on line segments Lα and Lβ which hold $\gamma=\epsilon=f\cdot(½)\cdot(\lambda/Px)$ as shown in FIG. 12D so as to obtain the maximum focal depth in the X-directional component of the pattern. Similarly, the optical axes of the lens elements must be located on line segments Lγ and Lε which hold $\alpha=\beta=f\cdot(½)\cdot(\lambda/Py)$ so as to obtain the maximum focal depth in the Y-directional component of the pattern.

In order to realize inclined irradiation balanced to an optimum degree by most efficiently utilizing (most efficiently utilizing the number of apertures NA of the projection optical system) the size of the Fourier transformed surface 17 in a case where the pitch in each direction of the two-dimensional pattern shown in FIG. 12 is the same (Px=Py=P), it is preferable that the structure be arranged to satisfy the relationship expressed by L=λf/2P assuming that half of the distance between the optical axes of each of the lens elements of the polyhedron light source forming optical system 103 in the directions X and Y of each cyclic reticle pattern is L ($\alpha=\beta=\gamma=\epsilon$), the emission side (rear) focal distance of the condenser lens 8 is f, the wavelength of the irradiation light beam is λ and the pitch of the reticle pattern is P.

In this case, assuming that the number of apertures of the projection optical system 11 facing the reticle is NAR, half of the distance between the optical axes of each lens element of the polyhedron light source forming optical system 103 in directions X and Y of each cyclic reticle pattern is L ($\gamma=\beta=\gamma=\epsilon$) and the emission side (rear) focal distance of the condenser lens 8 is f, the structure may be arranged to meet the following relationship:

$$0.35\text{NAR} \leq L/f \leq 0.7\text{NAR}$$

If the relationship becomes smaller than the lower limit of this equation, the effect obtainable by virtue of the inclined irradiation deteriorates and therefore high resolution cannot be realized while maintaining a large focal depth even if the inclined irradiation is performed. If the same exceeds the upper limit of the aforesaid equation, a problem arises in that the light beams supplied from a separated light source formed on the Fourier transformed surface cannot pass through the projection optical system.

Figure 27:
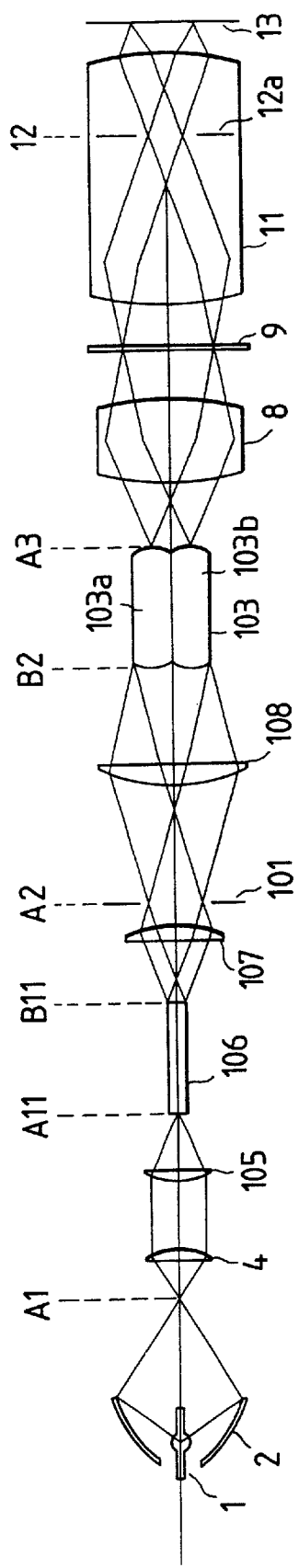
FIG. 27 is a view which illustrates the structure of a fourth embodiment of the projection exposure apparatus according to the present invention.

A fourth embodiment of the present invention will now be described with reference to FIG. 27. FIG. 27 is a view which illustrates the schematic structure of this embodiment of the projection exposure apparatus, wherein the elements having the same functions as those of the elements of the third embodiment shown in FIG. 24 are given the same reference numerals. The difference from the third embodiment lies in a fact that an optical function equivalent to the fly-eye lens 100 is realized by using a converging lens 105, a rod type optical integrator 106 and a converging lens 107.

In the structure according to this embodiment, the light source image converged at the second focal point A1 by the elliptic mirror 2 is relayed to the incidental surface A2 of a square rod type optical integrator 106 by the input lens 4 and the converging lens 105. The light beams emitted from the incidental surface A11 of the rod type optical integrator 106 are reflected by the inner surface of the rod type optical integrator 106 and then they are emitted from the emission surface B11. At this time, the light beams emitted from the emission surface B11 are substantially emitted as if there are a plurality of light source images (plane light surface) at the incidental surface A11 of the rod type optical integrator 106. As for details of this, refer to U.S. Pat. No. 4,952,815.

The light beams emitted from the rod type optical integrator 106 are converged by the converging lens 107 so that a plurality of light source images are formed at the emission side (rear) focal point A2. Hence, a substantially secondary plane light source is formed. Since the aperture diaphragm 101 is disposed at the secondary light source position, the light beams, which have passed through it, are converged by a converging lens 108. Then, four third plane light sources separated by the polyhedron light source forming optical system 103 are formed so that the reticle 9 is inclined-irradiated in the superposed manner via the condenser lens 8. As a result of the structure thus arranged, high resolution can be realized while maintaining a large focal depth similarly to the third embodiment.

It should be noted that the light source image A1 formed by the elliptic mirror 2, the incidental surface A11 of the rod type optical integrator 106, the emission side (rear) focal point position A2 of the converging lens 107 and the emission surface A3 of the polyhedron light source forming optical system 103 are disposed to hold the conjugate relationship with the incidental pupil 12 (the aperture diaphragm 12a) of the projection optical system 12. In other words, A1, A11, A2 and A3 are Fourier transformed surfaces of the object surfaces (the reticle 9 and the wafer 13). Furthermore, the emission surface B11 of the rod type optical integrator 106 and the incidental surface B2 of the polyhedron light source forming optical system 103 are relayed by the converging lenses 107 and 108 so that they are disposed in conjugation with the object surface (the reticle 9 and the wafer 13).

As an alternative to the rod type optical integrator constituted by square rod optical members, a hollow and square rod reflecting optical member constituted by forming a reflecting member into a square rod shape may be used. Furthermore, the cross sectional shape of the rod type optical integrator is not limited to the rectangular. It may, of course, be formed into a polygonal or cylindrical shape.

The third embodiment shown in FIG. 24 is arranged in such a manner that the variable aperture diaphragm 101 the caliper of which can be varied is formed adjacent to the emission surface of the fly-eye lens 100, while the fourth embodiment shown in FIG. 27 is arranged in such a manner that the variable aperture diaphragm 101 is disposed at the emission side (rear) focal point position of the converging lens 107. The variable aperture diaphragm 101 is able to vary the size of the light source image to be formed on the emission surface of the polyhedron light source forming optical system 103 by varying its caliper. Therefore, by controlling the size of the light source image to be formed on the pupil surface of the projection optical system, the inclined irradiation can be performed with a proper a value. That is, it is preferable that the size of the light source image formed by each lens element included by the polyhedron light source forming optical system 103 be made in such a manner that the number of apertures (the single width of the angular distribution on the reticle) per emitted light beam with respect to the number of apertures of the projection optical system facing the reticle is about 0.1 to 0.3. If it is smaller than 0.1 times, the accuracy of the transferred pattern (image) deteriorates. If the same is 0.3 times or more, the effect of obtaining high resolution and a large focal depth become unsatisfactory.

The variable aperture diaphragm for varying the value a may be disposed adjacent to the emission side of the polyhedron light source forming optical system 103. In this case, it is preferable that a variable aperture diaphragm is used which has variable apertures by the number which is the same as that of the lens elements which constitute the polyhedron light source forming optical system 103.

Furthermore, for example, a so-called turret system in which a plurality of apertures having different calipers are formed in a disc in place of the variable aperture diaphragm and it is rotated as desired may be employed to vary the size of the light source image for the purpose of obtaining an optimum value σ.

In order to vary the value a while preventing the shielding operation performed by the aperture diaphragm, an a focal magnification-varying optical system 110 may be disposed in an optical path between the input lens 4 and the fly-eye lens 100 and the secondary light source image to be formed by the emission surface A2 of the fly-eye lens 100 may be efficiently varied by the operation of varying the magnification performed by the a focal magnification-varying optical system 110.

FIG. 28 illustrates the optical structure more adjacent to the light source than the fly-eye lens 100 shown in FIG. 25, wherein the a focal magnification-varying optical system 110 is composed of a positive first lens group 110a, a negative second lens group 110b and a positive first lens group 110c. As shown in FIGS. 28A and 28B, the magnification can be varied by moving each of the lens groups 110a to 110c so that the size of the secondary light source formed on the emission side of the fly-eye lens can be varied while preventing the fact that the light beams are shielded.

Also by virtue of the magnification variation performed by the a focal magnification-varying optical system 110, the incidental surface (B1) of the fly-eye lens is made substantially conjugate with aperture 2a (B2a) of the elliptic mirror with respect to the input lens 4 and the a focal magnification-varying optical system 110. As a result, the value a can be efficiently varied while maintaining the double conjugated relationship with the object surface and the pupil surface (Fourier transformed surface).

In this case, an arrangement may be employed in which information such as the width of the lines of the reticle is supplied to input means and the drive system for varying the diameter of the aperture of the aperture diaphragm is driven in accordance with calculated information so as to automatically obtain the optimum value σ. Furthermore, a structure may be employed in which a bar code or the like having information about the line width of the reticle pattern is fastened to the reticle, detection means for detecting information is provided and the drive system for varying the caliper of the aperture diaphragm is driven in accordance with detected information so as to set an optimum value σ.

Although the embodiments shown in FIGS. 24 and 27 are arranged in such a manner that the light beams from a source such as the mercury lamp are converged by the elliptic mirror and they are made into parallel beams by the input lens 4, another structure may be employed in which a light source such as an excimer laser for supplying parallel beams is used and the parallel beams from the laser beam source are caused to be incident on, in the structure shown in FIG. 24, the fly-eye lens 100, or, in the structure shown in FIG. 27, on the converging lens 105. In particular, in the third embodiment shown in FIG. 24, the shape of the emission surface A2 of the fly-eye lens 100 may be formed into a plane because the secondary light source image formed on the emission surface A2 of the fly-eye lens 110 is a spot light source having substantially no area. Furthermore, in a case where a light source such as the excimer laser capable of emitting large output is used, light energy is concentrated on the emission surface A2 of the fly-eye lens 100 and the emission surface A3 of each lens element of the polyhedron light source forming optical system 103. Therefore, it is preferable that the focal point positions of the incidental surfaces B1 and B2 be located in a space outer than the corresponding emission surfaces A1 and A3 in order to maintain the durability of the fly-eye lens 100 and the polyhedron light source forming optical system 103.

Furthermore, in order to realize the optimum inclined irradiation for each cyclic line width of the reticle pattern under a high irradiation efficiency, it is preferable that the structure be arranged in such a manner that an exchange is enabled for another polyhedron light source forming optical system composed of four lens elements having different size and the positions of optical axes with respect to the optical axis of the irradiation optical system form the four lens elements which constitute the polyhedron light source forming optical system. Furthermore, it is preferable to employ a structure to change the reticle side number of apertures NA of the plane light source forming optical system (the fly-eye lens) for forming the plane light source more adjacent to the light source than the polyhedron light source forming optical system, the NA of the rod type optical integrator 106 and that of the converging lens 107.

As a preferred structure for changing the reticle side number of apertures NA of the plane light source forming optical system, it is preferable to employ a zoom lens type fly-eye lens in the structure shown in FIG. 24 or to arrange the structure in such a manner that exchange can be enabled for another focal distance. It is preferable to arrange the structure in such a manner that exchange is enabled for another rod type optical integrator having a different thickness and length from those of the rod type optical integrator 106 in the structure shown in FIG. 27. In particular, it is preferable to move the converging lens 105 in the direction of the optical axis by a distance corresponding to the change in the length of the rod type optical integrator when the rod type optical integrator is exchanged.

Furthermore, the illuminance uniformity of a plurality of the plane light sources to be formed by the polyhedron light source forming optical system 103 may be further improved by disposing another plane light source forming optical system more adjacent to the light source than the polyhedron light source forming optical system 103 in the irradiation optical system according to each embodiment.

Figure 29:
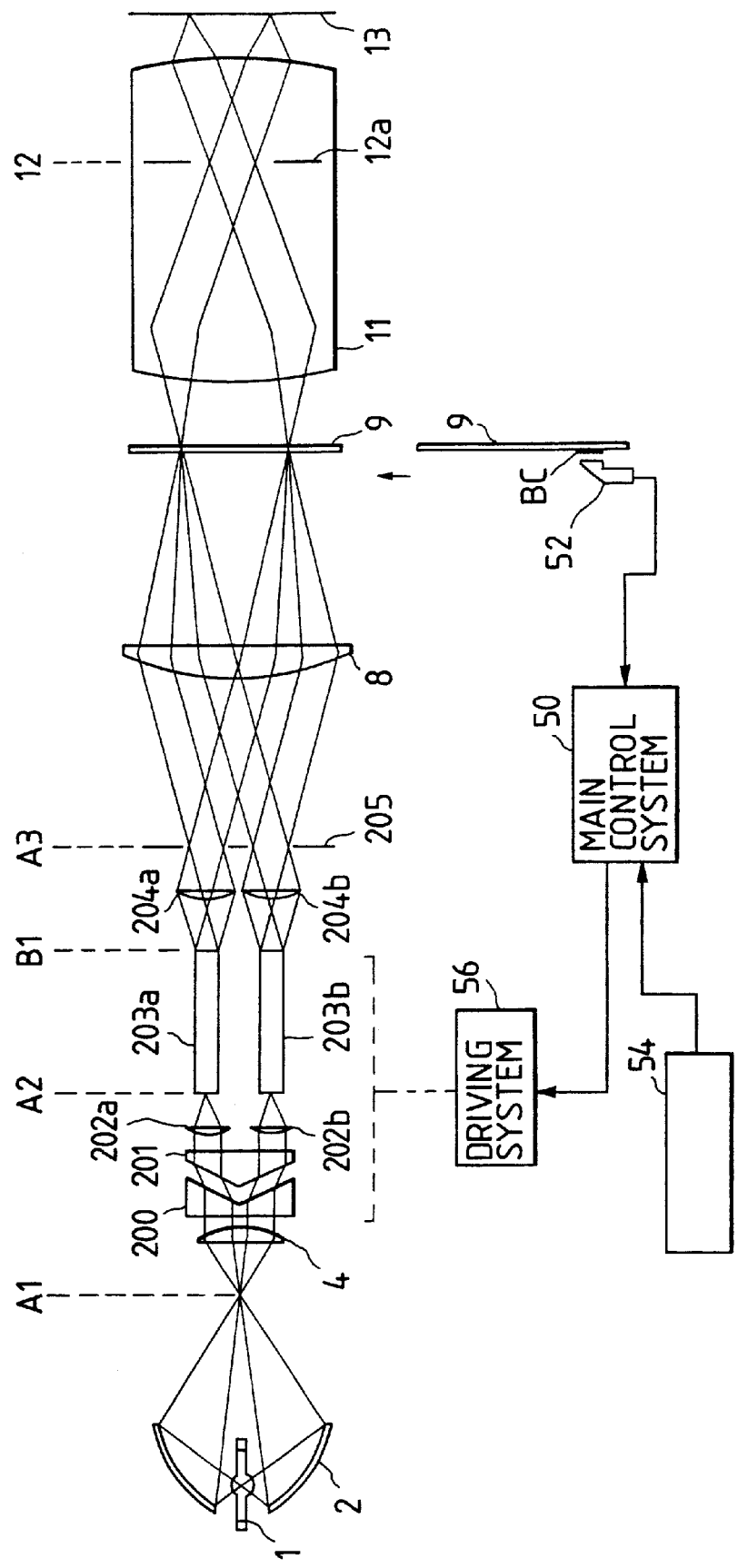
FIG. 29 is a view which illustrates the structure of a fifth embodiment of the projection exposure apparatus according to the present invention.

A fifth embodiment of the present invention will now be described with reference to FIG. 29. FIG. 29 is a view which illustrates the schematic structure of this embodiment of the projection exposure apparatus. Referring to FIG. 29, the same elements as those shown in FIG. 1 are given the same reference numerals. Referring to FIG. 29, the irradiation light beams radiated from the light source such as a mercury lamp are converged by the elliptic mirror 2, and then they are made into substantially parallel beams by the input lens (collimator lens) 4 before they are incident on the light dividing optical systems 200 and 201. The light dividing optical systems are composed of the first polyhedron prism 200 having a V-shaped concave and the polyhedron prism 201 having a V-shaped convex. As a result of the refraction effect of the two prisms, the irradiation light beams are divided into two beams. Each light beam is incident on an individual first plane light source forming optical system composed of elements 202a, 203a and 204a and a second plane light source forming optical system composed of elements 202b, 203b and 204b.

Figure 30A:
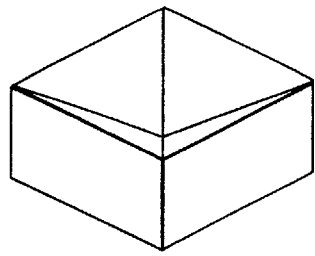
FIGS. 30A and 30B are views which illustrate an example of the light divider shown in FIG. 29.
Figure 30B:
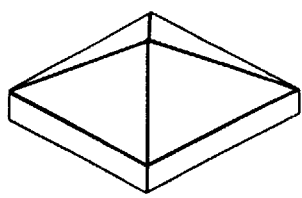

Although the two plane light source forming optical systems are used, the number of them may be determined arbitrarily. Furthermore, although the light dividing optical system is divided into two sections to correspond to the number of the plane light source forming optical systems, the number of divisions may be arbitrary determined to correspond to the number of the polyhedron light source forming optical system. For example, the light dividing optical systems 200 and 201 may respectively be composed of a first polyhedron prism (see FIG. 30A) having a pyramid concave and a second polyhedron prism (see FIG. 30B) having a pyramid convex.

Each plane light source forming optical system is composed of first converging lenses 202a and 202b, rod type optical integrators 203a and 203b and second converging lenses 204a and 204b. The light beams divided into two portions by the light dividing optical systems 200 and 201 are converged by the first converging lenses 202a and 202b before they are incident on the rod type optical integrators 203a and 203b. Each of the rod type optical integrators 203a and 203b is constituted by a square rod type optical member having the incidental surface A2 located at the converging point of the first converging lenses 202a and 202b or at a position adjacent to it, the incidental surface A2 being disposed substantially conjugate with the light source image position A1 of the image formed by the elliptic mirror 2. The light beams, which have been incident on the rod type optical integrators 203a and 203b are reflected by their inner surfaces before they are emitted from the emission surface B1. Hence, the emitted light beams from the emission surface B1 emit as if there are a plurality of light source images (plane light sources) on the incidental surface A2. The aforesaid function has been disclosed in U.S. Pat. No. 4,952,815 in detail.

The irradiation light beams emitted from the rod type optical integrators 203a and 203b are converged by the second converging lenses 204a and 204b so that two secondary light sources are formed at the emission side (rear) focal point position A3 of the aforesaid lens system. Therefore, substantially two plane light sources are formed. The aperture diaphragm 205 having two apertures is disposed at the position A3 at which the secondary light sources are formed so that each light beam, which has passed through each aperture of the aperture diaphragm 205 is converged by the condenser lens 8. As a result, the reticle 9 is inclined-irradiated at a predetermined inclination.

A predetermined circuit pattern is formed on the lower surface of the reticle 9 and the light beams, which have passed through and have been diffracted by the reticle pattern, are converged and imaged by the projection optical system 11. As a result, the pattern of the reticle 9 is formed on the wafer 13.

In the irradiation optical system shown in FIG. 29, the light source image A1 formed by the elliptic mirror 2, the incidental surfaces A2 of the rod type optical integrators 203a and 203b, and the emission side (rear) focal point positions A3 of the second converging lenses 204a and 204b are conjugate with the incidental pupil surface 12 (the aperture diaphragm 12a) of the projection optical system 11. In other words, A1, A2 and A3 are Fourier transformed surfaces of the object surfaces (the reticle 9 and the wafer 13). Furthermore, the emission surfaces B1 of the rod type optical integrators 203a and 203b are conjugate with the object surfaces (the reticle 9 and the wafer 13).

As described above, the first plane light source forming optical system composed of the elements 202a, 203a and 204a and the second plane light source forming optical systems composed of the elements 202b, 203b and 204b are located away from optical axis AX. Therefore, the focal depth of a pattern of the patterns of the reticle 9 having a specific direction and a pitch can be considerably enlarged.

Figure 31:
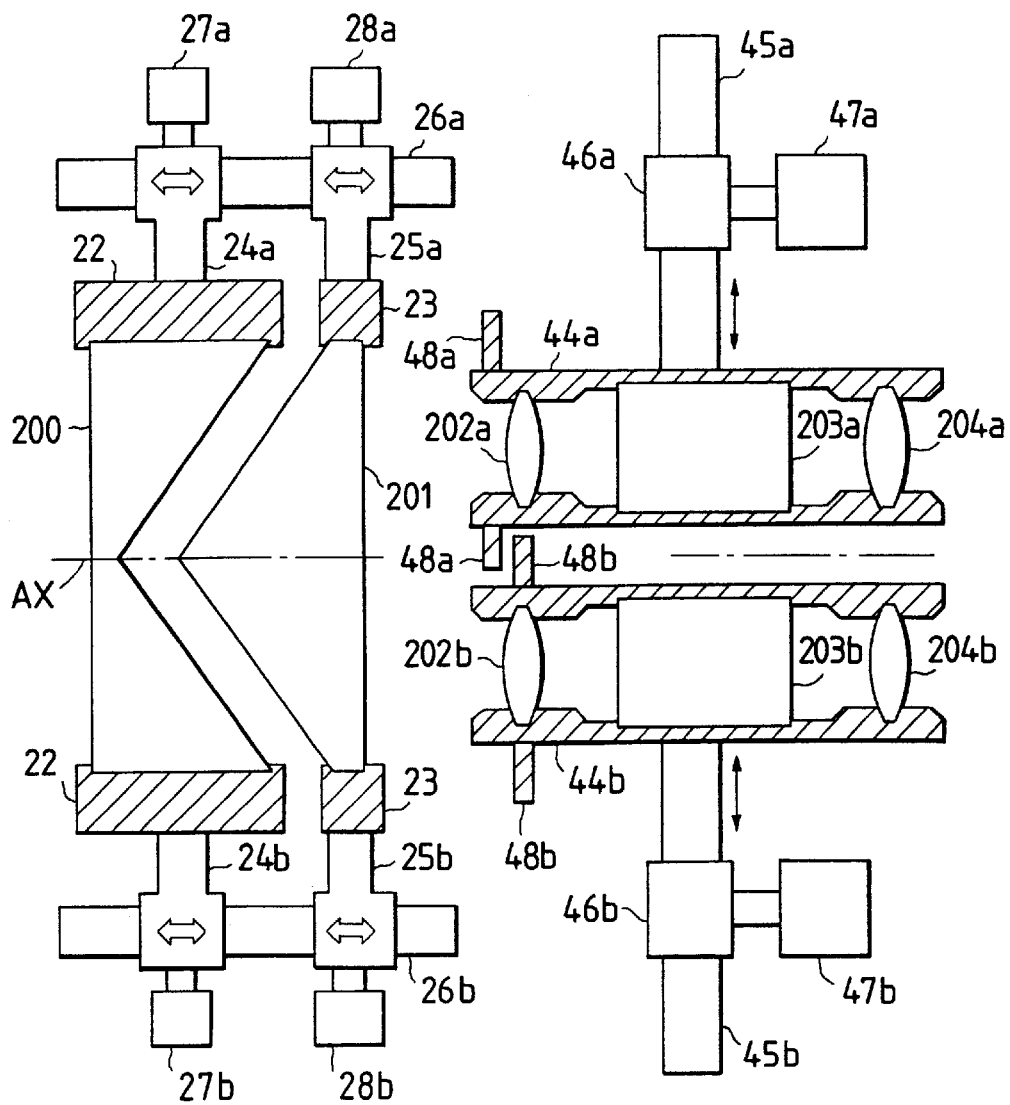
FIG. 31 is a view which illustrates a portion of the irradiation optical system shown in FIG. 29.

FIG. 31 is an enlarged view which illustrates a portion from the light dividing optical systems 200 and 201 to the second converging lenses 204a and 204b shown in FIG. 29. Assumptions are made here that the facing surface of the first polyhedron prism 200 and the second polyhedron prism 201 are parallel to each other and the incidental surface of the prism 200 and the emission surface of the prism 201 are perpendicular to optical axis AX. Referring to FIG. 31, the same elements as those shown in FIG. 2 are given the same reference numerals and their descriptions are omitted here. The first polyhedron prism 200 is held by the holding member 23.

A plurality of light beams emitted from the polyhedron prism 201 are incident on the first converging lenses 202a and 202b. Referring to FIG. 31, the first plane light source forming optical system composed of the elements 202a, 203a and 204a is held by the holding member 44a, while the second plane light source forming optical system composed of the elements 202b, 203b and 204b is held by the holding member 44b.

By integrally holding and moving the first plane light source forming optical system composed of the elements 202a, 203a and 204a and the second plane light source forming optical system composed of the elements 202b, 203b and 204b, the position of the light beams emitted from the second converging lenses 204a and 204b can be arbitrarily shifted on a plane perpendicular to optical axis AX.

Although the structure shown in FIG. 31 is arranged in such a manner that the position of each divided light beam can be radially shifted with respect to optical axis AX by changing the interval between the light dividing optical systems (the polyhedron prisms) 200 and 201 in the optical axial direction, each light beam may be shifted in the concentrical direction relative to optical axis AX.

Also in this embodiment similarly to the aforesaid embodiments, it is preferable that the positions (the positions on the plane perpendicular to the optical axis) of the first plane light source forming optical system composed of the elements 202a, 203a and 204a and the second plane light source forming optical system composed of the elements 202b, 203b and 204b be determined (changed) in accordance with the reticle pattern to be transferred. It is preferable in this case that the method of determining the positions be arranged as described above in such a manner that the positions (incidental angle $\phi$) on which the irradiation light beams form each plane light source forming optical system are incident on the reticle pattern are determined so as to realize the optimum resolution and obtain the effect of improving the focal depth with respect to the precision of the pattern to be transferred. The description about the optimum configuration of the plane light source forming optical systems is omitted here. As a result of the aforesaid structure, also this embodiment enables the focal depth to be made largest with respect to the reticle pattern while realizing high resolution.

Figure 32:
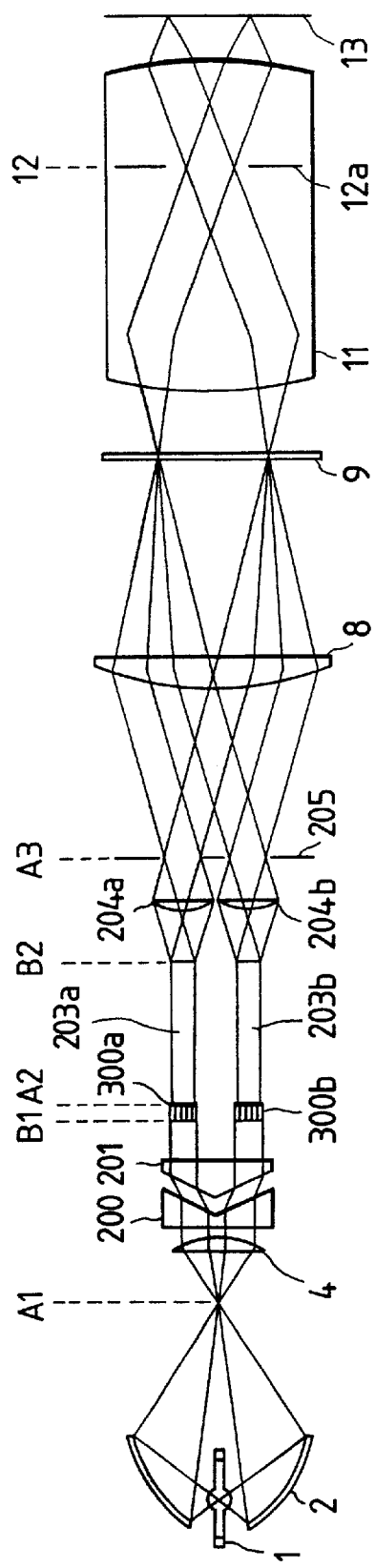
FIG. 32 is a view which illustrates the structure of a sixth embodiment of the projection exposure apparatus according to the present invention.

A sixth embodiment of the present invention will now be described with reference to FIG. 32. FIG. 32 is a view which illustrates the schematic structure of the projection exposure apparatus according to this embodiment. Referring to FIG. 32, the same elements as those of the fifth embodiment (see FIG. 29) are given the same reference numerals. The difference from the fifth embodiment lies in that fly-eye lenses 300a and 300b are disposed in plane of the first converging lenses 202a and 202b.

Referring to FIG. 32, the irradiation light beams radiated from the light source 1 such as a mercury lamp are converged by the elliptic mirror 2 and then they are made to be substantially parallel beams by the input lens (the collimator lens) 4 before they are divided by the light dividing optical systems 200 and 201. The two divided parallel beams are incident on the fly-eye lenses 300a and 300b made of aggregates of rod lens elements having a rectangular cross section (for example, a square cross section) so as to be converged on their emission surfaces A2 or portions adjacent to the emission surfaces A2. As a result, a plurality of spot light sources are formed. The plane light source substantially serving as the secondary light source is formed in the aforesaid position. The incidental surfaces of the rod type optical integrators 203a and 203b are located adjacent to the emission surfaces of the fly-eye lenses 300a and 300b. Therefore, the incidental surfaces of the rod type optical integrators 203a and 203b are disposed substantially conjugate with the light source image position A1 of the image formed by the elliptic mirror 2. The rod type optical integrators 203a and 203b are made of rectangular rod shape optical members so that the incidental light beams are reflected by their inner surfaces and emitted from the emission surface B1 as described above. Hence, the light beams are emitted from the emission surface B1 as if there are a plurality of the light source images (the plane light source) on the aforesaid incidental surface A2.

The irradiation light beams emitted from the rod type optical integrators 203a and 203b are converged by the converging lenses 204a and 204b so that two plane light source images serving as the third light sources are formed at eccentric positions from optical axis AX at the emission side focal point position of the lens. Therefore, the illuminance distribution of the light beams on the emission surfaces of the fly-eye lenses 300a and 300b are made uniform by the integration effect. Furthermore, the light beam illumination distribution at the emission side focal point position A3 of the converging lenses 204a and 204b can be further satisfactorily made uniform by the rod type optical integrators 203a and 203b.

The aperture diaphragm 205 having two apertures is disposed at the position A3 at which the two plane light sources serving as the third light sources are formed. Each light beam which has passed through the aperture diaphragm 205 is converged by the condenser lens 8 so that it is used to uniformly irradiate the reticle 9 at a predetermined angle. The light beams which have passed through and been diffracted by the reticle pattern in the inclined irradiation manner are converged and imaged by the projection optical system 11, so that the image of the pattern of the reticle 9 is formed on the wafer 13.

As described above, the first plane light source forming optical system composed of elements 300a, 203a and 204a and the second plane light source forming optical system composed of elements 300b, 203b and 204b are disposed away from optical axis AX. Therefore, the focal depth of the projected image of the pattern of the patterns of the reticle having a specific direction and pitch can be considerably enlarged.

In the irradiation optical system shown in FIG. 32, the light source image A1 formed by the elliptic mirror 2, the emission surfaces (the incidental surfaces of the rod type optical integrators 203a and 203b) A2 of the fly-eye lenses 300a and 300b and the emission side focal point positions A3 of the second converging lenses 204a and 204b are conjugate with the incidental pupil 12 (the aperture diaphragm 12a) of the projection optical system 11. In other words, A1, A2 and A3 are Fourier transformed surfaces of the object surfaces (the reticle 9 and the wafer 13). Furthermore, the incidental surfaces B11 of the fly-eye lenses 300a and 300b and the emission surfaces B1 of the rod type optical integrators 203a and 203b are conjugate with the object surfaces (the reticle 9 and the wafer 13).

Although the sixth embodiment shown in FIG. 32 is arranged in such a manner that the light beams are divided into two portions by the light dividing optical systems 200 and 201, another structure may be employed in which the prism shown in FIG. 30 is used and four plane light source forming optical systems are disposed in parallel to correspond to the prism facing the reticle so as to form four plane light sources on the Fourier transformed surface.

Figure 33:
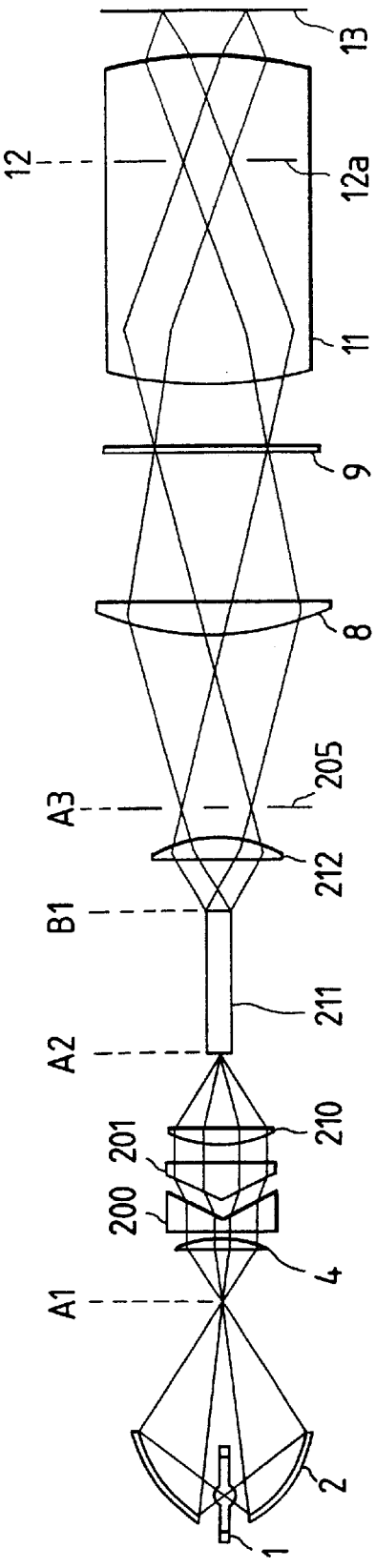
FIG. 33 is a view which illustrates the structure of a seventh embodiment of the projection exposure apparatus according to the present invention.

A seventh embodiment of the present invention will now be described with reference to FIG. 33. Referring to FIG. 33, the same elements as those of the fifth embodiment shown in FIG. 29 are given the same reference numerals. The difference from the fifth embodiment lies in that the function equivalent to that realized by the first plane light source forming optical systems composed of the elements 300a, 203a and 204a and the second plane light source forming optical system composed of the elements 300b, 203b and 204b is realized by one optical system composed of the first converging lens 210, the rod type optical integrator 211 and the second converging lens 212.

Referring to FIG. 33, the irradiation light beams radiated from the light source 1 such as a mercury lamp are converged by the elliptic mirror 2 and then they are made to be substantially parallel beams by the input lens (the collimator lens) 4 before they are divided into two portions by the light dividing optical systems 200 and 201. The two divided parallel beams are converged to the emission side (rear) focal point position by the first converging lens 210. The incidental surfaces of the rod type optical integrator 211 is located at the focal point position A2, the incidental surfaces being substantially conjugate with the light source image position A1 of the image formed by the elliptic mirror 2.

As described above, the light beams which have been incident on the rod type optical integrator 211 are reflected by the inner surface of it before they are emitted from the emission surface B1. Therefore, the light beams are emitted from the emission surface B1 as if there are a plurality of the light source images (the plane light sources) on the incidental surface A2. Then, the light beams are converged by the second converging lens 212 so that two plane light source images separated from each other and serving as the secondary light sources are formed at the emission side (rear) focal point position A3 of the lens 212. The reason for this lies in a fact that the light beams are incident on the rod type optical integrator in a state where they are separated from each other while making the same angle.

The aperture diaphragm 205 having two apertures is disposed at the position A3 at which the two plane light source images serving as the second light source are formed. The light beams which have passed through the aperture diaphragm 205 are converged by the condenser lens 8 so that the reticle 9 is uniformly irradiated with them while being inclined at a predetermined angle. A predetermined circuit pattern is formed on the lower surface of the reticle 9 so that the light beams which have passed through and been diffracted by the reticle pattern by the inclined irradiation method are converged and imaged by the projection optical system 11. Hence, the image of the pattern of the reticle 9 is formed on the wafer 13.

As described above, the positions of the centers of gravity of the two plane light sources (the secondary light sources) formed by the polyhedron light source forming optical systems 210, 211 and 212 are located distant from optical axis AX. Therefore, the focal depth of the projected image of the pattern of the patterns of the reticle 9 having a specific direction and pitch can be considerably enlarged.

According to this embodiment, by only changing the air interval between the two polyhedron prisms which constitute the light dividing optical systems 200 and 201, the incidental angle of the divided light beams to be incident on the incidental surface A2 of the rod type optical integrator can be varied. Hence, the position of the secondary light source image to be formed on the emission side (rear) focal point position A3 of the second converging lens 212 with respect to optical axis AX of the secondary light source image can be controlled.

In the irradiation optical system shown in FIG. 33, the light source image A1 formed by the elliptic mirror 2, the incidental surface A2 of the rod type optical integrator 211 and the emission side focal point position A3 of the second converging lens 212 are conjugate with the incidental pupil 12 (the aperture diaphragm 12a) of the optical projection system 11. In other words, A1, A2 and A3 are Fourier transformed plane of the object surface (the reticle 9 and the wafer 13). Furthermore, the emission surface B1 of the rod type optical integrator 211 is conjugate with the object surface (the reticle 9 and the wafer 13).

Although the seventh embodiment shown in FIG. 33 is arranged in such a manner that the light beams are divided into two portions by the light dividing optical systems 200 and 201, another structure may be employed in which the prism shown in FIG. 30 is used to form four plane light sources on the Fourier transformed surface.

In the embodiments shown in FIGS. 29, 32 and 33, the variable aperture diaphragms 205 disposed at the two or three dimensional plane light source position formed by each polyhedron light source forming optical system are able to vary the size of the light source image by varying the caliper of the variable aperture diaphragm 205. Therefore, by controlling the size of the light source image to be formed on the pupil surface of the projection optical system 11, the optimum inclined irradiation with a proper value a can be performed.

As for the size of the plane light source image to be formed by each polyhedron light source forming optical system, it is preferable that the number of apertures (a single width of the angle distribution on the reticle) per one emitted light beam be about 0.1 to about 0.3 with respect to the reticle side number of apertures of the projection optical system. If it is smaller than 0.1 times, the correctivity of the pattern transference deteriorates. If it is larger than 0.3 times, an effect of improving the resolution and that of realizing a large focal depth cannot be obtained.

As an alternative to the variable aperture diaphragm, a so-called turret system may be employed in which a disc having a plurality of apertures having different calipers is used so as to be rotated as desired for the purpose of obtaining the optimum value σ by changing the size of the light source image.

In the embodiments shown In FIGS. 29, 32 and 33, the structure is arranged in such a manner that the light beams form the light source 1 such as a mercury lamp are converged by the elliptic mirror 2 so as to make them the parallel beams by the input lens 4. As an alternative to this, an epoxy laser or the like for supplying parallel beams may be employed as the light source to cause the parallel light beams from the laser beam source to be incident on the light dividing optical systems 200 and 201. In particular, in the sixth embodiment shown in FIG. 32, spot light sources having substantially no size are formed as the light source image to be formed on the emission surfaces A2 of the fly-eye lenses 300a and 300b and therefore the shape of the emission surfaces A2 of the fly-eye lenses 300a and 300b may be formed into a flat shape. In a case where a large output light source such as the excimer laser is used, optical energy is concentrated on the emission surfaces A2 of the fly-eye lenses 300a and 300b. Hence, it is preferable that the focal points of the incidental surfaces B1 of the fly-eye lenses 300a and 300b are located in a space outside the emission surface A1 in order to maintain the durability of the fly-eye lenses 300a and 300b.

Although the invention has been described in its preferred form with a certain degree of particularly, it is understood that the present disclosure of the preferred form may be changed in the details of construction and the combination and arrangement of parts without departing from the spirit and the scope of the invention as hereinafter claimed.

What is claimed is:

1. A projection exposure apparatus comprising:
    an irradiation optical system including a light source and irradiating a mask with irradiation light beams;
    a projection optical system for projecting an image of a pattern of said mask on a substrate; and
    a polyhedron light source forming optical system including a light divider for dividing said irradiation light beams from said light source into a plurality of light beams and forming plane light sources at a plurality of positions which are eccentric from the optical axis of said irradiation optical system on a Fourier transformed surface with respect to said pattern of said mask in said irradiation optical system or on a plane adjacent to the same, wherein
    said polyhedron light source forming optical system includes at least a rod type optical integrator.

2. A projection exposure apparatus of claim 1, wherein said polyhedron light source forming optical system has a first converging lens for converging a plurality of light beams emitted from said light divider, a rod type optical integrator having an incidental surface located at the convergent point by said first converging lens and a second converging lens for forming a plurality of plane light sources by converging said light beams from said rod type optical integrator.

3. A projection exposure apparatus having a rod integrator comprising:
    an illumination optical system disposed between a light source and a mask to illuminate the mask with light passing through the rod integrator and having a decreased intensity portion on first and second axes defined to intersect with each other at an optical axis of the illumination optical system and defined along first and second directions in which components of a pattern on the mask extend, the illumination optical system including an optical device disposed between the light source and the rod integrator to change an intensity distribution of light incident on the rod integrator; and
    a projection optical system disposed between the mask and a substrate on which the pattern is transferred to project light from the mask onto the substrate.

4. An apparatus according to claim 3, wherein said rod integrator includes at least two elements separated from each other and disposed apart from the optical axis of said illumination optical system.

5. An apparatus according to claim 4, further comprising:
    a driving system connected with said rod integrator to move said at least two elements in accordance with the change in said light intensity distribution incident on said rod integrator.

6. A projection exposure apparatus having a rod integrator comprising:
    an illumination optical system disposed between a light source and a mask to illuminate the mask with light passing through the rod integrator and having an increased intensity portion relative to a portion on an optical axis of the illumination optical system, the illumination optical system including an optical device disposed between the light source and the rod integrator to change a position of the increased intensity portion; and a projection optical system disposed in an optical path between the mask and a substrate on which a pattern on the mask is transferred.

7. An apparatus according to claim 6, wherein said increased intensity portion includes at least two sections separated from each other and disposed apart from the optical axis of said illumination optical system.

8. A method of exposing a substrate with light passing through a rod integrator, comprising the steps of:

adjusting an intensity distribution of light incident on the rod integrator in accordance with a pattern on a mask to illuminate the mask with light having increased intensity portions between the rod integrator and the mask, relative to a portion on an optical axis of the rod integrator; and projecting light from the illuminated mask onto the substrate.

9. A method according to claim 8, wherein said increased intensity portions are separated from each other and apart from the optical axis of said rod integrator by substantially the same distance.

10. A method of producing a device, comprising a lithography step of transferring a device pattern on a workpiece using an exposing method recited in claim 8.

11. An exposure apparatus which exposes a substrate with an illumination beam irradiated on a mask by an illumination optical system, comprising:

a plurality of rod integrators of which optical axes are disposed in respective positions eccentric from an optical axis of said illumination optical system in said illumination optical system;

a light divider disposed between a light source for emitting said illumination beam and said plurality of rod integrators; and a condenser optical system disposed on the mask side of said plurality of rod integrators in said illumination optical system to irradiate said mask with respective light emitted from said plurality of rod integrators.

12. An exposure apparatus according to claim 11, further comprising a drive system connected to said plurality of rod integrators to adjust an arrangement of said plurality of rod integrators in accordance with a pattern to be transferred on said substrate.

\* \* \* \* \*